United States Patent
Elyasi et al.

(10) Patent No.: US 11,513,898 B2
(45) Date of Patent: Nov. 29, 2022

(54) EXACT REPAIR REGENERATING CODES FOR DISTRIBUTED STORAGE SYSTEMS

(71) Applicant: Regents of the University of Minnesota, Minneapolis, MN (US)

(72) Inventors: Mehran Elyasi, Falcon Heights, MN (US); Soheil Mohajer, Plymouth, MN (US)

(73) Assignee: Regents of the University of Minnesota, Minneapolis, MN (US)

( * ) Notice: Subject to any disclaimer, the term of this patent is extended or adjusted under 35 U.S.C. 154(b) by 89 days.

(21) Appl. No.: 16/906,505

(22) Filed: Jun. 19, 2020

(65) Prior Publication Data
US 2020/0409793 A1 Dec. 31, 2020

Related U.S. Application Data

(60) Provisional application No. 62/863,780, filed on Jun. 19, 2019.

(51) Int. Cl.
*G06F 11/10* (2006.01)
*G06F 11/07* (2006.01)
(Continued)

(52) U.S. Cl.
CPC ...... *G06F 11/1096* (2013.01); *G06F 11/0709* (2013.01); *G06F 11/0727* (2013.01);
(Continued)

(58) Field of Classification Search
CPC ... G06F 11/0727; G06F 11/1084–1096; G06F 11/0709; G06F 11/14; G06F 11/08;
(Continued)

(56) References Cited

U.S. PATENT DOCUMENTS

| 8,631,269 B2 | 1/2014 | Vinayak et al. |
| 2011/0289351 A1* | 11/2011 | Rashmi ................. H03M 13/13 714/6.32 |

(Continued)

FOREIGN PATENT DOCUMENTS

| CN | 105721611 A | 6/2016 |
| CN | 108923960 A | 11/2018 |

(Continued)

OTHER PUBLICATIONS

Mehran Elyasi and Soheil Mohajer. 2019. Determinant Codes With Helper-Independent Repair for Single and Multiple Failures. IEEE Trans. Inf. Theor. 65, 9 (Sep. 2019), pp. 5469-5483. (Year: 2019).*

(Continued)

*Primary Examiner* — Yolanda L Wilson
(74) *Attorney, Agent, or Firm* — Shumaker & Sieffert, P.A.

(57) ABSTRACT

A distributed storage system includes a plurality of nodes comprising a first node, wherein a total number of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from a number of helper nodes of the plurality of nodes represented by d. Upon detecting a failure in the first node, each helper node of the number of helper nodes is configured to determine a repair-encoder matrix, multiply a content matrix by the repair-encoder matrix to obtain a repair matrix, extract each linearly independent column of the repair matrix, and send the linearly independent columns of the repair matrix to the first node.

20 Claims, 10 Drawing Sheets

(51) Int. Cl.
*G06F 11/30* (2006.01)
*G06F 11/14* (2006.01)

(52) U.S. Cl.
CPC ...... *G06F 11/1464* (2013.01); *G06F 11/1469* (2013.01); *G06F 11/3034* (2013.01)

(58) Field of Classification Search
CPC ............. G06F 11/2094; G06F 11/2056; G06F 11/1662; G06F 11/3034
See application file for complete search history.

(56) References Cited

U.S. PATENT DOCUMENTS

| | | | |
|---|---|---|---|
| 2015/0142863 A1* | 5/2015 | Yuen .................. | H04L 67/1097 707/827 |
| 2015/0303949 A1* | 10/2015 | Jafarkhani .......... | H03M 13/617 714/764 |
| 2016/0006463 A1* | 1/2016 | Li ...................... | H03M 13/1515 714/766 |
| 2016/0274972 A1* | 9/2016 | Li ....................... | G06F 11/1096 |
| 2017/0046227 A1* | 2/2017 | Fan .................... | G06F 11/1088 |
| 2017/0063398 A1 | 3/2017 | Richardson et al. | |
| 2017/0272100 A1* | 9/2017 | Yanovsky ........... | G06F 12/0253 |
| 2019/0056868 A1* | 2/2019 | Cabral ................ | H04L 1/0057 |
| 2021/0271552 A1* | 9/2021 | Zhang ................ | G06F 3/06 |

FOREIGN PATENT DOCUMENTS

| | | |
|---|---|---|
| CN | 109684127 A | 4/2019 |
| CN | 109828723 A | 5/2019 |
| CN | 110212923 A | 9/2019 |

OTHER PUBLICATIONS

M. Elyasi and S. Mohajer, "Exact-repair trade-off for (n, k=d-1, d) regenerating codes," 2017 55th Annual Allerton Conference on Communication, Control, and Computing (Allerton), 2017, pp. 934-941. (Year: 2017).*
Elyasi et al., "Cascade Codes for Distributed Storage Systems," Cornell University, presented in part at the IEEE International Symposium on Information Theory (ISIT), 2018, accessed from https://arxiv.org/abs/1901.00911, uploaded on Jan. 3, 2019, 60 pp.
Elyasi et al., "Determinant Coding: A Novel Framework for Exact-Repair Regenerating Codes," IEEE Transactions an Information Theory, vol. 62, No. 12, Dec. 2016, pp. 6683-6697.
Elyasi et al., "A Cascade Code Construction for (n,k,d) Distributed Storage Systems," 2018 IEEE International Symposium on Information Theory (ISIT), Jun. 17, 2018, 5 pp.
Elyasi et al., "Determinant Codes with Helper-Independent Repair for Single and Multiple Failures," IEEE Transactions on Information Theory (Version 2), vol. 65, Issue 9, Mar. 7, 2019, 25 pp.
Elyasi et al., "A Cascade Code Construction for (n,k,d) Distributed Storage Systems," Presentation Slides, Department of ECE University of Minnesota, presented in part at the IEEE International Symposium on Information Theory (ISIT), Jun. 19, 2018, 28 pp.
Dimakis et al., "Network Coding for Distributed Storage Systems," IEEE Transactions on Information Theory, vol. 56, No. 9, Sep. 2010, pp. 4539-4551.
Ahlswede et al., "Network Information Flow," IEEE Transactions on Information Theory, vol. 46, No. 4, Jul. 2000, pp. 1204-1216.
Rashmi et al., "Explicit Construction of Optimal Exact Regenerating Codes for Distributed Storage," Proc. 47th Annual Allerton Conference on Communication, Control, and Computing (Allerton), Sep. 30, 2009, pp. 1243-1249.
Rashmi et al., "Optimal Exact-Regenerating Codes for Distributed Storage at the MSR and MBR Points via a Product-Matrix Construction," IEEE Transactions on Information Theory, vol. 57, No. 8, Aug. 2011, pp. 5227-5237.
Cullina et al., "Searching for Minimum Storage Regenerating Codes," Cornell University, accessed from https://arxiv.org/abs/0910.2245, Oct. 12, 2009, 10 pp.
Shah et al., "Interference Alignment in Regenerating Codes for Distributed Storage: Necessity and Code Constructions," IEEE Transactions on Information Theory, vol. 52, No. 4, Apr. 2012, pp. 2134-2158.
Suh et al., "Exact-Repair MDS Codes for Distributed Storage Using Interference Alignment," ResearchGate, IEEE Xplore, 2010 IEEE International Symposium on Information Theory Proceedings (ISIT), Jun. 13-18, 2010, 5 pp.
Lin et al., "A Unified Form of Exact-MSR Codes via Product-Matrix Frameworks," IEEE Transactions on Information Theory, vol. 61, No. 2, Feb. 2015, pp. 873-886.
Cadambe et al., "Distributed Data Storage with Minimum Storage Regenerating Codes—Exact and Functional Repair are Asymptotically Equally Efficient," Cornell University, accessed from https://arxiv.org/abs/1004.4299, submitted Apr. 24, 2010, 11 pp.
Suh et al., "On the Existence of Optimal Exact-Repair MDS Codes for Distributed Storage," Cornell University, accessed from https://arxiv.org/abs/1004.4663, submitted Apr. 26, 2010, 20 pp.
Cadambe et al., "Asymptotic Interference Alignment for Optimal Repair of MDS codes in Distributed Data Storage," IEEE Transactions on Information Theory, vol. 59, No. 5, pp. 2974-2987.
Durrsma, "Outer bounds for exact repair codes," Cornell University, accessed from https://arxiv.org/abs/1406.4852, submitted Jun. 18, 2014, 14 pp.
Mohajer et al., "New Bounds on the (n,k,d) Storage Systems with Exact Repair," In Proceedings of the 2015 IEEE International Symposium on Information Theory (ISIT), Jun. 2015, pp. 2056-2060.
Tian, "A Note on the Rate Region of Exact-Repair Regenerating Codes," Cornell University, accessed from https://arxiv.org/abs/1503.00011, submitted Feb. 27, 2015, 7 pp.
Duursma, "Shortened regenerating codes," Cornell University, accessed from https://arxiv.org/abs/1505.00178, submitted May 1, 2015, 11 pp.
Goparaju et al., "New Codes and Inner Bounds for Exact Repair in Distributed Storage Systems," Cornell University, accessed from https://arxiv.org/pdf/1402.2343.pdf, submitted Feb. 11, 2014, 8 pp.
Rashmi et al., Having Your Cake and Eating It Too: Jointly Optimal Erasure Codes for I/O. Storage, and Network Bandwidth, USENIX The Advanced Computing Systems Association, Proceedings of the 13th USENIX Conference on File and Storage Technologies (FAST '15), Feb. 16-19, 2015, 15 pp.
Elaysi et al., "Linear Exact Repair Rate Region of (k+1, k, k) Distributed Storage Systems: A New Approach," IEEE, 2015 IEEE International Symposium on Information Theory (ISIT), Jun. 14-19, 2015, 5 pp.
Elaysi et al., "A Probabilistic Approach Towards Exact-Repair Regeneration Codes," IEEE, 2015 53rd Annual Allerton Conference on Communication, Control, and Computing (Allerton), Sep. 29-Oct. 2, 2015, 9 pp.
Gerami et al., "Repair for Distributed Storage Systems with Erasure Channels," IEEE, IEEE Transactions on Communications, vol. 64, Issue 4, Apr. 2016, 6 pp.
Gerami et al., "Optimized-Cost Repair in Multi-hop Distributed Storage Systems in the Network Coding," Cornell University, accessed from https://arxiv.org/abs/1303.6046, submitted Mar. 25, 2013, 13 pp.
Mahdaviani "Robustness and Flexibility in Coding for Distributed Storage Systems," Thesis, University of Toronto, Department of Electrical and Computer Engineering, Nov. 2018, 166 pp.
Hanxu, Low-Complexity Codes for Distributed Storage Systems, Thesis, Chinese University of Hong Kong, Jun. 2015, 129 pp.
Kleckler et al., "Secure Determinant Codes: A Class of Secure Exact-Repair Regenerating Codes," IEEE. 2019 IEEE International Symposium on Information Theory (ISIT), Jul. 7-12, 2019, 5 pp.
Elaysi et al., "Determinant Codes with Helper_Independent Repair for Single and Multiple Failures," Version 1, Cornell University, accessed from https://arxiv.org/abs/1812.01142v1, Dec. 4, 2018, 25 pp.

(56) References Cited

OTHER PUBLICATIONS

Elyasi et al., "New Exact-Repair Codes for Distributed Storage Systems Using Matrix Determinant," 2016 IEEE International Symposium on Information Theory (ISIT), Jul. 2016, pp. 1212-1216.

Elaysi et al., "Linear Exact Repair Rate Region of (k+1, k, k) Distributed Storage Systems: A New Approach," Proceedings in IEEE International Symposium on Information Theory (ISIT), Jun. 2015, pp. 2061-2065.

Ernvall, "Exact-Regenerating Codes between MBR and MSR Points," Proceedings in IEEE International Symposium on Information Theory (ISIT), Sep. 2013, pp. 1-5.

Sasidharan et al., "An Improved OuterBound on the Storage-Repair-Bandwidth Tradeoff of Exact-Repair Regenerating Codes," 2014 IEEE International Symposium on Information Theory (ISIT), Jun. 2014, pp. 2430-2434.

Mohajer et al., "Exact Repair for Distributed Storage Systems: Partial Characterization via New Bounds," Proceedings of Information Theory and Applications Workshop (ITA), San Diego, California, Feb. 2015, pp. 130-135.

Prakash et al., "The Storage-Repair-Bandwidth Trade-off of Exact Repair Linear Regenerating Codes for the Case d=k=n-1," Proceedings in IEEE International Symposium on Information Theory (ISIT), Jun. 2015, pp. 859-863.

Tian et al., "Rate Region of the (4, 3, 3) Exact-Repair Regenerating Codes," 2013 IEEE International Symposium on Information Theory, Proceedings in IEEE International Symposium on Information Theory (ISIT), Jul. 2013, pp. 1426-1430.

Tian et al., "Layered Exact-Repair Regenerating Codes via Embedded Error Correction and Block Designs," IEEE Transactions on Information Theory, vol. 61, No. 4, Apr. 2015, pp. 1933-1947.

Wu, "A Construction of Systematic MDS Codes With Minimum Repair Bandwidth," IEEE Transactions on Information Theory, vol. 57, No. 6, Jun. 2011, pp. 3738-3741.

Bocher et al., "Introduction to Higher Algebra," The Macmillan Company, New York, NY, USA, 332 pp. (Applicant points out, in accordance with MPEP 609.04(a), that the year of publication, 1907, is sufficiently earlier than the effective U.S. filing date, so that the particular month of publication is not in issue.).

Cullis, "Matrices and Determinoids, vol. 2," [Abstract only] Cambridge University Press, Cambridge, U.K, retrieved from bookdepository.com/Matrices-Determinoids-2-C-E-Cullis/9781107620834, 3 pp.

\* cited by examiner

US 11,513,898 B2

EXACT REPAIR REGENERATING CODES FOR DISTRIBUTED STORAGE SYSTEMS

This application claims the benefit of U.S. Provisional Patent Application No. 62/863,780, filed on Jun. 19, 2019, the entire content of which is incorporated herein by reference.

GOVERNMENT INTEREST

This invention was made with government support under CCF-1617884 awarded by the National Science Foundation. The government has certain rights in the invention.

TECHNICAL FIELD

The disclosure relates to failure recovery for distributed storage systems.

BACKGROUND

The dynamic, large and disparate volume of data garnered from social media, Internet-driven technologies, financial records, and clinical research has created an increasing demand for reliable and scalable storage technologies. Distributed storage systems are widely being used in modern data centers. In distributed storage systems individual storage nodes are often unreliable due to various hardware and software failures. Hence redundancy is introduced to improve the system's reliability in the presence of node failures. The simplest form of redundancy is the replication of the data in multiple storage nodes. Even though it is the most common form of redundancy, replication is very inefficient in terms of the offered reliability gain per cost of the extra storage units required to store the redundancy. In this context, coding techniques have provably achieved orders of magnitude more reliability for the same redundancy compared to replication. Besides reliability offered by storing the redundant data, in order to be durable, it is necessary for a storage system to repair the failed nodes. The repair process consists of downloading (part of) the content of a number of surviving nodes to reconstruct the content of the failed nodes. The conventional erasure codes suffer from high repair-bandwidth due to the total size of data to be downloaded for repair of each failed node. Regenerating codes is a class of erasure codes that have gained popularity in this context, due to their low repair-bandwidth while providing the same level of fault tolerance as erasure codes.

DETAILED DESCRIPTION

Figure 1:
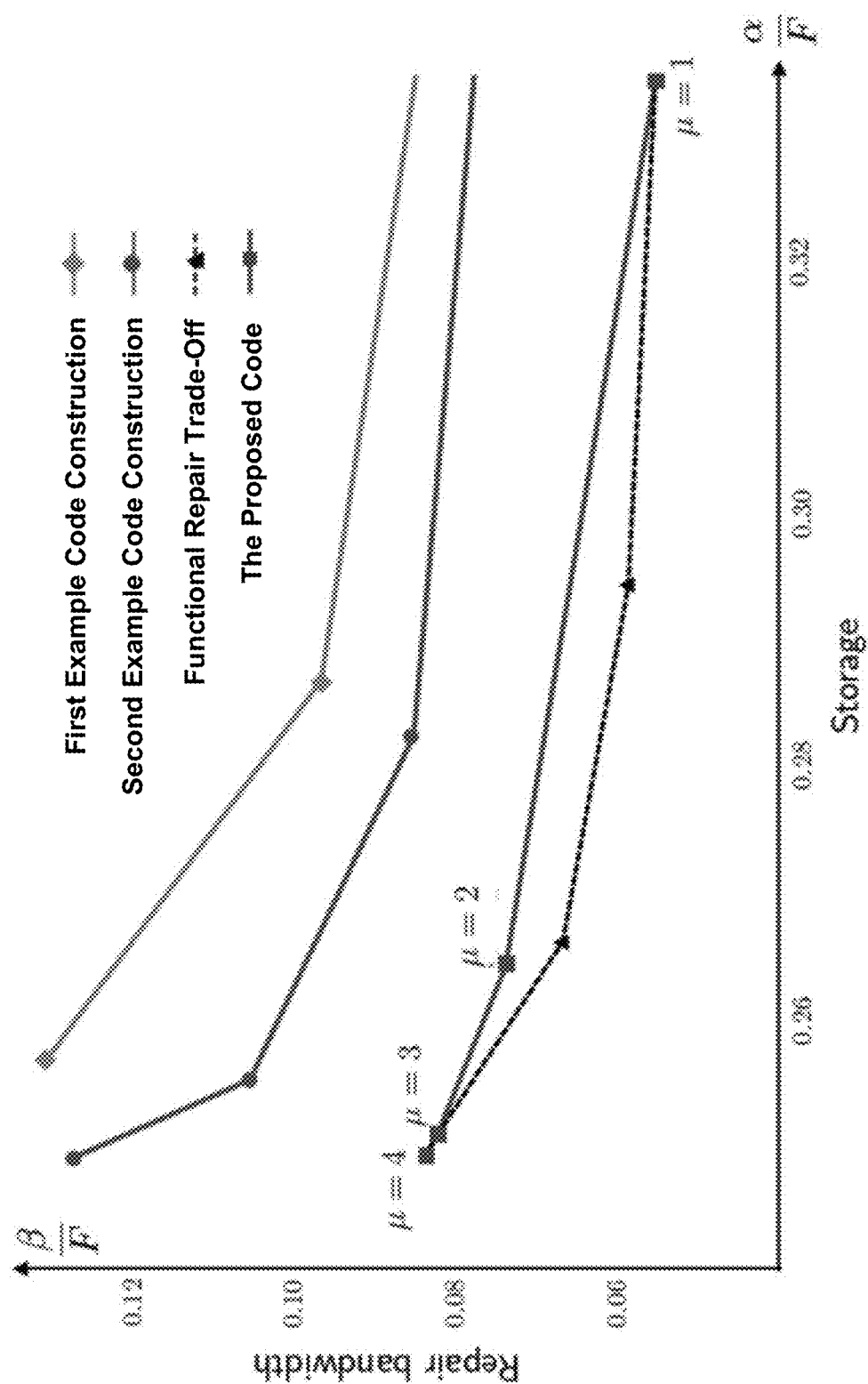
FIG. 1 is a conceptual diagram illustrating an example achievable trade-off of the techniques described herein.

A novel coding scheme for exact repair-regenerating codes is presented in this application. The codes proposed in this application can trade between the repair bandwidth of nodes (number of downloaded symbols from each surviving node in a repair process) and the required storage overhead of the system. These codes work for general system parameters (n, k, d), the total number of nodes, the number of nodes suffice for data recovery, and the number of helper nodes in a repair process, respectively. The proposed construction offers a unified scheme to develop exact-repair regenerating codes for the entire trade-off, including the MBR and MSR points. The new storage-vs.-bandwidth trade-off achieved by the disclosed codes may be optimum. Some other key features of this code include: the construction is linear, the required field size is only $\Theta(n)$, and the (unnormalized) code parameters (and in particular sub-packetization level) is at most $(d-k+1)^k$, which is independent of the number of the parity nodes. Moreover, the proposed repair mechanism is helper-independent, that is the data sent from each helper only depends on the identity of the helper and failed nodes, but independent from the identity of other helper nodes participating in the repair process.

While individual storage units in distributed storage systems (DSS) are subject to temporal or permanent failure, the entire system may be designed to avoid losing the stored data. Coding and storing redundant data is an approach to guarantee durability in such systems. Moreover, these systems are equipped with a repair mechanism that allows for a replacement of a failed node. Such replacement can be performed in the functional or exact sense. In functional repair, a failed node may be replaced by another one, so that the consequent family of nodes maintains the data recovery and node-repair properties. In an exact repair process, the content of a failed node may be exactly replicated by the helpers.

Regeneration codes are introduced to manage data recovery and node repair mechanism in DSS. Formally, an (n, k, d) regeneration code with parameters $(\alpha, \beta, F)$ encodes a file comprised of F symbols (from a finite field $\mathbb{F}$) into n segments (nodes) $W_1, W_2, \ldots, W_n$ each of size $\alpha$, such that two important properties are fulfilled: (1) the entire file can be recovered from every subset of k nodes, and (2) whenever a node fails (become inaccessible), it can be repaired by accessing d remaining nodes and downloading β symbols from each.

It turns out that there is a fundamental trade-off between the minimum required per-node storage α and the repair-bandwidth β, to store a given amount of data F in a DSS. This tradeoff is fully characterized to be achievable by random network coding. However, for the exact-repair problem, which is notably important from the practical perspective, characterization of the trade-off and design of optimum codes are widely open, except for some special cases. Construction of exact-repair regenerating codes for a system with arbitrary parameters (n, k, d) is a complex task due to several combinatorial constraints to be satisfied. The number of such constraints dramatically increases with n, the total number of nodes in the system.

In an (n, k, d) regenerating code, a file comprised of F data symbols, each from a finite field $\mathbb{F}$ is encoded into n pieces, and each piece may be stored one storage node of capacity α symbols. The stored data in the nodes may maintain two main properties:

1. Data Recovery: By accessing any set of k nodes, the data collector is able to recover the original stored file.

2. Node Repair: In the event of node failure, the content of the failed node can be regenerated by connecting to any subset of $\mathcal{H}$ nodes of size $|\mathcal{H}|=d$, and downloading β symbols from each. The set $\mathcal{H}$ is called the set of helper nodes.

There is tension between the two properties: while large parity groups are preferred for efficient data recovery, the repair process requires more downloads if the parity groups including each missing symbol are large. This is due to the fact that every symbol, except the missing one, in a parity equation may be downloaded before retrieving the missing one. More formally, it is shown that there is a trade-off between the per-node storage capacity α and the per-node repair-bandwidth β in a storage system that can guarantee the main properties for a file of size F. While it is desired to minimize both α and β, one can be reduced only at the cost of increasing the other.

There are two types of node repairs: (i) functional-repair, where a failed node may be replaced by a new node such that the resulting system continues to satisfy the data collection and node-repair properties. An alternative to function repair is (ii) exact-repair, under which the replaced node stores precisely the same content as the failed node. Hence, exact-repair is a more demanding criterion, and it is expected to require more repair bandwidth in comparison to functional repair, for a given storage size. However, from the practical stand, the exact repair is preferred, since it does not need the extra overhead of updating the system configuration.

The regenerating codes include (n, k, d) distributed storage systems, which are studied using information flow graphs. Moreover, using the cut-set bound, it is shown that the per-node storage capacity α, the per-node repair bandwidth β, and the file size F may satisfy $$F \le \sum_{i=1}^{k} \min(\alpha, (d-i+1)\beta), \quad (1)$$

for a storage system that maintains data recovery and node repair properties. This bound implies a trade-off between α and β for a given F. This trade-off is shown to be achievable for the functional repair using random codes. An important follow-up question was whether the same trade-off (1) is achievable with the exact-repair property. First, it was shown that exact-repair regenerating codes can be constructed for the extreme points of the trade-off, namely, the minimum bandwidth regeneration (MBR) referring to the minimum β satisfying (1), and the minimum storage regeneration (MSR), referring to the minimum α for which (1) can be satisfied for a given F. Later, it was shown that some of the interior (between the two extreme) points of the trade-off are not achievable under the exact repair criterion. While the proof does not rule out the possibility of approaching the non-achievable trade-off points with an arbitrary small gap, the next question was whether there is a non-vanishing gap between the trade-off of exact-repair and functional-repair codes. This question was first answered by using the computer-aided approach of information-theoretic inequalities, the techniques described herein completely characterized the trade-off for an (n, k, d)=(4,3,3) systems. Note that (4,3,3) is the smallest system for which there is a non-vanishing gap between functional and exact repair trade-off.

Thereafter, the attention of the data storage community has shifted to characterizing the optimum storage-bandwidth trade-off for the exact-repair regenerating codes. A trade-off characterization consists of two-fold: (i) designing the code constructions that has data recovery and exact node repair properties, achieving pairs of (α, β), and (ii) proving information-theoretic arguments that provide lower bound for the achievable pairs of (α, β). The focus of this disclosure is on code construction part, and hence, a brief review of the existing code constructions is provided. To this end, there are three main categories based on the achievable trade-offs, as follows.

1. The MBR point: This point was fully solved for general (n, k, d), where it is shown that the functional-repair trade-off is also achievable under the exact-repair criterion.

2. The MSR point: Most of the existing code constructions are dedicated to the MSR point. A computer search was carried out to find an (n=5, k=3, d=4) MSR code. The code constructions for general (n, k, d) parameters can be divided into (i) regime of low-rate codes where k/n≤½ and (ii) practically more important regime of high-rate codes where k/n>½. The proposed construction for parameters satisfying d>2k−2 includes two steps: first a code is developed with d'=2k'−2, and then converted to a code with desired (k, d) parameters. The code construction was unified for all parameters d≥2k−2. The code construction for the high rate codes of d<2k−2 remained as an open problem.

It is shown that the exact-repair MSR code (for both low rate and high rate regimes) is achievable in the asymptotic sense, that is when the file size is growing unboundedly. However, the proof was existential and no explicit code construction was provided.

Explicit code construction for the high-rate regime is a more challenging problem and several disclosures have been appeared to improve the state-of-the-art. The code constructions are limited to the repair of only systematic nodes. Another category of code constructions is dedicated to codes with a limited number of parity nodes. In particular, Hadamard matrices are used to construct the first explicit MDS storage code with only 2 parities (n=k+2), that offer an optimum repair-bandwidth for the repair of any single node failure, including the parities.

Sub-packetization level, referring to the unnormalized value of α in terms of the number of symbols, is a practically important parameter of any code construction. While it is preferred to minimize the sub-packetization level, it can be lower than a certain lower bound. A class of MSR codes is introduced which requires only polynomial sub-packetization in k, but a very large field size. Nevertheless, the proposed construction is not fully explicit, and it is limited parameters satisfying n=d−1. The latter restriction was later relaxed, where the same result is shown for an arbitrary number of helper nodes.

Several MSR code constructions for arbitrary parameters (n, k, d) are recently proposed. They are all optimum in terms of the storage vs. repair-bandwidth trade-off, and all achieve the optimum sub-packetization matching the bound. The codes proposed offer a dynamic repair, where the number of helpers is flexible to be varied between k and n−1.

The proposed codes in this work cover the entire trade-off, including the MSR point. In the resulting MSR codes from proposed construction, the code parameters and especially the sub-packetization level do not depend on the total number of nodes n. Also, another advantage of this construction is its flexibility of system expansion by adding new parity nodes.

In contrast to other existing codes in the literature where the entire code needs to be redesigned if the total number of nodes increases, the proposed construction here allows for adding new parity nodes to the system, without changing the content of the other nodes. A comparison between the MSR code obtained from this construction and the existing codes, in terms of required field size and the sub-packetization level is presented in Table 1.

TABLE 1

Comparison between code constructions proposed for the MSR point.

| | Sub-packetization level $\alpha$ | Field size q | Code Parameters |
|---|---|---|---|
| Ex. 1 | $(n-k)^n$ | $q \geq (n-k)n$ | $n = d + 1$ |
| Ex. 2 | $(n-k)^{n-1}$ | $q \geq n$ | $n = d + 1$ |
| Ex. 3 | $(d-k+1)^n$ | $q \geq sn$ for $s = \mathrm{lcm}(1, 2, \ldots, n-k)$ | $d < n - 1$ |
| Ex. 4 | $(n-k)^{\lceil \frac{n}{n-k} \rceil}$ | $q \geq (n-k)\lceil \frac{n}{n-k} \rceil$ | $n = d + 1$ |
| Ex. 5 | $(n-k)^{\lceil \frac{n}{n-k} \rceil}$ | $q \geq (n-k)\lceil \frac{n}{n-k} \rceil$ | $n = d + 1$ |
| Ex. 6 | $(n-k)^{\lceil \frac{n}{n-k} \rceil}$ | $q \geq n$ | $n = d + 1$ |
| The techniques described herein | $(d-k+1)^k$ | $q \geq n$ | All |

3. Interior points: The construction for the interior points (trade-off points except for MBR and MSR) were restricted to the specific system parameters. The optimum code construction for (n=d+1, k=d, d) was presented. The achievable trade-off is shown to be optimum under the assumption of the linearity of the code. However, it wasn't clear that if the same trade-off is achievable for n>d+1. Most of the follow-up efforts to increase the number of parity nodes resulted in compromising the system capacity to construct the code for larger values of the n, and hence their trade-off was diverging from the lower bound, and n increases. The first n-independent achievable trade-off for interior points, where, for any (n, k=d, d) system, the trade-off corner point next to MSR can be achieved. However, the proof is just an existence proof, where a random ensemble of codes are introduced, and it is shown that for any n, there exists at least one code in the ensemble that satisfied both data recovery and node repair properties.

The above-mentioned restriction for n was uplifted as an explicit code construction for the entire trade-off of an (n, k=d, d) storage system. The proposed determinant codes are optimal, and achieve the lower bound, regardless of the total number of nodes. However, the repair process of the determinant codes requires heavy computation, and more importantly, the repair data sent from a helper node to a failed node depends on the identity of the other helpers participating in the repair process. This issue was resolved by introducing a new repair mechanism.

The next set of works focus on breaking the last constraint, i.e., k=d. An explicit code construction was introduced for an (n, k≤d, d) system. The resulting trade-off was improved by the code construction. A class of improved layered code was introduced. However, it turns out that the resulting trade-off in only optimum for the corner point next to the MBR, and only for an (n=d+1, k, d) system. The techniques described herein generalize the parameter d to be any free parameter. However, the construction is dedicated to a trade-off point next to the MBR, implying low repair bandwidth. The result was extended for entire trade-off but only for an (n, k=d−1, d) system. The techniques described herein include a code construction for general (n, k, d) parameter for the entire trade-off with a better resulting trade-off.

Determinant codes are a family of exact repair regenerating codes for a DSS with parameters (n, k=d, d). The main property of these codes is to maintain a constant trade-off between $\alpha/F$ and $\beta/F$, regardless of the number of the nodes. In particular, these codes can achieve the lower bound, and hence they are optimum. The determinant codes have a linear structure and can be obtained from the inner product between an encoder matrix and the message matrix. Especially, product-matrix codes for MBR and MSR points can be subsumed from the general construction of the determinant codes.

The repair mechanism proposed for the determinant codes requires a rather heavy computation at the helper nodes in order to prepare their repair symbols to send to the failed node. More importantly, each helper node $h \in \mathcal{H}$ needs to know the identity of all the other helper nodes participating in the repair process. The assumption of knowing the set of helpers in advance is a limitation of the determinant codes, and it is undesired in real-world systems. In practice, it is preferable that once a request for a repair of a failed node is made, each node can independently decide to whether or not to participate in the repair process and generate the repair data from its content, regardless of the other helper nodes.

On the other hand, besides the repair bandwidth, one of the crucial bottlenecks in the performance of the storage systems is the I/O load, which refers to the amount of data to be read by a helper node to encode for a repair process. While the native constructions for exact repair generating code require a heavy I/O read, the repair-by-transfer (RBT) codes offer an optimum I/O. An elegant modification is proposed to improve the I/O cost of product-matrix MSR codes, by pre-processing the content of the nodes and storing the repair data on non-systematic nodes instead of the original node content. This results in a semi-RBT code: whenever such modified nodes contribute in a repair process, they merely transfer some of their stored symbols without any computation. Such modification could not be applied on the original determinant codes since the repair symbols from a helper node h to a failed node f could be computed only when the set of other helper nodes $\mathcal{H}$ is identified.

The techniques described herein propose a novel repair mechanism for the determinant codes. In the new repair procedure, data repair symbols from helper node h to a failed node f solely depend on the content of the helper node and the identity of the failed node f. The failed node collects a total of d$\beta$ repair symbols from the helper nodes and can reconstruct all of its missing symbols by simple addition and subtraction of some of the received symbols. This simple repair scheme further allows for modifications, to further improve the I/O overhead of the code.

The equations used throughout this disclosure may use lowercase letters to denote numbers (e.g., integers k and d or Galois field numbers v and w), and bold symbols to denote matrices. For positive integers a and b, denote set {a, a+1, ..., b−1, b} by [a: b], and set {1, 2, ..., b} by [b]. Hence, for a>b, [a: b]=ø. Script-font letters (e.g., $\mathcal{J}$ and $\mathcal{I}$ to denote a set of integer number). Hence x∈$\mathcal{J}$ implies integer x belongs to the set $\mathcal{J}$. The largest entry of a set $\mathcal{J}$ is denoted by max$\mathcal{J}$, and the maximum of an empty set is defined as maxø=−∞ for consistency. For two sets $\mathcal{J}$ and $\mathcal{I}$ with |$\mathcal{J}$|=|$\mathcal{I}$| write $\mathcal{J} \prec \mathcal{I}$ to indicate the lexicographical order between $\mathcal{J}$ and $\mathcal{I}$, e.g., {1,2,3}≺{1,2,4}≺{1,2,5}≺{1,3,4}≺{1,3,5}. For an integer x and a set $\mathcal{J}$, define $$ind_{\mathcal{J}}(x) = |\{y \in \mathcal{J}: y < x\}|. \quad (2)$$

For a matrix X and a set $\mathcal{J}$, denote the sub-matrix of X obtained from the rows in $\mathcal{J}$ by X[$\mathcal{J}$, :].

Note that k and d (with k≤d) are the main system parameters throughout the disclosure. For a fixed k and a subset $\mathcal{J} \subseteq$ [d], define $\overline{\mathcal{J}} = \mathcal{J} \cap$ [k] and $\underline{\mathcal{J}} = \mathcal{J} \cap$ [k+1: d]. Similarly, for a matrix P with d rows, define $\overline{P}$ and $\underline{P}$ to be sub-matrices of P obtained from stacking the top k and the bottom (d−k) rows of a matrix P, respectively.

The second contribution of this work is the simultaneous repair for multiple failures. Although single failures are the dominant type of failures in distributed storage systems, multiple simultaneous failures occur rather frequently and need to be handled in order to maintain the system's reliability and fault-tolerance. The naive approach to deal with such failures is to repair each failed node individually and independently from the others. This requires a repair bandwidth from each helper node that scales linearly with the number of failures. There are two types of repair for multiple failures studied: (i) centralized regenerating codes and (ii) cooperative regenerating codes. In centralized regenerating codes, a single data center is responsible for the repair of all failed nodes. More precisely, once a set of e nodes in the system fail, an arbitrary set of d≤n−e nodes are chosen, and $\beta_e$ repair symbols may be downloaded from each helper node. This leads to a total of d·$\beta_e$ symbols which may be used to repair the content of all the failed nodes. The storage-bandwidth trade-off of these codes are studied for two extreme points, namely the minimum storage multi-node repair (MSMR) and the minimum bandwidth multi-node repair (MBMR) points. In particular, a class of MSMR code is introduced, that are capable of repairing any number of failed nodes e≤n−k from any number of helper nodes k≤d≤n−e, using an optimal repair bandwidth. In cooperative regenerating codes upon failure of a node, the replacement node downloads repair data from a subset of d helper nodes. In the case of multiple failures, the replacement nodes not only download repair data from the helper nodes, but also exchange information among themselves before regenerating the lost data, and this exchanged data between them is included in the repair bandwidth. Similar to the centralized case, the trade-off for these codes for the two extreme points, namely the minimum bandwidth cooperative regeneration (MBCR) codes and the minimum storage cooperative regenerating (MSCR) codes are studied. In particular, explicit constructions of MDS codes with optimal cooperative repair for all possible parameters were introduced. Also, they have shown that any MDS code with optimal repair bandwidth under the cooperative model also has optimal bandwidth under the centralized model.

The techniques described herein show that the repair bandwidth required for multiple failures repair in determinant codes can be reduced by exploiting two facts: (i) the overlap between the repair space (linear dependency between the repair symbols) that each helper node sends to the set of failed nodes, and (ii) in the centralized repair, the data center (responsible for the repair process) can perform the repair of the nodes in a sequential manner, and utilize already repaired nodes as helpers for the repair of the remaining failed nodes. Interestingly, using these properties the techniques described herein can limit the maximum (normalized) repair-bandwidth of the helper nodes to a certain fraction of α, regardless of the number of failures. The structure of the code allows us to analyze this overlap, and obtain a closed-form expression for the repair bandwidth. The codes are not restricted only to the extreme points of the trade-off and can operate at any intermediate point on the optimum trade-off. A similar problem is where a class of codes is introduced to operate at the intermediate points of the trade-off, with an improved repair bandwidth for multiple failures. However, this improvement is obtained at the price of degradation of the system's storage capacity as n (the total number of nodes) increases. Consequently, the resulting codes designed for two or more simultaneous failures are sub-optimum, and cannot achieve the optimum trade-off between the per-node capacity, repair bandwidth, and the overall storage capacity. One of the main advantages of the proposed code and repair mechanism is to offer a universal code, which provides a significant reduction in the repair bandwidth for multiple failures, without compromising the system performance.

Throughout the analysis, the techniques described herein frequently need to concatenate several matrices, that is, merging a number of matrices with the same number of rows side-by-side, to form a fat matrix with the same number of rows.

The main contribution of this disclosure is a novel construction for exact-repair regenerating codes, with arbitrary parameters (n, k, d). The following theorem characterizes the achievable storage vs. repair-bandwidth trade-off of the proposed code construction.

The techniques described herein use [k+1: d] to denote the set of integer numbers {k+1, ..., d}, and [k]=[1: k] to represent the set {1, 2, ..., k}. For a set $\mathcal{X}$ and a member x∈$\mathcal{X}$, define ind$_{\mathcal{X}}$(x)=|{y∈$\mathcal{X}$ :y≤x}|. Boldface symbols refer to matrices, and for a matrix X, denote its i-th row by $X_i$. The techniques described herein also use the notation $X_{:,j}$ to refer to the j-th column of X. Moreover, use X[$\mathcal{A}$, $\mathcal{B}$] to denote a sub-matrix of X obtained by rows i∈$\mathcal{A}$ and columns j∈$\mathcal{B}$. Accordingly, X[$\mathcal{A}$, :] denotes the sub-matrix of X by stacking rows i ∈ $\mathcal{A}$. Moreover, the techniques describe herein may use sets to label rows and/or columns of a matrix, and hence $X_{\mathcal{J}\mathcal{J}}$ refers to an entry of matrix X at the row indexed by $\mathcal{J}$ and the column labeled by $\mathcal{J}$. Finally, for a set $\mathcal{J}$, denote the maximum entry of $\mathcal{J}$ by max$\mathcal{J}$.

The optimum storage repair-bandwidth of the exact-repair regenerating codes for an (n, k=d, d) system is a piece-wise linear function, which is fully characterized by its corner (intersection) points. The determinant codes provide a universal construction for all corner points on the optimum trade-off curve. The techniques described herein assign a mode (denoted by m) to each corner point, which is an integer in $\{1, 2, \ldots, d\}$ (from 1 for MBR to d for MSR point). The main distinction between the result of the techniques described herein and previous results is the fact that the repair data sent by one helper node does not depend on the identity of all the other helper nodes participating the repair process. The following definition formalizes this distinction.

Theorem 1: For a distributed storage system with arbitrary parameters (n, k, d), the triple ($\alpha$, $\beta$, F) defined as $$\alpha(d, k; \mu) = \sum_{m=0}^{\mu} (d-k)^{\mu-m} \binom{k}{m}$$

$$\beta(d, k; \mu) = \sum_{m=0}^{\mu} (d-k)^{\mu-m} \binom{k-1}{m-1}$$

$$F(d, k; \mu) = \sum_{m=0}^{\mu} k(d-k)^{\mu-m} \binom{k}{m} - \binom{k}{\mu+1}.$$

(3A)

is achievable for $\mu \in \{1, \ldots, k\}$.

Definition 1: Consider the repair process of a failed node f using a set of helper nodes $\mathcal{H}$. The repair process is called helper-independent if the repair data sent by each helper node $h \in \mathcal{H}$ to the failed node f only depends on f and the content of node h (but not the other helpers participating in the repair process).

The following theorem formally states the trade-off achievable by determinant codes.

Theorem 1: For an (n, k=d, d) distributed storage system and any mode m=1, 2, ..., d, the triple ($\alpha$, $\beta$, F) with $$(\alpha^{(m)}, \beta^{(m)}, F^{(m)}) = \left(\binom{d}{m}, \binom{d-1}{m-1}, m\binom{d+1}{m+1}\right)$$

(3B)

can be achieved under helper-independent exact repair by the code construction proposed in this disclosure. The proposed trade-off is shown in FIG. 1, and is compared against that of other existing codes.

FIG. 1 is a conceptual diagram illustrating the achievable trade-off of the proposed code for (n=8, k=4, d=6), and its comparison to other known codes with these parameters. The proposed trade-off has k=4 corner points, enumerated with $\mu$=1, 2, 3, 4.

The novel repair process presented here has the advantage that the repair data sent by a helper node does not depend on the identity of other helpers participating in the repair process. Moreover, the techniques described herein present a repair mechanism for multiple simultaneous failures. The proposed scheme exploits the overlap between the repair data sent for different failed nodes and offers a reduced repair-bandwidth compared to naively repairing the failed nodes independent of each other.

The code construction is reviewed in this discosure for completeness. In order to prove Theorem 1, it suffices to show that the proposed code satisfies the two fundamental properties, namely data recovery and exact node repair. The proof data recovery property is similar to that of Proposition 1, and hence omitted here. The exact-repair property is formally stated in Proposition 2. Moreover, Proposition 1 shows that the repair bandwidth of the proposed code does not exceed $\beta^{(m)}$. This is also proved in this disclosure.

Figure 2:
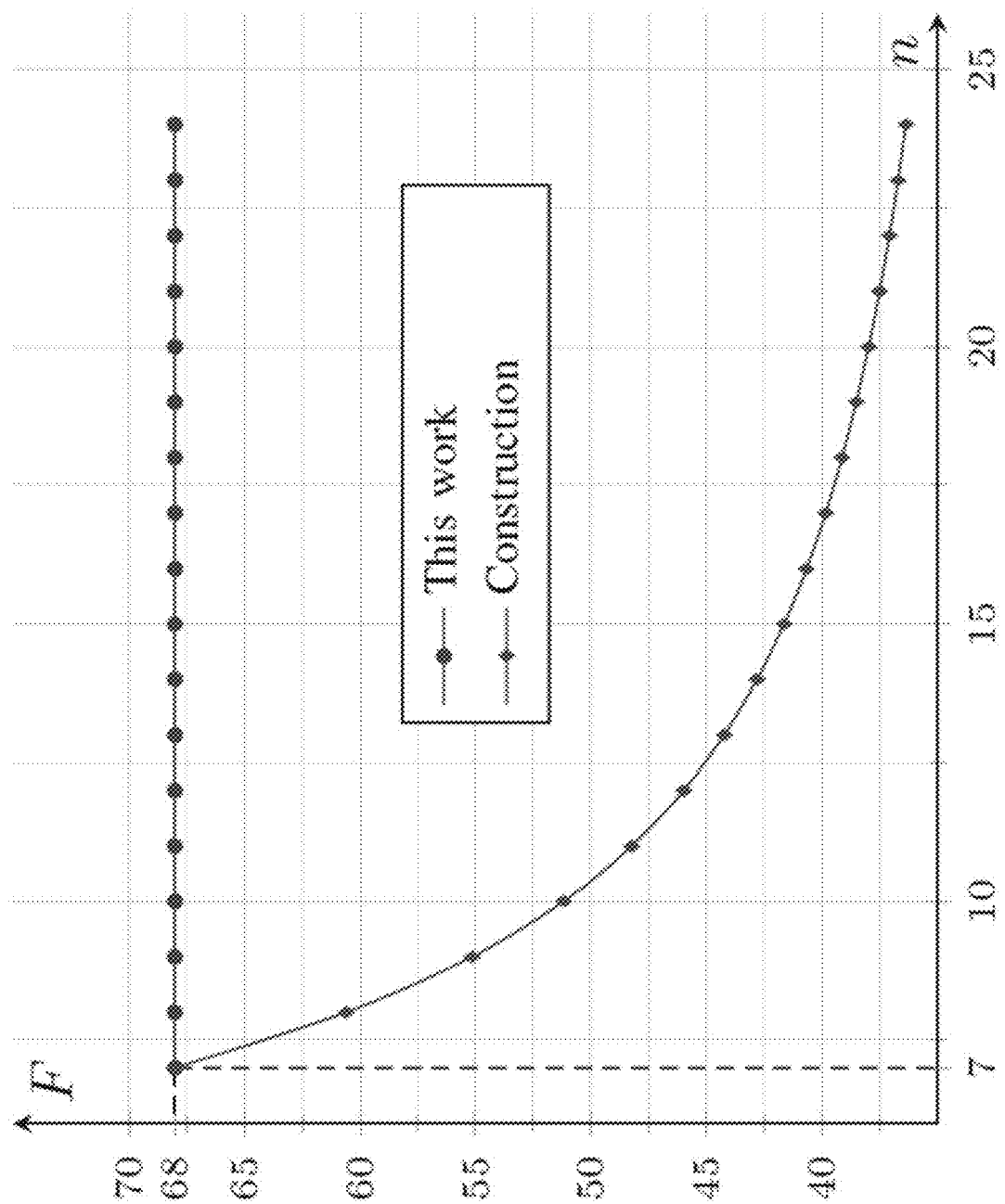
FIG. 2 is a conceptual diagram illustrating an example comparison of the maximum files size (F) of two codes, in accordance with the techniques described herein.

FIG. 2 is a conceptual diagram illustrating a comparison of the maximum files size (F) of two codes, in accordance with the techniques described herein. For example, FIG. 2 illustrates a comparison of the maximum files size (F) of two (n≥7, k=4, d=6) exact-regenerating codes, and code parameters ($\alpha$, $\beta$)=(18, 5). When the distributed storage system has only n=d+1=7, both codes can store F=68 units of data. However, for a sufficiently large field size, the storage capacity decays as a function of, while the storage capacity is preserved for the cascade code described herein. In the cascade code construction, the pair ($\alpha$,$\beta$)=(18, 5) corresponds to a code construction with $\mu$=2.

FIG. 2 compares the scalability aspect of the code construction described herein with an existing construction. The term scalability refers to the property that the number of nodes in a distributed storage system can be increased (for a sufficiently large field size) without compromising the system performance, and its overall capacity.

Figure 3:
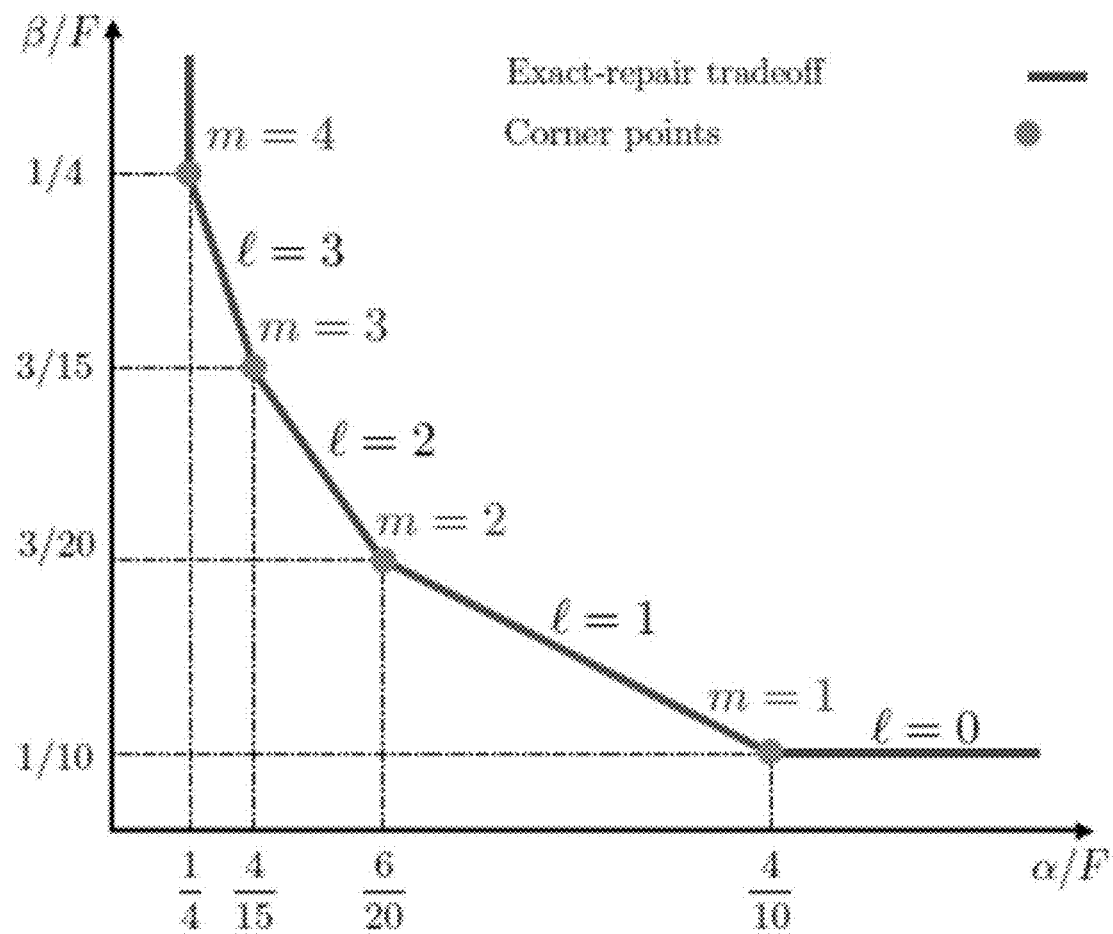
FIG. 3 is a conceptual diagram illustrating an example linear trade-off for a system d=4 together with achievable corner points, in accordance with the techniques described herein.

FIG. 3 is a conceptual diagram illustrating the linear trade-off for a system d=4 together with achievable corner points of this disclosure are depicted.

Remark 1 Theorem 1 offers an achievable trade-off for the normalized parameters ($\alpha$/F, $\beta$/F) given by $$\left(\frac{\alpha^{(m)}}{F^{(m)}}, \frac{\beta^{(m)}}{F^{(m)}}\right) = \left(\binom{d}{m}\bigg/m\binom{d+1}{m+1}, \binom{d-1}{m-1}\bigg/m\binom{d+1}{m+1}\right) = \left(\frac{m+1}{m(d+1)}, \frac{m+1}{d(d+1)}\right).$$

(3C)

It is shown that for any linear exact-repair regenerating code with parameters (n, k=d, d) that is capable of storing F symbols, ($\alpha$, $\beta$) may satisfy $$F \leq \frac{d+1}{\ell+2}\left(\ell\alpha + \frac{d}{\ell+1}\beta\right),$$

(3D)

where $\ell = \lfloor d\beta/\alpha \rfloor$ takes values in $\{0, 1, \ldots, d\}$. This establishes a piece-wise linear lower bound curve, with d (normalized) corner points obtained at integer values of $\ell = d\beta/\alpha$. For these corner points, the (normalized) operating points ($\alpha$/F, $\beta$/F) are given $$\left(\frac{\alpha}{F}, \frac{\beta}{F}\right) = \left(\frac{\ell+1}{\ell(d+1)}, \frac{\ell+1}{d(d+1)}\right).$$

These operating points are matching with the achievable (normalized) pairs given in (2). Therefore, determinant codes are optimal, and together with the lower bound fully characterize the optimum trade-off for exact-repair regenerating codes with parameters (n, k=d, d). The next result of this disclosure provides an achievable bandwidth for multiple repairs.

Theorem 2: In an (n, k=d, d) determinant codes operating at mode m, the content of any set of e simultaneously failed nodes can be exactly repaired by accessing an arbitrary set of d nodes and downloading $$\beta_e^{(m)} = \binom{d}{m} - \binom{d-e}{m}$$

repair symbols from each helper node.

The repair mechanism for multiple failures is similar to that of single failure presented in Proposition 2. In order to prove Theorem 2, it suffices to show that the repair bandwidth required for multiple failures does not exceed $\beta_e^{(m)}$. This is formally stated in Proposition 3 and proved in this disclosure.

Figure 4:
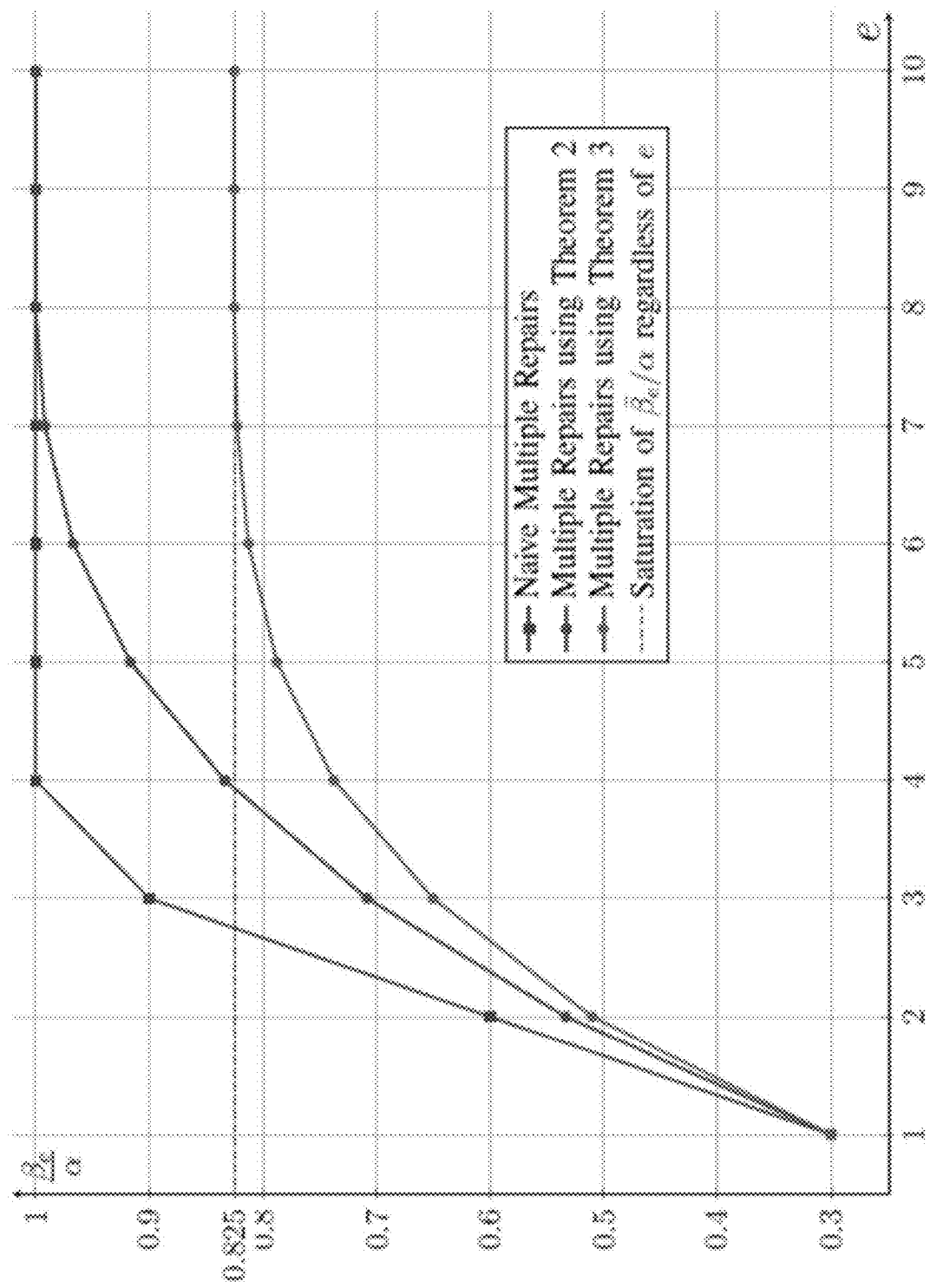
FIG. 4 is a conceptual diagram illustrating an example normalized repair bandwidth (by per-node storage size) for multiple failures with e failed nodes, for an (n, 10,10) determinant code operating at mode m=3, i.e, $(\alpha, \beta, F)=(120,36,990)$, in accordance with the techniques described herein.

FIG. 4 is a conceptual diagram illustrating a normalized repair bandwidth (by per-node storage size) for multiple failures with e failed nodes, for an (n, 10,10) determinant code operating at mode m=3, i.e, $(\alpha, \beta, F) = (120, 36, 990)$.

Remark 2: Note that the repair bandwidth proposed for multiple repairs in Theorem 2 subsumes the one in Theorem 1 for single failure for setting e=1:

$$\beta_1^{(m)} = \binom{d}{m} - \binom{d-1}{m} = \binom{d-1}{m-1} = \beta^{(m)}.$$

Remark 3: It is worth mentioning that the repair-bandwidth proposed in Theorem 2 is universally and simultaneously achievable. That is, the same determinant code can simultaneously achieve $\beta_e^{(m)}$ for every $e \in \{1, 2, \ldots, n-d\}$.

The next theorem shows that the repair bandwidth for multiple failures can be further reduced in the centralized repair setting, by a sequential repair mechanism, and exploiting the repair symbols contributed by already repaired failed nodes which can act as helpers.

Theorem 3: In an (n, k=d, d) determinant code with (up to a scalar factor) parameters $$\alpha^{(m)} = \binom{d}{m} \text{ and } F^{(m)} = m\binom{d+1}{m+1},$$

any set of e simultaneously failed nodes can be centrally repaired by accessing an arbitrary set of d helper nodes and downloading a total of $$\tilde{\beta}_e^{(m)} = \frac{1}{d}\left[m\binom{d+1}{m+1} - m\binom{d-e+1}{m+1}\right] \quad (3E)$$

repair symbols from each helper node.

Remark 4: It is worth noting that for $$e > d-m, \tilde{\beta}_e^{(m)} = \frac{m}{d}\binom{d+1}{m+1} = F^{(m)}/d \text{(independent of } e\text{), and}$$

$$\frac{\tilde{\beta}_e^{(m)}}{\alpha^{(m)}} = \frac{m(d+1)}{d(m+1)},$$

which is strictly less than 1 as shown in FIG. 4 (for all corner points except the MSR point, m=d). The fact that $\tilde{\beta}_e^{(m)} = F^{(m)}/d$ implies that the helper nodes contribute just enough number of repair symbols to be able to recover the entire file, without sending any redundant data. It is clear that this repair-bandwidth is optimum for $e \geq d$, since such a set of e failed nodes may be able to recover the entire file after being repaired.

This theorem is built on the result of Theorem 2, by exploiting the repair data can be exchanged among the failed nodes. Note that in the centralized repair setting, the information exchanged among the failed nodes at the repair center are not counted against the repair bandwidth.

Note that for a given system parameter (n, k, d), a total of k triples of $(\alpha, \beta, F)$ can be obtained from (3), by changing the parameter $\mu$. The following corollary shows that MBR and MSR points are subsumed as special points of the proposed trade-off.

Corollary 1: The code construction of this disclosure achieves the MBR point for $\mu=1$, and the MSR point for $\mu=k$.

Proof: For the MBR point, corresponding to $\mu=1$, $$\alpha_{MBR} \triangleq \alpha(d, k; 1) = \sum_{m=0}^{1}(d-k)^{1-m}\binom{k}{m} = (d-k)+k = d, \quad (4)$$

$$\beta_{MBR} \triangleq \beta(d, k; \mu) = \sum_{m=0}^{1}(d-k)^{1-m}\binom{k-1}{m-1} = 1,$$

$$F_{MBR} \triangleq F(d, k; \mu) =$$

$$\sum_{m=0}^{1}k(d-k)^{1-m}\binom{k}{m} = \binom{k}{1+1} = kd - \binom{k}{2} = \frac{k(2d-k+1)}{2}.$$

This triple satisfies $$\left(\frac{\alpha_{MBR}}{F_{MBR}}, \frac{\beta_{MBR}}{F_{MBR}}\right) = \left(\frac{2d}{k(2d-k+1)}, \frac{2}{k(2d-k+1)}\right),$$

which is the characteristic of the MBR point. Similarly, for $\mu=k$ $$\alpha_{MSR} \triangleq \alpha(d, k; \mu) = \sum_{m=0}^{k}(d-k)^{k-m}\binom{k}{m} = (d-k+1)^k, \quad (5)$$

$$\beta_{MSR} \triangleq \beta(d, k; \mu) = \sum_{m=0}^{k}(d-k)^{k-m}\binom{k-1}{m-1} = (d-k+1)^{k-1},$$

$$F_{MSR} \triangleq F(d, k; \mu) = \sum_{m=0}^{k}k(d-k)^{k-m}\binom{k}{m} = \binom{k}{k+1} = k(d-k+1)^k,$$

which satisfy $$\left(\frac{\alpha_{MSR}}{F_{MSR}}, \frac{\beta_{MSR}}{F_{MSR}}\right) = \left(\frac{1}{k}, \frac{1}{k(d-k+1)}\right),$$

which is the identity of the MSR point.

Corollary 2: The proposed code at mode $\mu=k-1$ achieves the cut-set bound, and hence it is optimum.

Proof: The cut-set bound given by $$F \leq \sum_{i=1}^{k}\min(\alpha, (d-i+1)\beta)$$

reduces to $F=(k-1)\alpha+(d-k+1)\beta$ in the neighborhood of the MSR point. The latter equation is satisfied by the parameters of proposed code:

$$(k-1)\alpha(d,k;k-1)+(d-k+1)\beta(d,k;k-1) =$$
$$k\alpha(d,k;k-1)+(d-k)\beta(d,k;k-1)-[\alpha(d,k;k-1)-\beta(d,k;k-1)] =$$

$$\sum_{m=0}^{k-1} k(d-k)^{k-1-m}\binom{k}{m} + \sum_{m=0}^{k-1}(d-k)^{k-m}\binom{k-1}{m-1} -$$

$$\sum_{m=0}^{k-1}(d-k)^{k-1-m}\left[\binom{k}{m} - \binom{k-1}{m-1}\right] =$$

$$\sum_{m=0}^{k-1} k(d-k)^{k-1-m}\binom{k}{m} + \sum_{m=0}^{k-1}(d-k)^{k-m}\binom{k-1}{m-1} -$$

$$\sum_{m=0}^{k-1}(d-k)^{k-1-m}\binom{k-1}{m} = \sum_{m=0}^{k-1} k(d-k)^{k-1-m}\binom{k}{m} +$$

$$\sum_{m=0}^{k-1}(d-k)^{k-m}\binom{k-1}{m-1} - \sum_{m=1}^{k}(d-k)^{k-m}\binom{k-1}{m-1} =$$

$$\sum_{m=0}^{k-1} k(d-k)^{k-1-m}\binom{k}{m} + (d-k)^{k-0}\binom{k-1}{0-1} - (d-k)^{k-k}\binom{k-1}{k-1} =$$

$$\sum_{m=0}^{k-1} k(d-k)^{k-1-m}\binom{k}{m} - 1 = F(d,k;k-1).$$

Hence, this point satisfies the cut-set bound and it is optimum.

The code construction presented in this disclosure uses signed determinant codes as the main building blocks. The family of determinant codes is a class of codes that achieve the optimum (linear) storage-bandwidth tradeoff of the regenerating codes, when the number nodes participating in data recovery equals the number of helpers contributing to a repair process, i.e., k=d. They are linear codes, which can be constructed by multiplying an encoder matrix by a message matrix. The modification here (that converts a determinant code to a signed determinant code) is due arbitrary assignment of (+/−) signs to the rows of the message matrix, which affect all the entries in the corresponding row. The above modification preserves all properties of determinant codes, while it is helpful towards the next step which is the construction of (n, k, d) codes.

The following reviews the construction of signed determinant codes and their properties. The family of signed determinant codes for an (n, k=d, d) system consists of d distinct codes, enumerated by a parameter m∈{1, 2, . . . , d}, which is called mode of the code. For any mode m∈[d], the parameters of the determinant code corresponding to the m-th corner point on the trade-off are given by $$(\alpha_m, \beta_m, F_m) = \left(\binom{d}{m}, \binom{d-1}{m-1}, m\binom{d+1}{m+1}\right).$$

Here m=1 corresponds to MBR code, while m=d results in the parameters of an MSR code. For a distributed storage system with parameters (n, k=d, d) and corresponding to a mode m∈{1, 2, . . . , d}, the construction provides an exact-repair regenerating code with per-node storage capacity $$\alpha^{(m)} = \binom{d}{m}$$

and per-node repair-bandwidth $$\beta^{(m)} = \binom{d-1}{m-1}.$$

This code can store up to $$F^{(m)} = m\binom{d+1}{m+1}$$

symbols.

The coded symbols in a matrix is represented by $\mathcal{C}_{n\times\alpha}$, in which the i-th row corresponds to the encoded data to be stored in i-th node of DSS. The proposed code is linear, i.e., the encoded matrix $\mathcal{C}$ is obtained by multiplying an encoder matrix $\Psi_{n\times d}$ and a message matrix. All entries of the encoder matrix and the message matrix are assumed to be from a finite field $\mathbb{F}$, which has at least n distinct elements. Moreover, all the arithmetic operations are performed with respect to the underlying finite field. The structures of the encoder and message matrices are given below.

A signed determinant code with parameters (n, k, d) and mode m is represented by a matrix $C_{n\times\alpha_m}$ whose i-th row includes the coded content of the i-th node. In general, $C_{n\times\alpha_m}$ is obtained by multiplying an encoder matrix $\Psi_{n\times d}$ whose entries are from a finite field $\mathbb{F}_q$ and a message matrix $D_{d\times\alpha_m}$. The encoder matrix $\Psi$ is chosen such that any collection of d of its rows is linearly independent. Examples of such matrices include Vandermonde and Cauchy matrices.

Encoder Matrix: The matrix $\Psi_{n\times d}$ is a fixed matrix which is shared among all the nodes in the system. The main property required for matrix $\Psi$ is being Maximum-Distance-Separable (MDS), that is, any d×d sub-matrix of $\Psi_{n\times d}$ is full-rank. Examples of MDS matrices include Vandermonde or Cauchy matrices. An MDS matrix may be converted to a systematic MDS matrix, by multiplying it by the inverse of its top d×d sub-matrix. The first k nodes may be referred to by systematic nodes if a systematic MDS matrix is used for encoding.

Message Matrix: The message matrix D is filled with raw (source) symbols and parity symbols. Recall that D is a d×α matrix, that has $$d\alpha = d\binom{d}{m}$$

entries, while storing only $$F = m\binom{d+1}{m+1}$$

source symbols. Hence, there are $$d\alpha - F = \binom{d}{m+1}$$

redundant entries in D, which are filled with parity symbols. More precisely, the techniques described herein divide the set of F data symbols into two groups, namely, $\mathcal{V}$ and $\mathcal{W}$, whose elements are indexed by sets as follows $$V = \{v_{x,\mathcal{X}}: \mathcal{X} \subseteq [d], |\mathcal{X}| = m, x \in \mathcal{X}\}, \quad (6)$$

$$W = \{w_{x,\mathcal{Y}}: \mathcal{Y} \subseteq [d], |\mathcal{Y}| = m+1, x \in \mathcal{Y}, \mathrm{ind}_\mathcal{Y}(x) \le m\}.$$

Note that each element of $\mathcal{V}$ is indexed by a set $\mathcal{I} \subseteq [d]$ of length $|\mathcal{I}|=m$ and an integer number $x \in \mathcal{I}$. Hence, $$|V| = m\binom{d}{m}.$$

Similarly, symbols in $\mathcal{W}$ are indexed by a pair (x, $\mathcal{I}$), where $\mathcal{I}$ is a subset of [d] with m+1 entries, and x can take any value in $\mathcal{I}$ except the largest one. So, there are $$|W| = m\binom{d}{m+1}$$

symbols in set $\mathcal{W}$. Note that $F = |\mathcal{V}| + |\mathcal{W}|$.

$$|V| + |W| = m\binom{d}{m} + m\binom{d}{m+1} = m\binom{d+1}{m+1} = F_m.$$

Moreover, for (x, $\mathcal{Y}$) with $\mathrm{ind}_\mathcal{Y}$(x)=m+1, compute a parity symbol $w_{x,\mathcal{Y}}$, so that the parity equation $$\sum_{y \in \mathcal{Y}} (-1)^{\mathrm{ind}_\mathcal{Y}(y)} w_{y,\mathcal{Y}} = 0 \quad (7)$$

hold for any $\mathcal{I} \subseteq [d]$ with $|\mathcal{I}|=m+1$. In other words, such missing symbols are given by $$(-1)^{m+1} w_{\max\mathcal{I},\mathcal{I}} = -\sum_{y \in \mathcal{I} \setminus \{\max\mathcal{I}\}} (-1)^{\mathrm{ind}_\mathcal{I}(y)} w_{y,\mathcal{I}}.$$

Finally, for a arbitrary given signature vector $\sigma_D: [d] \to \mathbb{Z}$, a plus or minus sign may be assigned to each integer $x \in [d]$, that is, $(-1)^{\sigma_D(x)}$. To fill the data matrix D, label its rows by integer numbers from [d] and its columns by subsets $\mathcal{I} \subseteq [d]$ with $|\mathcal{I}|=m$, according to the lexicographical order. Then the entry at row x and column $\mathcal{I}$ is given by $$D_{x,\mathcal{I}} = \begin{cases} (-1)^{\sigma_D(x)} v_{x,\mathcal{I}} & \text{if } x \in \mathcal{I}, \\ (-1)^{\sigma_D(x)} w_{x,\mathcal{I} \cup \{x\}} & \text{if } x \notin \mathcal{I}. \end{cases} \quad (8A)$$

For the sake of completeness, define an (n, k=d, d; m=0) determinant code at mode m=0 to be a trivial code with ($\alpha$=1, $\beta$=0, F=0), whose message matrix is a d×1 all-zero matrix.

The second important property of the proposed code is its ability to exactly repair the content of a failed node using the repair data sent by the helper nodes. Let node f $\in$ [n] fails, and a set of helper nodes $\mathcal{H} \subseteq \{1, 2, \ldots, n\} \setminus \{f\}$ with $|\mathcal{H}|$=d wishes to repair node f. The techniques described herein first determine the repair data sent from each helper node in order to repair node f.

Repair Encoder Matrix at the Helper Nodes: For a determinant code operating in mode m and a failed node f, the repair-encoder matrix $\Xi^{f,(m)}$ is defined as a $$\binom{d}{m} \times \binom{d}{m-1}$$

matrix, whose rows are labeled by m-element subsets of [d] and columns are labeled by (m−1)-element subsets of [d]. The entry in row $\mathcal{I}$ and column $\mathcal{J}$ is given by $$\Xi_{\mathcal{I},\mathcal{J}}^{f,(m)} = \begin{cases} (-1)^{\mathrm{ind}_\mathcal{I}(x)} \psi_{f,x} & \text{if } \mathcal{J} \cup \{x\} = \mathcal{I}, \\ 0 & \text{otherwise,} \end{cases} \quad (8B)$$

where $\psi_{f,x}$ is the entry of the encoder matrix $\Psi$ at position (f, x). An example of the matrix $\Xi$ is given in (29).

In order to repair node f, each helper node h $\in$ $\mathcal{H}$ multiplies its content $\Psi_h \cdot D$ by the repair-encoder matrix of node f to obtain $\Psi_h \cdot D \cdot \Xi^{f,(m)}$, and sends it to node f. Note that matrix $\Xi^{f,(m)}$ has $$\binom{d}{m-1}$$

columns, and hence the length of the repair data $\Psi_h \cdot D \cdot \Xi^{f,(m)}$ is $$\binom{d}{m-1},$$

which is greater than $$\beta = \binom{d-1}{m-1}.$$

However, the following proposition states that out of $$\binom{d}{m-1}$$

columns of matrix $\Xi^{f,(m)}$ at most $$\beta^{(m)} = \binom{d-1}{m-1}$$

are linearly independent. Thus, the entire vector $\Psi_h \cdot D \cdot \Xi^{f,(m)}$ can be sent by communicating at most $\beta$ symbols (corresponding to the linearly independent columns of $\Xi^{f,(m)}$) to the failed node, and other symbols can be reconstructed using the linear dependencies among the repair symbols. This is formally stated in the following proposition, which is proved in this disclosure.

Proposition 1: The rank of matrix $\Xi^{f,(m)}$ is at most $$\beta^{(m)} = \binom{d-1}{m-1}.$$

Decoding at the Failed Node: Upon receiving d repair-data vectors $\{\Psi_h \cdot \Xi^{f,(m)}: h \in \mathcal{H}\}$, the failed node stacks them to form a matrix $\Psi[\mathcal{H}, :] \cdot D \cdot \Xi^{f,(m)}$, where $\Psi[\mathcal{H}, :]$ in the sub-matrix of $\Psi$ obtained from nodes $h \in \mathcal{H}$. This matrix is full-rank by the definition of the $\Psi$ matrix. Multiplying by $\Psi[\mathcal{H}, :]^{-1}$, the failed node retrieves $$R^{f,(m)} = D \cdot \Xi^{f,(m)} \quad (8C)$$

This is a $$d \times \binom{d}{m-1}$$

matrix. These $$d\binom{d}{m-1}$$

linear combinations of the data symbols span a linear subspace, which is referred to by repair space of node f. The following proposition shows that all of the missing symbols of node f can be recovered from its repair space.

Proposition 2: In the (n, k=d, d) proposed codes with parameters $$(\alpha^{(m)}, \beta^{(m)}, F^{(m)}) = \left(\binom{d}{m}, \binom{d-1}{m-1}, m\binom{d+1}{m+1}\right),$$

for every failed node $f \in [n]$ and set of helpers $\mathcal{H} \subseteq [n]\setminus\{f\}$ with $|H|=d$, the content of node f can be exactly regenerated by downloading $\beta$ symbols from each of nodes in $\mathcal{H}$. More precisely, the $\mathcal{J}$-th entry of the node f can be recovered using $$[\Psi_f \cdot D]_{\mathcal{J}} \sum_{x \in \mathcal{J}} (-1)^{ind_{\mathcal{J}}(x)} [R^{f,(m)}]_{x, \mathcal{J}\setminus\{x\}}. \quad (8D)$$

Remark 1: Note that for a code defined on the Galois field $GF(2^S)$ with characteristic 2, $-1=+1$, and hence, all the positive and negative signs disappear. In particular, the parity equation in (5) may simply reduce to $$\sum_{y \in \mathcal{J}} w_{y, \mathcal{J}} = 0.$$

the non-zero entries of the repair encoder matrix in (7) may be $\psi_{f,x}$, and the repair equation in (9) may be replaced by $$[\Psi_f \cdot D]_{\mathcal{J}} \sum_{x \in \mathcal{J}} [R^{f,(m)}]_{x, \mathcal{J}\setminus\{x\}}.$$

The repair mechanism proposed for multiple failure scenario is similar to that of the single failure case. The techniques described herein consider a set of failed nodes $\mathcal{E}$ with $e=|\mathcal{E}|$ failures. Each helper node $h \in \mathcal{H}$ sends its repair data to all failed nodes simultaneously. Each failed node $f \in \mathcal{E}$ can recover the repair data $\{\Psi_h \cdot D \cdot \Xi^{f,(m)}: h \in \mathcal{H}\}$, and the repair mechanism is similar to that explained in Proposition 2.

A naive approach is to simply concatenate all the required repair data $\{\Psi_h \cdot D \cdot \Xi^{f,(m)}: f \in \mathcal{E}\}$ at the helper node $h \in \mathcal{H}$ and send it to the failed nodes. More precisely, for a set of failed nodes $\mathcal{E} = \{f_1, f_2, \ldots, f_e\}$ and a helper node $h \in \mathcal{H}$, define its repair data as $$\Psi_h \cdot D \cdot \Xi^{\mathcal{E},(m)},$$

where $$\Xi^{\mathcal{E},(m)} = [\Xi^{f_1,(m)} \; \Xi^{f_2,(m)} \; \ldots \; \Xi^{f_e,(m)}]. \quad (8E)$$

This is simply a concatenation of the repair data for individual repair of $f \in \mathcal{E}$, and the content of each failed node can be exactly reconstructed according to Proposition 2. The repair bandwidth required for naive concatenation scheme is $$e \times \beta_1^{(m)} = e \binom{d-1}{m-1}.$$

Instead, the techniques described herein show that the bandwidth can be opportunistically utilized by exploiting the intersection between the repair space of the different failed nodes. The following proposition shows that the repair data $$\Psi_h \cdot D \cdot \Xi^{\mathcal{E},(m)}$$

can be delivered to the failed nodes by communicating only $\beta_e^{(m)}$ repair symbols.

Proposition 3: Assume that a family of e nodes $\mathcal{E} = \{f_1, f_2, \ldots, f_e\}$ are failed. Then the rank of matrix $\Xi^{\mathcal{E},(m)}$ defined in (10) is at most $$\binom{d}{m} - \binom{d-e}{m}.$$

Before presenting the formal proof of the main properties of the proposed code, the techniques described herein show the code construction and the repair mechanism through an example in this section. This example is similar to that of, and may be helpful to understand the notation and the details of the code construction, as well as to provide an intuitive justification for its underlying properties.

Let's consider a distributed storage system with parameters (n, k, d)=(8,4,4) and an operating mode m=2. The parameters of the proposed regeneration code for this point of the trade-off are given by $$(\alpha^{(2)}, \beta^{(2)}, F^{(2)}) = \left(\binom{4}{2}, \binom{4-1}{2-1}, 2\binom{4+1}{2+1}\right) = (6,3,20).$$

The techniques described herein first label and partition the information symbols into two groups, $\mathcal{V}$ and $\mathcal{W}$, with $$|V| = m\binom{d}{m} = 2\binom{4}{2} = 12 \text{ and}$$

$$|W| = m\binom{d}{m+1} = 2\binom{4}{3} = 8.$$

Note that $|\mathcal{V}| + |\mathcal{W}| = 20 = F$.

$$V = \left\{ \begin{array}{l} v_{1,\{1,2\}}, v_{2,\{1,2\}}, v_{1,\{1,3\}}, v_{3,\{1,3\}}, \\ v_{1,\{1,4\}}, v_{4,\{1,4\}}, v_{2,\{2,3\}}, v_{3,\{2,3\}}, \\ v_{2,\{2,3\}}, v_{4,\{2,4\}}, v_{3,\{3,4\}}, v_{4,\{3,4\}} \end{array} \right\},$$

$$W = \left\{ \begin{array}{l} w_{1,\{1,2,3\}}, w_{2,\{1,2,3\}}, w_{1,\{1,2,4\}}, w_{2,\{1,2,4\}}, \\ w_{1,\{1,3,4\}}, w_{3,\{1,3,4\}}, w_{2,\{2,3,4\}}, w_{3,\{2,3,4\}} \end{array} \right\}.$$

Moreover, for each subset $\mathcal{J} \subseteq [4]$ with $|\mathcal{J}| = m+1 = 3$, define parity symbols as $$\begin{cases} \mathcal{J} = \{1,2,3\}: w_{3,\{1,2,3\}} = w_{2,\{1,2,3\}} - w_{1,\{1,2,3\}}, \\ \mathcal{J} = \{1,2,4\}: w_{4,\{1,2,4\}} = w_{2,\{1,2,4\}} - w_{1,\{1,2,4\}}, \\ \mathcal{J} = \{1,3,4\}: w_{4,\{1,3,4\}} = w_{3,\{1,3,4\}} - w_{1,\{1,3,4\}}, \\ \mathcal{J} = \{2,3,4\}: w_{4,\{2,3,4\}} = w_{3,\{2,3,4\}} - w_{2,\{2,3,4\}}. \end{cases} \quad (8F)$$

Next, the message matrix D may be formed by placing v and w symbols as specified in (6). The resulting message matrix is given by The next step for encoding the data is multiplying D by an encoder matrix $\Psi$. To this end, choose a finite field $\mathbb{F}_{13}$ (with at least n=8 distinct non-zero entries), and pick an 8×4 Vandermonde matrix generated by i=1, 2, 3, 4, 5, 6, 7, 8. The techniques described herein convert this matrix to a systematic MDS matrix by multiplying it from the right by the inverse of its top 4×4 matrix. That is, $$\Psi_{8\times 4} = \begin{bmatrix} \Psi_1 \\ \Psi_2 \\ \Psi_3 \\ \Psi_4 \\ \Psi_5 \\ \Psi_6 \\ \Psi_7 \\ \Psi_8 \end{bmatrix}$$

$$= \begin{bmatrix} 1^0 & 1^1 & 1^2 & 1^3 \\ 2^0 & 2^1 & 2^2 & 2^3 \\ 3^0 & 3^1 & 3^2 & 3^3 \\ 4^0 & 4^1 & 4^2 & 4^3 \\ 5^0 & 5^1 & 5^2 & 5^3 \\ 6^0 & 6^1 & 6^2 & 6^3 \\ 7^0 & 7^1 & 7^2 & 7^3 \\ 8^0 & 8^1 & 8^2 & 8^3 \end{bmatrix} \begin{bmatrix} 1^0 & 1^1 & 1^2 & 1^3 \\ 2^0 & 2^1 & 2^2 & 2^3 \\ 3^0 & 3^1 & 3^2 & 3^3 \\ 4^0 & 4^1 & 4^2 & 4^3 \end{bmatrix}^{-1}$$

$$= \begin{bmatrix} 1 & 0 & 0 & 0 \\ 0 & 1 & 0 & 0 \\ 0 & 0 & 1 & 0 \\ 0 & 0 & 0 & 1 \\ 12 & 4 & 7 & 4 \\ 9 & 2 & 6 & 10 \\ 3 & 10 & 7 & 7 \\ 6 & 5 & 7 & 9 \end{bmatrix} (\mathrm{mod}\ 13).$$

Note that every k=4 rows of matrix $\Psi$ are linearly independent, and form an invertible matrix. Then the content of node i is formed by row i in the matrix product $\Psi \cdot D$, which are denoted by $\Psi_i \cdot D$.

Data recovery from the content of any k=4 node is immediately implied by the MDS property of the encoder matrix. Next, the repair process for single and multiple failures is described.

Remark 1: Note that the construction of signed determinant codes decouples the parameters of the code. The encoder matrix only depends on n and d and remains the same for all modes. On the other hand, the message matrix D is fully determined by parameters (d, m), and does not depend on n, the total number of nodes in the system. Thus, the techniques described herein refer to the code defined above as a (d; m) signed determinant code and to matrix D as a (d; m) message matrix.

$$R^{f,(2)} = \begin{array}{c} 1 \\ 2 \\ 3 \\ 4 \end{array} \begin{bmatrix} \overset{\{1\}}{v_{1,\{1,2\}}\psi_{f,2} + v_{1,\{1,3\}}\psi_{f,3} + v_{1,\{1,4\}}\psi_{f,4}} & \overset{\{2\}}{-v_{1,\{1,2\}}\psi_{f,1} + w_{1,\{1,2,3\}}\psi_{f,3} + w_{1,\{1,2,4\}}\psi_{f,4}} & \cdots \\ v_{2,\{1,2\}}\psi_{f,2} + w_{2,\{1,2,3\}}\psi_{f,3} + w_{1,\{1,2,4\}}\psi_{f,4} & -v_{2,\{1,2\}}\psi_{f,1} + v_{2,\{2,3\}}\psi_{f,3} + v_{2,\{2,4\}}\psi_{f,4} & \cdots \\ w_{3,\{1,2,3\}}\psi_{f,2} + v_{3,\{1,3\}}\psi_{f,3} + w_{3,\{1,3,4\}}\psi_{f,4} & -w_{3,\{1,2,3\}}\psi_{f,1} + v_{3,\{2,3\}}\psi_{f,3} + w_{3,\{2,3,4\}}\psi_{f,4} & \cdots \\ w_{4,\{1,2,4\}}\psi_{f,2} + w_{4,\{1,3,4\}}\psi_{f,3} + v_{4,\{1,4\}}\psi_{f,4} & -w_{4,\{1,2,4\}}\psi_{f,1} + w_{4,\{2,3,4\}}\psi_{f,3} + v_{4,\{2,4\}}\psi_{f,4} & \cdots \end{bmatrix}$$

$$\begin{bmatrix} \overset{\{3\}}{-v_{1,\{1,3\}}\psi_{f,1} - w_{1,\{1,2,3\}}\psi_{f,2} + w_{1,\{1,3,4\}}\psi_{f,4}} & \overset{\{4\}}{-v_{1,\{1,4\}}\psi_{f,1} - w_{1,\{1,2,4\}}\psi_{f,2} - w_{1,\{1,3,4\}}\psi_{f,3}} \\ -w_{2,\{1,2,3\}}\psi_{f,1} - v_{2,\{2,3\}}\psi_{f,2} + w_{2,\{2,3,4\}}\psi_{f,4} & -w_{2,\{1,2,4\}}\psi_{f,1} - v_{2,\{2,4\}}\psi_{f,2} - w_{2,\{2,3,4\}}\psi_{f,3} \\ -v_{3,\{1,3\}}\psi_{f,1} - v_{3,\{2,3\}}\psi_{f,2} + v_{3,\{3,4\}}\psi_{f,4} & -w_{3,\{1,3,4\}}\psi_{f,1} - w_{3,\{2,3,4\}}\psi_{f,2} - v_{3,\{3,4\}}\psi_{f,3} \\ -w_{4,\{1,3,4\}}\psi_{f,1} - w_{4,\{2,3,4\}}\psi_{f,2} + v_{4,\{3,4\}}\psi_{f,4} & -v_{4,\{1,4\}}\psi_{f,1} - v_{4,\{2,4\}}\psi_{f,2} - v_{4,\{3,4\}}\psi_{f,3} \end{bmatrix}$$

First, suppose that a non-systematic node f fails, and the techniques described herein wish to repair it by the help of the systematic nodes $\mathcal{H}=\{1,2,3,4\}$, by downloading $\beta=3$ from each. The content of node f is given by $\Psi_f D$, which includes $\alpha=6$ symbols. Note that the content of this node is a row vector whose elements has the same labeling as the columns of D, i.e all m=2 elements subsets of [d]=$\{1,2,3,4\}$. The symbols of this node are given by:

$$\begin{cases} \mathcal{J}=\{1,2\}: \\ \psi_{f,1}v_{1,\{1,2\}}+\psi_{f,2}v_{2,\{1,2\}}+\psi_{f,3}w_{3,\{1,2,3\}}+\psi_{f,4}w_{4,\{1,2,4\}}, \\ \mathcal{J}=\{1,3\}: \\ \psi_{f,1}v_{1,\{1,3\}}+\psi_{f,2}w_{2,\{1,2,3\}}+\psi_{f,3}w_{3,\{1,3\}}+\psi_{f,4}w_{4,\{1,3,4\}}, \\ \mathcal{J}=\{1,4\}: \\ \psi_{f,1}v_{1,\{1,4\}}+\psi_{f,2}w_{2,\{1,2,4\}}+\psi_{f,3}w_{3,\{1,3,4\}}+\psi_{f,4}v_{4,\{1,4\}}, \\ \mathcal{J}=\{2,3\}: \\ \psi_{f,1}w_{1,\{1,2,3\}}+\psi_{f,2}v_{2,\{2,3\}}+\psi_{f,3}v_{3,\{2,3\}}+\psi_{f,4}w_{4,\{2,3,4\}}, \\ \mathcal{J}=\{2,4\}: \\ \psi_{f,1}w_{1,\{1,2,4\}}+\psi_{f,2}v_{2,\{2,4\}}+\psi_{f,3}w_{3,\{2,3,4\}}+\psi_{f,4}v_{4,\{2,4\}}, \\ \mathcal{J}=\{3,4\}: \\ \psi_{f,1}w_{1,\{1,3,4\}}+\psi_{f,2}w_{2,\{2,3,4\}}+\psi_{f,3}v_{3,\{3,4\}}+\psi_{f,4}v_{4,\{3,4\}}. \end{cases} \quad (8G)$$

In the repair procedure using the systematic nodes as helpers, every symbol may be repaired by m nodes. Recall that d helper nodes contribute in the repair process by sending $$\beta = \binom{d-1}{m-1}$$

symbols each, in order to repair $$\alpha = \binom{d}{m}$$

missing symbols. Hence, the number of repair equations per missing symbol is $d\beta/\alpha=m$, which matches with the proposed repair mechanism.

The m=2 helpers for each missing encoded symbol are those who have a copy of the corresponding v-symbols, e.g., for the symbol indexed by $\mathcal{J}=\{1,2\}$ which has $v_{1,\{1,2\}}$ and $v_{2,\{1,2\}}$, the contributing helpers are nodes 1 (who has a copy of $v_{1,\{1,2\}}$) and node 2 (who stores a copy of $v_{2,\{1,2\}}$). To this end, node 1 can send $\psi_{f,1}v_{1,\{1,2\}}$ which node 2 sends $\psi_{f,2}v_{2,\{1,2\}}$ to perform the repair.

It can be seen that the $\{1,2\}$-th missing symbols has also two other terms depending on $w_{3,\{1,2,3\}}$ and $w_{4,\{1,2,4\}}$, which are stored at nodes 3 and 4, respectively. A naive repair mechanism requires these two nodes also to contribute in this repair procedure, which yields in a full data recovery in order to repair a failed node. Alternatively, the techniques described herein can reconstruct these w-symbols using the parity equations, and the content of the the first two helper nodes. Recall from (5) that $$w_{3,\{1,2,3\}}=-w_{1,\{1,2,3\}}+w_{2,\{1,2,3\}},$$

$$w_{4,\{1,2,4\}}=-w_{1,\{1,2,4\}}+w_{2,\{1,2,4\}},$$

where $w_{1,\{1,2,3\}}$ and $w_{1,\{1,2,4\}}$ are stored in node 1 and $w_{2,\{1,2,3\}}$ and $w_{2,\{1,2,4\}}$ are stored in node 2. Hence, the content of nodes 1 and 2 are sufficient to reconstruct the $\{1,2\}$-th symbol at the failed node f. To this end, node 1 computes $A=\psi_{f,1}v_{1,\{1,2\}}-\psi_{f,3}w_{1,\{1,2,3\}}-\psi_{f,4}w_{1,\{1,2,4\}}$ (a linear combination of its first, forth, and fifth entries), and sends A to f. Similarly, node 2 sends $B=\psi_{f,2}v_{2,\{1,2\}}+\psi_{f,3}w_{2,\{1,2,3\}}+\psi_{f,4}w_{2,\{1,2,4\}}$ (a linear combination of its first, second, and third coded symbols). Upon receiving these symbols, the $\{1,2\}$-th missing symbols of node f can be recovered from $$\begin{aligned} A+B &= (\psi_{f,1}v_{1,\{1,2\}}-\psi_{f,3}w_{1,\{1,2,3\}}-\psi_{f,4}w_{1,\{1,2,4\}})+ \\ &\quad (\psi_{f,2}v_{2,\{1,2\}}+\psi_{f,3}w_{2,\{1,2,3\}}+\psi_{f,4}w_{2,\{1,2,4\}}) \\ &= \psi_{f,1}v_{1,\{1,2\}}+\psi_{f,2}v_{2,\{1,2\}}+ \\ &\quad \psi_{f,3}(w_{2,\{1,2,3\}}-w_{1,\{1,2,3\}})+ \\ &\quad \psi_{f,4}(w_{2,\{1,2,4\}}-w_{1,\{1,2,4\}}) \\ &= \psi_{f,1}v_{1,\{1,2\}}+\psi_{f,2}v_{2,\{1,2\}}+ \\ &\quad \psi_{f,3}w_{3,\{1,2,3\}}+\psi_{f,4}w_{4,\{1,2,4\}}. \end{aligned} \quad (8H)$$

In general, v symbols are repaired directly by communicating an identical copy of them, while w symbols are repaired indirectly, using their parity equations. This is the general rule that the techniques described herein use for repair of all other missing symbols of node f. It can be seen that each helper node participates in the repair of $\beta=3$ missing symbols, by sending one repair symbol for each. For instance, node 1 contributes in the repair of symbols indexed by $\{1,2\}, \{1,3\}$, and $\{1,4\}$. The repair equation sent by node 1 for each these repair scenarios are listed below:

Repair Symbols Sent by Node 1:

$$\begin{cases} \mathcal{J}=\{1,2\}: \psi_{f,1}v_{1,\{1,2\}}-\psi_{f,3}w_{1,\{1,2,3\}}-\psi_{f,4}w_{1,\{1,2,4\}}, \\ \mathcal{J}=\{1,3\}: \psi_{f,1}v_{1,\{1,3\}}+\psi_{f,2}w_{1,\{1,2,3\}}-\psi_{f,4}w_{1,\{1,3,4\}}, \\ \mathcal{J}=\{1,4\}: \psi_{f,1}v_{1,\{1,4\}}+\psi_{f,2}w_{1,\{1,2,4\}}+\psi_{f,3}w_{1,\{1,3,4\}}. \end{cases} \quad (8I)$$

Similarly, the repair symbols sent from helper nodes 2, 3, and 4 are given by

Repair Symbols Sent by Node 2:

$$\begin{cases} \mathcal{J}=\{1,2\}: \psi_{f,2}v_{2,\{1,2\}}+\psi_{f,3}v_{2,\{1,2,3\}}+\psi_{f,4}w_{2,\{1,2,4\}}, \\ \mathcal{J}=\{2,3\}: \psi_{f,1}w_{2,\{1,2,3\}}+\psi_{f,2}v_{2,\{2,3\}}-\psi_{f,4}w_{2,\{2,3,4\}}, \\ \mathcal{J}=\{2,4\}: \psi_{f,1}w_{2,\{1,2,4\}}+\psi_{f,2}v_{2,\{2,4\}}+\psi_{f,3}w_{2,\{2,3,4\}}, \end{cases} \quad (8J)$$

Repair Symbols Sent by Node 3:

$$\begin{cases} \mathcal{J}=\{1,3\}: \psi_{f,2}w_{3,\{1,2,3\}}+\psi_{f,3}v_{3,\{1,3\}}+\psi_{f,4}w_{3,\{1,3,4\}}, \\ \mathcal{J}=\{2,3\}: -\psi_{f,1}w_{3,\{1,2,3\}}+\psi_{f,3}v_{3,\{2,3\}}+\psi_{f,4}w_{3,\{2,3,4\}}, \\ \mathcal{J}=\{3,4\}: \psi_{f,1}w_{3,\{1,3,4\}}+\psi_{f,2}w_{3,\{2,3,4\}}+\psi_{f,3}v_{3,\{3,4\}}, \end{cases} \quad (8K)$$

Repair Symbols Sent by Node 4:

$$\begin{cases} \mathcal{J} = \{1,4\}: \psi_{f,2}w_{4,\{1,2,4\}} + \psi_{f,3}w_{4,\{1,3,4\}} + \psi_{f,4}v_{4,\{1,4\}}, \\ \mathcal{J} = \{2,4\}: -\psi_{f,1}w_{4,\{1,2,4\}} + \psi_{f,3}w_{4,\{2,3,4\}} + \psi_{f,4}v_{4,\{2,4\}}, \\ \mathcal{J} = \{3,4\}: -\psi_{f,1}w_{4,\{1,3,4\}} - \psi_{f,2}w_{4,\{2,3,4\}} + \psi_{f,4}v_{4,\{3,4\}}. \end{cases} \quad (8L)$$

The repair symbols of helper node $h \in \{1,2,3,4\}$ in (25)-(28) could be obtain from $\Psi_h \cdot D \cdot \Xi^{f,(2)}$, which is the content of the helper nodes (i.e., $\Psi_h \cdot D$) times the repair encoder matrix for m=2 (i.e., $\Xi^{f,(2)}$) defined as:

$$\Xi^{f,(2)} = \begin{array}{c} \{1,2\} \\ \{1,3\} \\ \{1,4\} \\ \{2,3\} \\ \{2,4\} \\ \{3,4\} \end{array} \begin{bmatrix} \{1\} & \{2\} & \{3\} & \{4\} \\ \psi_{f,2} & -\psi_{f,1} & 0 & 0 \\ \psi_{f,3} & 0 & -\psi_{f,1} & 0 \\ \psi_{f,4} & 0 & 0 & -\psi_{f,1} \\ 0 & \psi_{f,3} & -\psi_{f,2} & 0 \\ 0 & \psi_{f,4} & 0 & -\psi_{f,2} \\ 0 & 0 & \psi_{f,4} & -\psi_{f,3} \end{bmatrix}$$

Note that, even though this matrix has $$\binom{4}{2-1} = 4$$

columns, and hence, $\Psi_h \cdot D \cdot \Xi^{f,(2)}$ is a vector of length 4, it suffices to communicate only $\beta=3$ symbols from the helper node to the failed node and the fourth symbol can be reconstructed from the other 3 symbols at the failed node. This is due to the fact that the rank of matrix $\Xi^{f,(2)}$ equals to $\beta=3$. More precisely, a non-zero linear combination of the columns of $\Xi^{f,(2)}$ is zero, that is, $$\Xi^{f,(2)} \cdot [\psi_{f,1}\psi_{f,2}\psi_{f,3}\psi_{f,4}]^T = 0. \quad (8M)$$

Therefore, (if $\psi_{f,4} \neq 0$) the helper node h only sends the first $\beta=3$ symbols of the vector $\Psi_h \cdot D \cdot \Xi^{f,(2)}$, namely, $[\Psi_h \cdot D \cdot \Xi^{f,(2)}]_1$, $[\Psi_h \cdot D \cdot \Xi^{f,(2)}]_2$, and $[\Psi_h \cdot D \cdot \Xi^{f,(2)}]_3$, and the forth symbol $[\Psi_h \cdot D \cdot \Xi^{f,(2)}]_4$ can be appended to it at node f from $$[\Psi_h \cdot D \cdot \Xi^{f,(2)}]_4 = \psi_{f,4}^{-1} \cdot \sum_{i=1}^{3} \psi_{f,i} \cdot [\Psi_h \cdot D \cdot \Xi^{f,(2)}]_i.$$

Upon receiving the repair data from d=4 helper nodes $\{1,2,3,4\}$, namely $\{\Psi_1 \cdot D \cdot \Xi^{f,(2)}, \Psi_2 \cdot D \cdot \Xi^{f,(2)}, \Psi_3 \cdot D \cdot \Xi^{f,(2)}, \Psi_4 \cdot D \cdot \Xi^{f,(2)}\}$, the failed can stack them to obtain a matrix $$\begin{bmatrix} \Psi_1 \cdot D \cdot \Xi^{f,(2)} \\ \Psi_2 \cdot D \cdot \Xi^{f,(2)} \\ \Psi_3 \cdot D \cdot \Xi^{f,(2)} \\ \Psi_4 \cdot D \cdot \Xi^{f,(2)} \end{bmatrix} = \Psi[\{1,2,3,4\}, :] \cdot D \cdot \Xi^{f,(2)} = D \cdot \Xi^{f,(2)}, \quad (8N)$$

where the last identity is due to the fact that $\Psi[\{1,2,3,4\}, :] = I$ is the identity matrix. The techniques described herein refer to this matrix by the repair space matrix of node f, and denote it by $R^{f,(2)} = D \cdot \Xi^{f,(2)}$ Using the entries of matrix $R^{f,(2)}$, the techniques described herein can reconstruct the missing coded symbols of the failed node, as formulated in (9). For the sake of illustration, let us focus on the symbol at the position $\mathcal{J}=\{2,4\}$ of node f. Recall that rows of matrix $R^{f,(2)}$ are indexed by numbers in $[d]=\{1,2,3,4\}$ and its columns are indexed by subsets of size m-1=1 of $[d]$. The $\mathcal{J}$-th symbol of node f can be found from a linear combination (with +1 and -1 coefficients) of entries of $R^{f,(2)}$ a positioned at row x and column $\mathcal{J} \setminus \{x\}$ for all $x \in \mathcal{J}$. The coefficients used in this linear combination is given by order of number x in set $\mathcal{J}$, e.g., x=2 is the first (smallest) element of $\mathcal{J}=\{2,4\}$, hence $\text{ind}_{\{2,4\}}(2)=1$, and the corresponding coefficient may be $(-1)^{\text{ind}_{\{2,4\}}(2)} = (-1)^1 = -1$. Putting things together, the techniques described herein obtain $$\sum_{x \in \{2,4\}} (-1)^{\text{ind}_{\{2,4\}}(x)} R^{f,(2)}_{x,\{2,4\}\setminus\{x\}} = -R^{f,(2)}_{2,\{4\}} + R^{f,(m)}_{4,\{2\}} \quad (8O)$$

$$= -\frac{[-\psi_{f,2}v_{2,\{2,4\}} - \psi_{f,1}w_{2,\{1,2,4\}} - \psi_{f,3}w_{2,\{2,3,4\}}]}{} +$$

$$[\psi_{f,4}v_{4,\{2,4\}} - \psi_{f,1}w_{4,\{1,2,4\}} + \psi_{f,3}w_{4,\{2,3,4\}}]$$

$$= \psi_{f,2}v_{2,\{2,4\}} + \psi_{f,4}v_{4,\{2,4\}} +$$

$$\psi_{f,1}(w_{2,\{1,2,4\}} - w_{4,\{1,2,4\}}) +$$

$$\psi_{f,3}(w_{2,\{2,3,4\}} + w_{4,\{2,3,4\}})$$

$$= \psi_{f,2}v_{2,\{2,4\}} + \psi_{f,4}v_{4,\{2,4\}} +$$

$$\psi_{f,1}w_{1,\{1,2,4\}} + \psi_{f,3}w_{2,\{2,3,4\}}$$

$$= [\Psi_3 \cdot D]_{\{2,4\}},$$

where in (8O) used the parity equations defined in (11). A general repair scenario with an arbitrary (not necessarily systematic) set of helper nodes $\mathcal{H}$ with $|\mathcal{H}|=d=4$ is very similar to that from the systematic nodes, explained above.

Each helper node $h \in \mathcal{H}$ computes its repair data by multiplying its content by the repair encoder matrix of failed node f, and sends it to the failed node. The failed node collects $\{\Psi_h \cdot D \cdot \Xi^{f,(2)}: h \in \mathcal{H}\}$ and stacks them to form the matrix $\Psi[\mathcal{H}, :] \cdot D \cdot \Xi^{f,(2)}$, where $\Psi[\mathcal{H}, :]$ is the sub-matrix of $\Psi$ obtained by stacking rows indexed by $\{h: h \in \mathcal{H}\}$. The main difference compared to the systematic helpers case is that unlike in (31), $\Psi[\mathcal{H}, :]$ is not an identity matrix in general. However, since $\Psi[\mathcal{H}, :]$ is an invertible matrix, the techniques described herein can compute $R^{f,(2)} = D \cdot \Xi^{f,(2)}$ as $$R^{f,(2)} = \Psi[\mathcal{H}, :]^{-1} \cdot (\Psi[\mathcal{H}, :] \cdot D \cdot \Xi^{f,(2)}) = D \cdot \Xi^{f,(2)}.$$

Once $R^{f,(2)}$ is computed at node f, the rest of the process is identical the repair from systematic helper nodes.

Symbol 1 = (8P)

$$-\frac{\psi_{f_1,2}}{\psi_{f_1,1}} \times \text{Symbol 2} - \frac{\psi_{f_1,3}}{\psi_{f_1,1}} \times \text{Symbol 3} - \frac{\psi_{f_1,4}}{\psi_{f_1,1}} \times \text{Symbol 4}$$

Symbol 5 = (8Q)

$$-\frac{\psi_{f_2,2}}{\psi_{f_2,1}} \times \text{Symbol 6} - \frac{\psi_{f_2,3}}{\psi_{f_2,1}} \times \text{Symbol 7} - \frac{\psi_{f_2,4}}{\psi_{f_2,1}} \times \text{Symbol 8}.$$

-continued $$\text{Symbol 8} = \frac{\psi_{f_2,1}(\psi_{f_1,1}\psi_{f_2,2} - \psi_{f_1,2}\psi_{f_2,1})}{\psi_{f_1,1}(\psi_{f_1,1}\psi_{f_2,4} - \psi_{f_1,4}\psi_{f_2,1})} \times \text{Symbol 2} + \quad (8R)$$

$$\frac{\psi_{f_2,1}(\psi_{f_1,1}\psi_{f_2,3} - \psi_{f_1,3}\psi_{f_2,1})}{\psi_{f_1,1}(\psi_{f_1,1}\psi_{f_2,4} - \psi_{f_1,4}\psi_{f_2,1})} \ldots \times \text{Symbol 3} +$$

$$\frac{\psi_{f_2,1}}{\psi_{f_1,1}}\text{Symbol 4} + \frac{\psi_{f_1,1}\psi_{f_2,2} - \psi_{f_1,2}\psi_{f_2,1}}{\psi_{f_1,4}\psi_{f_2,1} - \psi_{f_1,1}\psi_{f_2,4}} \ldots \times \text{Symbol 6} +$$

$$\frac{\psi_{f_1,1}\psi_{f_2,3} - \psi_{f_1,3}\psi_{f_2,1}}{\psi_{f_1,4}\psi_{f_2,1} - \psi_{f_1,1}\psi_{f_2,4}}\text{Symbol 7}$$

Now, assume two non-systematic nodes in $\mathcal{E} = \{f_1, f_2\}$ are simultaneously failed, and the goal is to reconstruct the missing data on $f_1$ and $f_2$ using the systematic nodes, i.e., the helper set is $\mathcal{H} = \{1,2,3,4\}$. A naive approach is to repeat the repair scenario for $f_1$ and $f_2$. Such a separation-based scheme requires downloading $2\beta=6$ (coded) symbols from each helper node. Alternatively, the techniques described herein show that the repair of nodes $f_1$ and $f_2$ can be performed by downloading only $\beta_2=5$ symbols from each helper.

The techniques described herein start with $\Xi^{\{f_1,f_2\},(2)}$ which is basically the concatenation of $\Xi^{f_1,(2)}$ and $\Xi^{f_2,(2)}$. This matrix is given in (22) below. This is a 6×8 matrix. However, the claim of Proposition 3 implies the rank of this matrix is at most 5. To show this claim, the techniques described herein define the non-zero vector $Y^{\mathcal{E},(2)}$ defined in (23) below and show that this vector is in the left null-space of $\Xi^{\{f_1,f_2\},(2)}$. The general construction of the null-space is presented in the proof of Proposition 3.

$$\Xi^{\mathcal{E},(2)} = [\Xi^{f_1,(2)} | \Xi^{f_2,(2)}] = \begin{array}{c} \\ \{1,2\} \\ \{1,3\} \\ \{1,4\} \\ \{2,3\} \\ \{2,4\} \\ \{3,4\} \end{array} \begin{bmatrix} \{1\} & \{2\} & \{3\} & \{4\} & \{1\} & \{2\} & \{3\} & \{4\} \\ \psi_{f_1,2} & -\psi_{f_1,1} & 0 & 0 & \psi_{f_2,2} & -\psi_{f_2,1} & 0 & 0 \\ \psi_{f_1,3} & 0 & -\psi_{f_1,1} & 0 & \psi_{f_2,3} & 0 & -\psi_{f_2,1} & 0 \\ \psi_{f_1,4} & 0 & 0 & -\psi_{f_1,1} & \psi_{f_2,4} & 0 & 0 & -\psi_{f_2,1} \\ 0 & \psi_{f_1,3} & -\psi_{f_1,2} & 0 & 0 & \psi_{f_2,3} & -\psi_{f_2,2} & 0 \\ 0 & \psi_{f_1,4} & 0 & -\psi_{f_1,2} & 0 & \psi_{f_2,4} & 0 & -\psi_{f_2,2} \\ 0 & 0 & \psi_{f_1,4} & -\psi_{f_1,3} & 0 & 0 & \psi_{f_2,4} & -\psi_{f_2,3} \end{bmatrix} \quad (22)$$

$$Y^{\mathcal{E},(2)} = \{3,4\} \left[ -\begin{vmatrix} \psi_{j_1,3} & \psi_{f_1,4} \\ \psi_{j_2,3} & \psi_{f_2,4} \end{vmatrix}^{\{1,2\}}, \begin{vmatrix} \psi_{j_1,2} & \psi_{f_1,4} \\ \psi_{j_2,1} & \psi_{f_2,4} \end{vmatrix}^{\{1,3\}}, -\begin{vmatrix} \psi_{f_1,2} & \psi_{f_1,3} \\ \psi_{f_2,2} & \psi_{f_2,3} \end{vmatrix}^{\{1,4\}}, \right.$$

$$\left. -\begin{vmatrix} \psi_{f_1,1} & \psi_{f_1,4} \\ \psi_{f_2,1} & \psi_{j_2,4} \end{vmatrix}^{\{2,3\}}, -\begin{vmatrix} \psi_{f_1,1} & \psi_{j_1,3} \\ \psi_{f_2,1} & \psi_{j_2,3} \end{vmatrix}^{\{2,4\}}, -\begin{vmatrix} \psi_{f_1,1} & \psi_{f_1,2} \\ \psi_{f_2,1} & \psi_{j_2,2} \end{vmatrix}^{\{3,4\}} \right]$$

$$= \{3,4\} \left[ \psi_{j_1,4}\psi_{f_2,3} - \psi_{f_1,3}\psi_{f_2,4}^{\{1,2\}}, \psi_{f_1,2}\psi_{f_2,4} - \psi_{f_1,4}\psi_{j_2,2}^{\{1,3\}}, \psi_{f_1,3}\psi_{f_2,2} - \psi_{j_1,2}\psi_{f_2,3}^{\{1,4\}}, \right.$$

$$\left. \psi_{j_1,4}\psi_{f_2,1} - \psi_{f_1,1}\psi_{f_2,4}^{\{2,3\}}, \psi_{f_1,1}\psi_{f_2,3} - \psi_{f_1,2}\psi_{j_2,1}^{\{2,4\}}, \psi_{f_1,2}\psi_{f_2,1} - \psi_{j_1,1}\psi_{f_2,2}^{\{3,4\}} \right] \quad (23)$$

First note that $Y^{\mathcal{E},(2)}$ is not an all-zero vector, otherwise $$\frac{\psi_{f_1,1}}{\psi_{f_2,1}} = \frac{\psi_{f_1,2}}{\psi_{f_2,2}} = \frac{\psi_{f_1,3}}{\psi_{f_2,3}} = \frac{\psi_{f_1,4}}{\psi_{f_2,4}},$$

which implies rows $\Psi_{f_1}$ and $\Psi_{f_2}$ of the encoder matrix are linearly dependent. This is in contradiction with the fact that every d=4 rows of $\Psi$ are linearly independent. Hence, without loss of generality, $$\begin{vmatrix} \psi_{f_1,1} & \psi_{f_1,4} \\ \psi_{f_2,1} & \psi_{f_2,4} \end{vmatrix} \neq 0.$$

In order to prove $$Y^{\mathcal{E},(2)} \cdot \Xi^{\mathcal{E},(2)} = 0$$

the techniques described herein show that vector $Y^{\mathcal{E},(2)}$ is orthogonal to each column of $\Xi^{\mathcal{E},(2)}$. For instance, consider the seventh column of $\Xi^{\mathcal{E},(2)}$, labeled by {3} in segment $\Xi^{f_2,(2)}$. The inner product of $Y^{\mathcal{E},(2)}$ and this column is given by $$-\psi_{f_2,1}\begin{vmatrix}\psi_{f_1,2}&\psi_{f_1,4}\\\psi_{f_2,2}&\psi_{f_2,4}\end{vmatrix}+\psi_{f_2,2}\begin{vmatrix}\psi_{f_1,1}&\psi_{f_1,4}\\\psi_{f_2,1}&\psi_{f_2,4}\end{vmatrix}-\psi_{f_2,4}\begin{vmatrix}\psi_{f_1,1}&\psi_{f_1,2}\\\psi_{f_2,1}&\psi_{f_2,2}\end{vmatrix} =$$

$$-\begin{vmatrix}\psi_{f_2,1}&\psi_{f_2,2}&\psi_{f_2,4}\\\psi_{f_1,1}&\psi_{f_1,2}&\psi_{f_1,4}\\\psi_{f_2,1}&\psi_{f_2,2}&\psi_{f_2,4}\end{vmatrix}=0,$$

where the first equality follows from the Laplace expansion of the determinant with respect to the first row, and the second equality is due to the fact that the first and third rows of the matrix are identical, and hence it is rank-deficient. The existence of a non-zero vector in the left null-space of $\Xi^{\mathcal{E},(2)}$ implies its rank is at most $\beta_2^{(2)}=5$.

Now, assume h=1 is one of the helper nodes. Without loss of generality, the techniques described herein assume $\psi_{f_1,1} \neq 0$ and $\psi_{f_2,1} \neq 0$. The repair data sent by node 1, i.e., $\Psi_1 \cdot D \cdot \Xi^{\mathcal{E},(2)}$, has the following 8 symbols $$\begin{cases} \text{Symbol 1: } \psi_{f_1,2}v_{1,\{1,2\}} + \psi_{f_1,3}v_{1,\{1,3\}} + \psi_{f_1,4}v_{1,\{1,4\}}, \\ \text{Symbol 2: } -\psi_{f_1,1}v_{1,\{1,2\}} + \psi_{f_1,3}w_{1,\{1,2,3\}} + \psi_{f_1,4}w_{1,\{1,2,4\}}, \\ \text{Symbol 3: } -\psi_{f_1,1}v_{1,\{1,3\}} - \psi_{f_1,2}w_{1,\{1,2,3\}} + \psi_{f_1,4}w_{1,\{1,3,4\}}, \\ \text{Symbol 4: } -\psi_{f_1,1}v_{1,\{1,4\}} - \psi_{f_1,2}w_{1,\{1,2,4\}} - \psi_{f_1,3}w_{1,\{1,3,4\}} \\ \text{Symbol 5: } \psi_{f_2,2}v_{1,\{1,2\}} + \psi_{f_2,3}v_{1,\{1,3\}} + \psi_{f_2,4}v_{1,\{1,4\}}, \\ \text{Symbol 6: } -\psi_{f_2,1}v_{1,\{1,2\}} + \psi_{f_2,3}w_{1,\{1,2,3\}} + \psi_{f_2,4}w_{1,\{1,2,4\}}, \\ \text{Symbol 7: } -\psi_{f_2,1}v_{1,\{1,3\}} - \psi_{f_2,2}w_{1,\{1,2,3\}} + \psi_{f_2,4}w_{1,\{1,3,4\}}, \\ \text{Symbol 8: } -\psi_{f_2,1}v_{1,\{1,4\}} - \psi_{f_2,2}w_{1,\{1,2,4\}} - \psi_{f_2,3}w_{1,\{1,3,4\}}, \end{cases} \quad (8R)$$

However, Symbol 1, Symbol 5, and Symbol 8 are redundant, and can be reconstructed as linear combinations of the remaining five symbols. It is worth noting that the first and second equations above indicate the dependencies between symbols that are sent for the repair of $f_1$ and $f_2$, respectively. The third equation, however, shows an additional dependency across the repair symbols $f_1$ and and those of $f_2$. This implies that it suffices for the helper node 1 to send symbols 2, 3, 4, 6, and 7 in to repair two nodes $f_1$ and $f_2$, simultaneously.

Next, the techniques described herein review data recovery and exact repair properties for signed determinant codes.

Proposition 1: In a (d; m) signed determinant code, all the data symbols can be recovered from the content of any k=d nodes.

The proof of this proposition is similar to that of Proposition 1, and hence omitted for the sake of brevity.

Consider the repair process of a failed node f∈[n] from an arbitrary set $\mathcal{H}$ of $|\mathcal{H}|$=d helpers. The repair-encoder matrix for a (d; m) signed determinant code is defined below.

Definition 1: For a (d; m) signed determinant code with signature $\sigma$, and a failed node f∈[n], the repair-encoder matrix $\Xi^{f,(m)}$ is defined as $$a\binom{d}{m} \times \binom{d}{m-1} \text{ matrix}$$

whose rows are labeled by m-element subsets of [d] and columns are labeled by (m−1)-element subsets of [d]. The element in row $\mathcal{J}$ and column $\mathcal{J}$ of this matrix is given by $$\Xi_{i,j}^{f,(m)} = \begin{cases} (-1)^{\sigma(x)+\text{ind}_{\mathcal{J}}(x)} \psi_{f,x} & \text{if } \mathcal{J}\backslash\mathcal{J} = \{x\}, \\ 0 & \text{otherwise} \end{cases} \quad (9)$$

Here $\sigma(x)$'s are the same signature used in (8).

In order to repair node f, each helper node h∈$\mathcal{H}$ multiplies its content $\Psi_h \cdot D$ by the repair-encoder matrix of node f to obtain $\Psi_h \cdot D \cdot \Xi^{f,(m)}$, and sends the result to node f. Upon receiving d vectors $\{\Psi_h \cdot D \cdot \Xi^{f,(m)}: h \in \mathcal{H}\}$ and stacking them into a matrix, the failed node obtains $\Psi_{\mathcal{H}} \cdot D \cdot \Xi^{f,(m)}$, where $\Psi_{\mathcal{H}}$ is a full-rank sub-matrix of $\Psi$, obtained from stacking rows indexed by h∈$\mathcal{H}$. Multiplying by $\Psi_{\mathcal{H}}^{-1}$, the failed node retrieves $$R^f(D) = D \cdot \Xi^{f,(m)}, \quad (10)$$

which is called the repair space of node f. All the coded symbols in node f can be recovered from its repair space as described in the following proposition.

Proposition 2: The coded symbol in column $\mathcal{J}$ of node f can be recovered from $$[\Psi_f \cdot D]_{\mathcal{J}} = \sum_{x \in \mathcal{J}} (-1)^{\sigma_D(x)+\text{ind}_{\mathcal{J}}(x)} [R^f(D)]_{x,\mathcal{J}\backslash\{x\}}. \quad (11)$$

This proposition is very similar to Proposition 2. However, due to modification introduced here, the techniques described herein present the proof of the current proposition below.

The required repair-bandwidth of this repair scheme is given below.

Proposition 3: The matrix $\Xi^{f,(m)}$ defined in (9) has rank $$\beta_m = \binom{d-1}{m-1}.$$

Therefore, even though the number of entries in vector $\Psi_h \cdot D \cdot \Xi^{f,(m)}$ is $\binom{d}{m-1}$, it can be fully sent to the failed node by communicating only $$\beta_m = \binom{d-1}{m-1}$$

symbols in $\mathbb{F}_q$.

Remark 2: Note that a signed determinant code can be defined over any Galois field. In particular, for a code designed over $GF(2^S)$ with characteristic 2, the techniques described herein have $-1=+1$, and hence, all the positive and negative signs disappear. Especially, the signs in (8) can be removed and the parity equation in (7) may simply reduce to $\sum_{y \in \mathcal{I}} w_{y,\mathcal{I}} = 0$. Also, the non-zero entries of the repair encoder matrix in (9) may be $\psi_{f,x}$, and the repair equation in (26) may be replaced by $$[\Psi_f \cdot S]_{\mathcal{J}} = \sum_{x \in \mathcal{J}} [R^f(D)]_{x, \mathcal{J} \setminus \{x\}}.$$

In this section, the techniques described herein present a simple example, through which the techniques described herein explain the core idea of this code construction. More precisely, the techniques described herein show how cascading several signed determinant codes allows us to break the constraint k=d of the signed determinant codes.

The techniques described herein consider a code with parameters (n=6, k=3, d=4) corresponding to mode $\mu$=3. Therefore, from (3) the parameters of this code are given by $(\alpha, \beta, F)=(8,4,24)$. To construct such a code, the techniques described herein start by an (n'=n=6, k'=d=4, d'=d=4) signed determinant code of mode m=$\mu$=3 with an all-zero signature. The message matrix for this code is given by $$P = \begin{array}{c} \\ 1 \\ 2 \\ 3 \\ 4 \end{array} \begin{bmatrix} \{1,2,3\} & \{1,2,4\} & \{1,3,4\} & \{2,3,4\} \\ v_{1,\{1,2,3\}}^{<0>} & v_{1,\{1,2,4\}}^{<0>} & v_{1,\{1,3,4\}}^{<0>} & w_{1,\{1,2,3,4\}}^{<0>} \\ v_{2,\{1,2,3\}}^{<0>} & v_{2,\{1,2,4\}}^{<0>} & w_{2,\{1,2,3,4\}}^{<0>} & v_{2,\{2,3,4\}}^{<0>} \\ v_{3,\{1,2,3\}}^{<0>} & w_{3,\{1,2,3,4\}}^{<0>} & v_{3,\{1,3,4\}}^{<0>} & v_{3,\{2,3,4\}}^{<0>} \\ w_{4,\{1,2,3,4\}}^{<0>} & v_{4,\{1,2,4\}}^{<0>} & v_{4,\{1,3,4\}}^{<0>} & v_{4,\{2,3,4\}}^{<0>} \end{bmatrix}$$

Here, the superscript <0> is used to distinguish between the entries of this matrix and another message matrix which may be introduced in the following.

Let us consider a semi-systematic encoder matrix $\Psi$ with n=n'=6 rows. Existence of such semi-systematic encoders with the desired properties is shown.

$$\Psi_{6 \times 4} = \begin{bmatrix} 1 & 0 & 0 & 0 \\ 0 & 1 & 0 & 0 \\ 0 & 0 & 1 & 0 \\ \psi_{4,1} & \psi_{4,2} & \psi_{4,3} & \psi_{4,4} \\ \psi_{5,1} & \psi_{5,2} & \psi_{5,3} & \psi_{5,4} \\ \psi_{6,1} & \psi_{6,2} & \psi_{6,3} & \psi_{6,4} \end{bmatrix}.$$

The repair space of this code is given by $$\Psi_{6 \times 4} = \begin{bmatrix} 1 & 0 & 0 & 0 \\ 0 & 1 & 0 & 0 \\ 0 & 0 & 1 & 0 \\ \psi_{4,1} & \psi_{4,2} & \psi_{4,3} & \psi_{4,4} \\ \psi_{5,1} & \psi_{5,2} & \psi_{5,3} & \psi_{5,4} \\ \psi_{6,1} & \psi_{6,2} & \psi_{6,3} & \psi_{6,4} \end{bmatrix}$$

It is easy to see that the content of the failed node can be recovered as linear combinations of entries of $R^f(P)$, since d=d'=4. For instance, the entry $\mathcal{J} = \{1,3,4\}$ of the P-segment of a failed node f is repaired using the equation (11) that is $$[\Psi_f \cdot P]_{\{1,3,4\}} = \sum_{x \in \{1,3,4\}} (-1)^{ind_{\{1,3,4\}}(x)} [R^{f,(4)}(P)]_{x,\{1,3,4\} \setminus \{x\}}$$

$$= -(-v_{1,\{1,3,4\}}^{<0>} \psi_{f,1} - w_{1,\{1,2,3,4\}}^{<0>} \psi_{f,2}) +$$

$$(v_{3,\{1,3,4\}}^{<0>} \psi_{f,3} + w_{3,\{1,2,3,4\}}^{<0>} \psi_{f,2}) -$$

$$(w_{4,\{1,2,3,4\}}^{<0>} \psi_{f,2} - v_{4,\{1,3,4\}}^{<0>} \psi_{f,4})$$

$$= v_{1,\{1,3,4\}}^{<0>} \psi_{f,1} + v_{3,\{1,3,4\}}^{<0>} \psi_{f,3} + v_{4,\{1,3,4\}}^{<0>} \psi_{f,4} +$$

$$(w_{1,\{1,2,3,4\}}^{<0>} + w_{3,\{1,2,3,4\}}^{<0>} - w_{4,\{1,2,3,4\}}^{<0>}) \psi_{f,2}$$

$$= v_{1,\{1,3,4\}}^{<0>} \psi_{f,1} + v_{3,\{1,3,4\}}^{<0>} \psi_{f,3} +$$

$$v_{4,\{1,3,4\}}^{<0>} \psi_{f,4} + w_{2,\{1,2,3,4\}}^{<0>} \psi_{f,2}$$

Moreover, the code generated by P maintains data recovery from any k'=4 nodes. The question is what happens if the data collector can only access k=3 nodes.

Let us consider the data recovery from the first k=3 systematic nodes (instead of k'=4 nodes). The contents of the systematic node i is identical to the corresponding rows i of P, for i=1,2,3. Therefore, the data collector accessing nodes in $\mathcal{K}$ {1,2,3} cannot recover the four symbols in the last row of P. Note that symbol $w_{4,\{1,2,3,4\}}^{<0>}$ is a parity symbol, and can be still recovered from observed symbols $w_{1,\{1,2,3,4\}}^{<0>}$, $w_{2,\{1,2,3,4\}}^{<0>}$, $w_{3,\{1,2,3,4\}}^{<0>}$, through the parity equation in (7):

$$w_{4,\{1,2,3,4\}}^{<0>} = w_{1,\{1,2,3,4\}}^{<0>} - w_{2,\{1,2,3,4\}}^{<0>} + w_{3,\{1,2,3,4\}}^{<0>}.$$

However, the other three symbols $v_{4,\{1,2,4\}}^{<0>}$, $v_{4,\{1,3,4\}}^{<0>}$, $v_{4,\{2,3,4\}}^{<0>}$ cannot be recovered by the data collector.

In order to recover these missing symbols, the techniques described herein use another signed determinant code (with a lower mode), and use its parity entries to keep a backup copy for each of the missing symbols. The process of copying the missing symbols to the parity entries of another message matrix is called injection throughout this disclosure. Injection simply means adding a symbol to the entry of massage matrix that contains a parity symbol. The techniques described herein also refer to the message matrix to which injection happens as the child node of the injection. Similarly, the message matrix whose symbols are injected is called the parent code of the injection. In this example, the child code is of mode m=1 and an all-zero signature $\sigma_Q$= (0,0,0,0), whose message matrix is given by $$Q = \begin{array}{c} \\ 1 \\ 2 \\ 3 \\ 4 \end{array} \begin{array}{cccc} \{1\} & \{2\} & \{3\} & \{4\} \\ \left[ \begin{array}{cccc} v_{1,\{1\}}^{<1>} & w_{1,\{1,2\}}^{<1>} & w_{1,\{1,3\}}^{<1>} & w_{1,\{1,4\}}^{<1>} \\ w_{2,\{1,2\}}^{<1>} & v_{2,\{2\}}^{<1>} & w_{2,\{2,3\}}^{<1>} & w_{2,\{2,4\}}^{<1>} \\ w_{3,\{1,3\}}^{<1>} & w_{3,\{2,3\}}^{<1>} & v_{3,\{3\}}^{<1>} & w_{3,\{3,4\}}^{<1>} \\ \hline w_{4,\{1,4\}}^{<1>} & w_{4,\{2,4\}}^{<1>} & w_{4,\{3,4\}}^{<1>} & v_{4,\{4\}}^{<1>} \end{array} \right] \end{array}$$

Note that there are three redundant symbols in the top three rows of the Q, since the parity equation in (7) implies $$w_{2,\{1,2\}}^{<1>} = w_{1,\{1,2\}}^{<1>},$$

$$w_{3,\{1,3\}}^{<1>} = w_{1,\{1,3\}}^{<1>},$$

$$w_{3,\{2,3\}}^{<1>} = w_{2,\{2,3\}}^{<1>}.$$

hence, the techniques described herein can use these redundant symbols to backup the missing symbols of P. The techniques described herein denote the modified version of the message matrix Q by Q. Concatenating P and Q results in a super-message matrix:

$$M = [P|Q] = \begin{array}{c} 1 \\ 2 \\ 3 \\ 4 \end{array} \left[ \begin{array}{cccc|cccc} \{1,2,3\} & \{1,2,4\} & \{1,3,4\} & \{2,3,4\} & \{1\} & \{2\} & \{3\} & \{4\} \\ v_{1,\{1,2,3\}}^{<0>} & v_{1,\{1,2,4\}}^{<0>} & v_{1,\{1,3,4\}}^{<0>} & w_{1,\{1,2,3,4\}}^{<0>} & \cdots \cdots & v_{1,\{1\}}^{<1>} & w_{1,\{1,2\}}^{<1>} & w_{1,\{1,3\}}^{<1>} & w_{1,\{1,4\}}^{<1>} \\ v_{2,\{1,2,3\}}^{<0>} & v_{2,\{1,2,4\}}^{<0>} & w_{2,\{1,2,3,4\}}^{<0>} & v_{2,\{2,3,4\}}^{<0>} & \cdots \cdots & w_{2,\{1,2\}}^{<1>}+A & v_{2,\{2\}}^{<1>} & w_{2,\{2,3\}}^{<1>} & w_{2,\{2,4\}}^{<1>} \\ v_{3,\{1,2,3\}}^{<0>} & w_{3,\{1,2,3,4\}}^{<0>} & v_{3,\{1,3,4\}}^{<0>} & v_{3,\{2,3,4\}}^{<0>} & \cdots \cdots & w_{3,\{1,3\}}^{<1>}+B & w_{3,\{2,3\}}^{<1>}+C & v_{3,\{3\}}^{<1>} & w_{3,\{3,4\}}^{<1>} \\ w_{4,\{1,2,3,4\}}^{<0>} & v_{4,\{1,2,4\}}^{<0>} & v_{4,\{1,3,4\}}^{<0>} & v_{4,\{2,3,4\}}^{<0>} & \cdots \cdots & w_{4,\{1,4\}}^{<1>} & w_{4,\{2,4\}}^{<1>} & w_{4,\{3,4\}}^{<1>} & v_{4,\{4\}}^{<1>} \end{array} \right]$$

where A, B, and C may be determined such that the missing symbols $v_{4,\{1,2,4\}}^{<0>}$, $v_{4,\{1,3,4\}}^{<0>}$, $v_{4,\{2,3,4\}}^{<0>}$ can be fully retrieved from (A, B, C). Note that with this modification, the recovery problem (from the first k=3 nodes) may be resolved.

Now, consider a failed node f. Note that before the injection, each entry $[\Psi_f \cdot Q]$ could be recovered from the repair space $R^f(Q)$, given by It is easy to verify that using Equation (11) the repair of entry $\mathcal{J} = \{x\}$ of the child code is given by (12)

$$R^f(Q) = \begin{array}{c} 1 \\ 2 \\ 3 \\ 4 \end{array} \left[ \begin{array}{cccc} -v_{1,\{1\}}^{<1>}\psi_{f,1} & -w_{1,\{1,2\}}^{<1>}\psi_{f,2} & -w_{1,\{1,3\}}^{<1>}\psi_{f,3} & -w_{1,\{1,4\}}^{<1>}\psi_{f,4} \\ -w_{2,\{1,2\}}^{<1>}\psi_{f,1} & -v_{2,\{2\}}^{<1>}\psi_{f,2} & -w_{2,\{2,3\}}^{<1>}\psi_{f,3} & -w_{2,\{2,4\}}^{<1>}\psi_{f,4} \\ -w_{3,\{1,3\}}^{<1>}\psi_{f,1} & -w_{3,\{2,3\}}^{<1>}\psi_{f,2} & -v_{3,\{3\}}^{<1>}\psi_{f,3} & -w_{3,\{3,4\}}^{<1>}\psi_{f,4} \\ -w_{4,\{1,4\}}^{<1>}\psi_{f,1} & -w_{4,\{2,4\}}^{<1>}\psi_{f,2} & -w_{4,\{3,4\}}^{<1>}\psi_{f,3} & -v_{4,\{4\}}^{<1>}\psi_{f,4} \end{array} \right]$$

$$[\Psi_f \cdot Q]_{\mathcal{J}} = \sum_{x \in \mathcal{J}} (-1)^{ind_{\mathcal{J}}(x)} [R^f(Q)]_{x,\mathcal{J}\setminus\{x\}} = -[R^f(Q)]_{x,\emptyset}$$

However, after this modification, the child code Q is not a signed determinant code anymore, and the exact repair property may fail. The four coded symbols corresponding to the Q segment of a failed node f are given by $$\begin{cases} \{1\}: \psi_{f,1} v_{1,\{1\}}^{<1>} + \psi_{f,2}(w_{2,\{1,2\}}^{<1>}+A) + \psi_{f,3}(w_{3,\{1,3\}}^{<1>}+B) + \psi_{f,4} w_{4,\{1,4\}}^{<1>} \\ \{2\}: \psi_{f,2} v_{2,\{2\}}^{<1>} + \psi_{f,1} w_{1,\{1,2\}}^{<1>} + \psi_{f,3}(w_{3,\{2,3\}}^{<1>}+C) + \psi_{f,4} w_{4,\{2,4\}}^{<1>} \\ \{3\}: \psi_{f,3} v_{3,\{3\}}^{<1>} + \psi_{f,1} w_{1,\{1,3\}}^{<1>} + \psi_{f,2} w_{2,\{2,3\}}^{<1>} + \psi_{f,4} w_{4,\{3,4\}}^{<1>} \\ \{4\}: \psi_{f,4} v_{4,\{4\}}^{<1>} + \psi_{f,1} w_{1,\{1,4\}}^{<1>} + \psi_{f,2}(w_{2,\{2,4\}}^{<1>}) + \psi_{f,3} w_{3,\{3,4\}}^{<1>}. \end{cases}$$

On the other hand, the repair space of the failed node for the modified code Q, i.e., $R^f(Q)=Q\cdot\Xi^{f,(1)}$, is given by $$R^f(Q) = \begin{array}{c} 1 \\ 2 \\ 3 \\ 4 \end{array} \left[ \begin{array}{c} -v_{1,\{1\}}^{<1>}\psi_{f,1} - w_{1,\{1,2\}}^{<1>}\psi_{f,2} - w_{1,\{1,3\}}^{<1>}\psi_{f,3} - w_{1,\{1,4\}}^{<1>}\psi_{f,4} \\ -(w_{2,\{1,2\}}^{<1>}+A)\psi_{f,1} - v_{2,\{2\}}^{<1>}\psi_{f,2} - w_{2,\{2,3\}}^{<1>}\psi_{f,3} - w_{2,\{2,4\}}^{<1>}\psi_{f,4} \\ -(w_{3,\{1,3\}}^{<1>}+B)\psi_{f,1} - (w_{3,\{2,3\}}^{<1>}+C)\psi_{f,2} - v_{3,\{3\}}^{<1>}\psi_{f,3} - w_{3,\{3,4\}}^{<1>}\psi_{f,4} \\ -w_{4,\{1,4\}}^{<1>}\psi_{f,1} - w_{4,\{2,4\}}^{<1>}\psi_{f,2} - w_{4,\{3,4\}}^{<1>}\psi_{f,3} - v_{4,\{4\}}^{<1>}\psi_{f,4} \end{array} \right]$$

Comparing the symbols of the failed node against the entries of the repair space, it turns out that only $[\Psi_f\cdot Q]_{\{4\}}$ can be found from $-[R^f(Q)]_{4,\emptyset}$, while there is a mismatch for the other three symbols, due to injections of A, B, and C. Let us compare $[\Psi_f\cdot Q]_{\{1\}}$ and $-[R^f(Q)]_{1,\emptyset}$. Their difference is given by $$[\Psi_f\cdot Q]_{\{1\}}+[R^f(Q)]_{1,\emptyset}=\psi_{f,2}A+\psi_{f,3}B. \quad (14)$$

Note that by setting $$A=v_{4,\{1,2,4\}}^{<0>}, B=v_{4,\{1,3,4\}}^{<0>}, C=v_{4,\{2,3,4\}}^{<0>}$$

this difference reduces to $\psi_{f,2}v_{4,\{1,2,4\}}^{<0>}+\psi_{f,3}v_{4,\{1,3,4\}}^{<0>}$, which is exactly the entry at position $(4,\{1,4\})$ of $R^f(P)$, the repair space of the parent code. That is, the missing symbol of the failed node in its Q segment can be retrieved using the repair space of Q and P. It is easy to check that with the same assignment of A, B, and C given in (14), all the four symbols of the failed node in its Q segment can be recovered through $$[\Psi_f\cdot Q]_{\{1\}}=-[R^f(Q)]_{1,\emptyset}+[R^f(P)]_{4,\{1,4\}},$$

$$[\Psi_f\cdot Q]_{\{2\}}=-[R^f(Q)]_{2,\emptyset}+[R^f(P)]_{4,\{2,4\}},$$

$$[\Psi_f\cdot Q]_{\{3\}}=-[R^f(Q)]_{3,\emptyset}+[R^f(P)]_{4,\{3,4\}},$$

$$[\Psi_f\cdot Q]_{\{4\}}=-[R^f(Q)]_{4,\emptyset}.$$

In summary, this example showed that (1) for a system with k<d, the data recovery of the (signed) determinant codes fails; (2) the shortcoming in data recovery can be fixed by concatenating new determinant code (called the child code) with the original one (called the parent code), and providing a backup copy for the missing symbols; this may not only fix the data recovery from the systematic nodes, but also for any set of k nodes access by the data collector; (3) the usual repair of the child code may fail due to the injected symbols; and finally (4) this repair can be also fixed by the help of the repair space of the parent code.

In this section, the techniques described herein describe the construction for an (n, k, d) exact-regenerating code. There are k different regenerating codes for a distributed storage system with parameters (n, k, d), operating at different storage vs. repair bandwidth trade-off. The techniques described herein enumerate them by a parameter $\mu \in \{1, 2, \ldots, k\}$, which is called the mode of the code. The general framework to construct an (n, k, d; $\mu$) exact-regenerating code is to start with a determinant code with parameters (n'=n; k'=d, d'=d; m=y) (or simply a (d; $\mu$) determinant code), and modify it to an (n, k, d; $\mu$) code for a given k<d.

Consider a (d; $\mu$) determinant code with encoder matrix $\Psi$ and message matrix D. Without loss of generality, the techniques described herein can assume the code is semi-systematic, i.e., $\Psi$ has an identity matrix at its top k rows (see Definition 4), and thus the content of node $i \in [k]$ is the same as the i-th row of the matrix D. From Proposition 1, data recovery can be performed from any k'=d nodes. Now, let k<d be a given parameter, and consider an attempt for data recovery from the first k nodes. It is clear that some symbol in rows [k+1: d] of matrix D cannot be recovered, since they do not appear in the content of the first k nodes. The techniques described herein refer to such symbols as missing symbols. The main idea to overcome this limitation is to protect such missing symbols in data recovery, by providing a backup copy of them in the top k rows. The main challenge is to introduce such backup copies such that they do not demolish the repair process.

Figure 5:
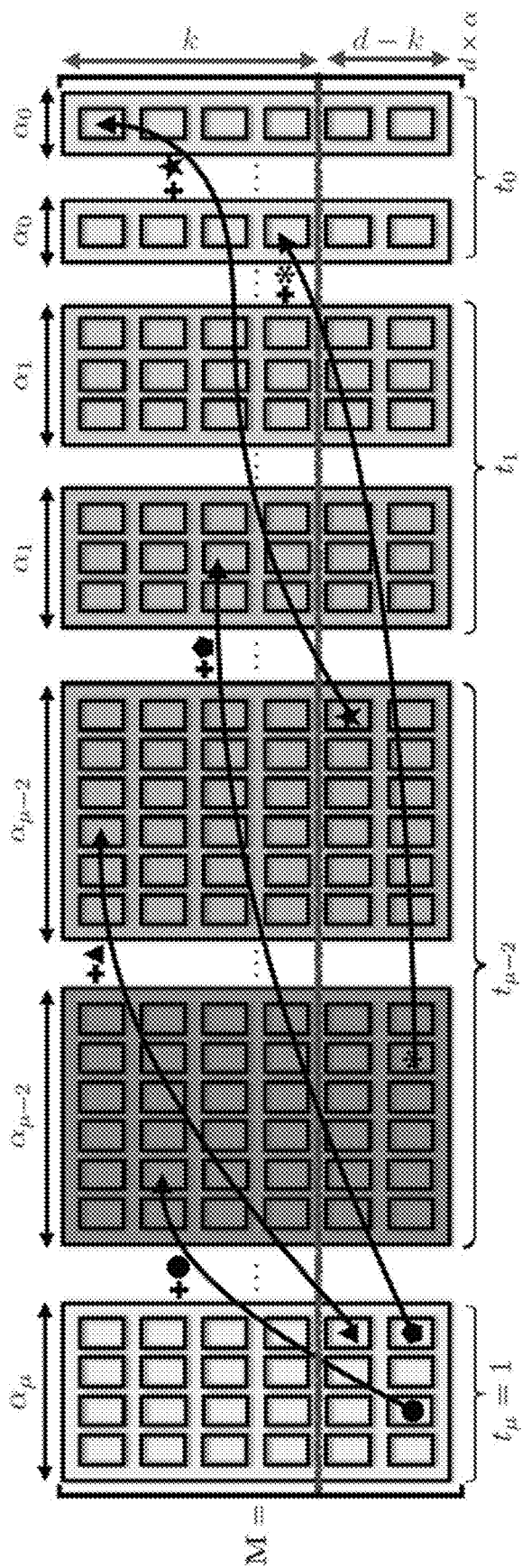
FIG. 5 is a conceptual diagram illustrating an example cascading of determinant codes, in accordance with the techniques described herein.

FIG. 5 is a conceptual diagram illustrating cascading of determinant codes, in accordance with the techniques described herein.

In this figure, every rectangle represents the message matrix of one determinant code, and $t_m$ denotes the number of message matrices of mode m, for $m \in \{0, 1, \ldots, \mu\}$. The message matrix at mode m is of size $d \times \alpha_m$, where $$\alpha_m = \binom{d}{m}.$$

These message matrices are placed from the highest mode to the lowest mode. The leftmost message matrix corresponds to the root of the cascade code with mode m=$\mu$. The rightmost message matrices have either a mode of m=1 or m=0. In the message matrices M, some of the symbols in the bottom d−k rows are missing. These missing symbols are backed up by begin injected (adding with a sign) into the parity symbols located at the top k rows of other determinant codes with lower modes. Injections are demonstrated by arrows from a symbol in the parent matrix to a parity symbol in the child matrix.

To this end, the techniques described herein use multiple instances of (d; m) determinant codes with different modes $m \in \{0, 1, \ldots, \mu\}$, and concatenate their message matrices to obtain a super-message matrix, as shown in FIG. 5. This super-message matrix then may be multiplied (from left) by an encoder matrix $\Psi$ to generate the node contents. Therefore, the codewords (the content of the nodes) may be also a concatenation of the codewords of the determinant codes used as building blocks. Recall that there are redundant symbols (see the parity equation in (7)) in each message matrix used in the concatenation. While such redundant symbols play a critical role in the repair process, they have no contribution in the data recovery. The main purpose of concatenating codes is to utilize such redundant symbols to store a backup copy of the missing symbols in the lower (d−k) rows. More precisely, the techniques described herein inject (add to the existing symbol) a missing symbol from the bottom (d−k) rows of a code matrix at mode $m_1$ (on outer code or parent code) to a parity symbol in top k rows of another code matrix at mode $m_2$ (in inner code or child code), where $m_2 < m_1$. However, the missing symbols of the inner code with mode $m_2$ may be also backed up by injection into another code with lower mode $m_3 < m_2$. This leads to a cascade of determinant codes. The details of cascading are discussed in the following sections.

Definition 2: The encoder matrix $\Psi$ for a code with parameters (n, k, d) is defined as an n×d matrix $$\Psi_{n \times d} = [\Gamma_{n \times k} | Y_{n \times (d-k)}],$$

such that any k rows of $\Gamma$ are linearly independent; and any d rows of $\Psi$ are linearly independent.

Note that Vandermonde matrices satisfy both properties. Similar to determinant codes, the super-message matrix of the cascade codes may be multiplied (from left) by an encoder matrix to generate the encoded content of the nodes.

The techniques described herein describe the construction of the super-message matrix in this section. As mentioned before, M can be obtained in two stages, namely, Concatenating several determinant codes, including $t_m$ copies of the codes of mode m, for $m \in \{0, 1, \ldots, \mu\}$. The values of $t_m$'s are determined later as given in (33);

Injecting the missing symbols at the bottom (d−k) rows of a code at mode j (the parent code) to the parity symbols at the top k rows of a code at mode m (a child code), where m<j.

The techniques described herein refer to the determinant code message matrices used in a super-message matrix as code segments. Similarly, the codewords comprise of multiple codeword segment, each corresponding to one code segment. Each code segment at mode m is originally a determinant code at mode m, namely $D^{(m)}$. The techniques described herein start with a root code, which is a determinant code with parameters (d; $\mu$), and in each stage introduce other determinant codes with a lower mode, into which injection is performed. The ultimate super-message matrix may be obtained by concatenating all such injected message matrices of determinant codes.

The details of symbol injection are discussed in this section. The missing symbols at the lower (d−k) rows of a determinant code segment may be treated differently.

Definition 3: Consider an (n, d, d; j) determinant code at mode j with message matrix P. Recall from (6) that symbols in P are of the forms either $v_{x,x}$ with $|\mathcal{X}|=j$ or $\mathcal{Y}$ with $|\mathcal{Y}|=j+1$. Therefore, the symbols in $\underline{P}$ (lower (d−k) rows of P can be divided into four groups:

$$\mathcal{G}_1(P) = \{\pm v_{x,\mathcal{X}} : x \in \underline{\mathcal{X}}, \overline{\mathcal{X}} = \varnothing\} \cup \{\pm w_{x,\mathcal{Y}} : x \in \underline{\mathcal{Y}}, \overline{\mathcal{Y}} = \varnothing\} =$$

$$\{P_{x,\mathcal{X}} : \mathcal{X} \subseteq [k+1:d]\}, \cdot \mathcal{G}_2(P) =$$

$$\{\pm w_{x,\mathcal{Y}} : x \in \underline{\mathcal{Y}}, \overline{\mathcal{Y}} \neq \varnothing, \mathrm{ind}_{\mathcal{Y}}(x) = j + 1\} =$$

$$\{P_{x,\mathcal{X}} : \mathcal{X} \not\subseteq [k+1:d], x > \max\mathcal{X}\},$$

$$\mathcal{G}_3(P) = \{\pm v_{x,\mathcal{X}} : x \in \underline{\mathcal{X}}, \overline{\mathcal{X}} = \varnothing\} = \{P_{x,\mathcal{X}} : \mathcal{X} \not\subseteq [k+1:d], x \in \mathcal{X}\},$$

$$\mathcal{G}_4(P) = \{\pm w_{x,\mathcal{Y}} : x \in \underline{\mathcal{Y}}, \overline{\mathcal{Y}} \neq \varnothing, \mathrm{ind}_{\mathcal{Y}}(x) < j + 1\} =$$

$$\{P_{x,\mathcal{X}} : \mathcal{X} \not\subseteq [k+1:d], x \notin \mathcal{X}, x < \max\mathcal{X}\}.$$

The techniques described herein treat symbols in the above-mentioned four groups as follows:

Symbols in $\mathcal{G}_1(P)$ may be set to zero (nulled). This yields a reduction in $F_j$, the number of data symbols stored in the code segment.

Symbols in $\mathcal{G}_2(P)$ are essentially parity symbols and can be recovered from the symbols in $\overline{P}$ and the parity equation (7). Therefore, the techniques described herein do not need to protect them by injection.

Each symbol in $\mathcal{G}_3(P) \cup \mathcal{G}_4(P)$ may be injected into a redundant parity symbol in the top k rows of the message matrix of a determinant code with lower modes. Those codes used for injection are called child codes of P.

Remark 3: For a signed determinant code P with mode (P)=j the number of symbols in $\mathcal{G}_3(P)$ to be protected can be found from $$|\mathcal{G}_3(P)| = |\{(x, \mathcal{X}) : \mathcal{X} \not\subseteq [k+1:d], |\mathcal{X}| = j, x \in \underline{\mathcal{X}}\}|$$

$$= \sum_{u=1}^{j-1} |\{(x, \mathcal{X}) : |\underline{\mathcal{X}}| = u, |\mathcal{X}| = j - u, x \in \underline{\mathcal{X}}\}|$$

$$= \sum_{u=1}^{j-1} \binom{k}{u}\binom{d-k}{j-u}(j-u).$$

Similarly, for $\mathcal{G}_4$ $$|\mathcal{G}_4(P)| = \left|\left\{\begin{array}{l}(x, \mathcal{X}) : \mathcal{X} \not\subseteq [k+1:d], |\mathcal{X}| = \\ j, x \in [k+1:d]\backslash \mathcal{X}, \mathcal{X} < \max \mathcal{X}\end{array}\right\}\right| \quad (15)$$

$$= |\{(x, \mathcal{Y}) : \mathcal{Y} \not\subseteq [k+1:d], |\mathcal{Y}| = j+1, x \in \underline{\mathcal{Y}}\backslash\{\max \mathcal{Y}\}\}|$$

$$= \sum_{u=1}^{j} |\{(x, \mathcal{Y}) : |\underline{\mathcal{Y}}| = u, |\mathcal{Y}| = j+1-u, x \in \underline{\mathcal{Y}}\backslash\{\max \mathcal{Y}\}\}|$$

$$= \sum_{u=1}^{j} \binom{k}{u}\binom{d-k}{j+1-u}(j-u).$$

where in (15), $\mathcal{Y} = \mathcal{X} \cup \{x\}$, with $|\mathcal{Y}|=j+1$. This implies there is a total of $$|\mathcal{G}_3(P) \cup \mathcal{G}_4(P)| = \sum_{u=1}^{j-1} \binom{k}{u}\binom{d-k+1}{j-u+1}(j-u) \quad (16)$$

symbols in a signed determinant code of mode j to be injected.

For each injection, the techniques described herein refer to the code whose symbols in the lower part need protection as the parent code. Furthermore, the code into which symbols are injected is called the child code.

Remark 4: Note that the techniques described herein may need multiple child codes for a parent code to protect all the symbols in $\mathcal{G}_3(P) \cup \mathcal{G}_4(P)$. However, for each child code, there is only one parent code that injects symbols into it. This leads to the tree structure for the injection hierarchy.

Consider a parent code with message matrix P, which is a (d; j) signed determinant code with mode j. The techniques described herein introduce several child codes for P to inject its symbols into. The techniques described herein distinguish these child codes by a pair (b, $\mathcal{B}$), satisfying $b \in [k+1:d]$, $\mathcal{B} \subseteq [k+1:d]$, $b \leq \max \mathcal{B}$.

The techniques described herein refer to (b, $\mathcal{B}$) as the injection pair. Furthermore, the techniques described herein denote tha child code of P code associated with an injection pair (b, $\mathcal{B}$) by $$Q_{b,\mathcal{B}} \atop \leftarrow P$$

(or simply Q, whenever it does it cause a confusion) which is a signed determinant code with parameters (d; m) where its mode satisfies $\mathrm{mode}(Q) = \mathrm{mode}(P) - |\mathcal{B}| - 1$.

$$\sigma_Q(i) = 1 + \sigma_P(i) + \mathrm{ind}_{\mathcal{B} \cup [i]}(i), \forall i \in [d], \quad (17)$$

where $\mu_P(i)$ are the sign parameters of the parent codes.

Symbols of code P may be injected into the message matrices of its child codes, i.e., added to (some of) the entries of the message matrix $$Q_{b,\mathcal{B}} \atop \leftarrow P.$$

The techniques described herein denote the modified version (after injection) of child code $$Q_{b,\mathcal{B}} \atop \leftarrow P$$

by $$Q_{b,\mathcal{B}}' \atop \leftarrow P.$$

This modification is modeled by adding the matrix of injection symbols $$\Delta_{b,\mathcal{B}} \atop \leftarrow P$$

to the original $$Q_{b,\mathcal{B} \atop \leftarrow P}$$

matrix, i.e., $$Q_{b,\mathcal{B} \atop \leftarrow P} = Q_{b,\mathcal{B} \atop \leftarrow P} + \Delta_{b,\mathcal{B} \atop \leftarrow P}. \qquad (18)$$

Here $$\Delta_{b,\mathcal{B} \atop \leftarrow P}$$

is a matrix with the same size as Q, that specifies the difference between the before- and after-injection. For a code with injection pair (b, $\mathcal{B}$), the symbol injected into row i and column $\mathcal{J}$ is given by $$\left[\Delta_{b,\mathcal{B} \atop \leftarrow P}\right]_{i,\mathcal{J}} = \begin{cases} (-1)^{1+\sigma_P(i)+\text{ind}_{\mathcal{J}\cup\{i\}\cup\mathcal{B}}(i)} P_{b,\mathcal{J}\cup\{i\}\cup\mathcal{B}} & \text{if } i > \max\mathcal{J}, i \notin \mathcal{B}, \mathcal{J}\cap\mathcal{B} = \varnothing, \\ 0 & \text{otherwise} \end{cases} \qquad (19)$$

Here, the coordinates of injection satisfy i∈[d] and $\mathcal{J} \subseteq$[d] with $|\mathcal{J}|=m=\text{mode}(Q)$.

Note that symbols of the code Q may also need to be injected into the message matrix of another code, which is a child code of Q (and hence grandchild code of P).

Hence, injections may be performed in a cascade manner. The ultimate super-message matrix may be obtained by concatenating all modified (after injection) message matrices.

The following remarks are provided for a comprehensive description of the injection process. However, they do not play a critical role in the proofs, and can be skipped.

Remark 5: The injection equation in (19) specifies the injection from the child code's perspective, i.e., for a given entry (row i and column $\mathcal{J}$) of a child code message matrix with injection pair (b, $\mathcal{B}$), the equation determines whether an injection into this entry is performed, and specifies the to-be-injected entry of the parent code. This representation is the most compact and useful form to prove the fundamental properties of the code. However, it is more intuitive to describe the injection from the parent code's point of view, that is, for every symbol in groups $\mathcal{G}_3(P)\cup\mathcal{G}_4(P)$ of a parent code P, specify the position(s) and parameters of child code(s) to which that symbol may be injected. In the following, the techniques described herein specify injection equations from the child code's perspective. It is worth mentioning that a single symbol might be injected to several child codes. One of such injections is called primary and the rest are called secondary.

Figure 6:
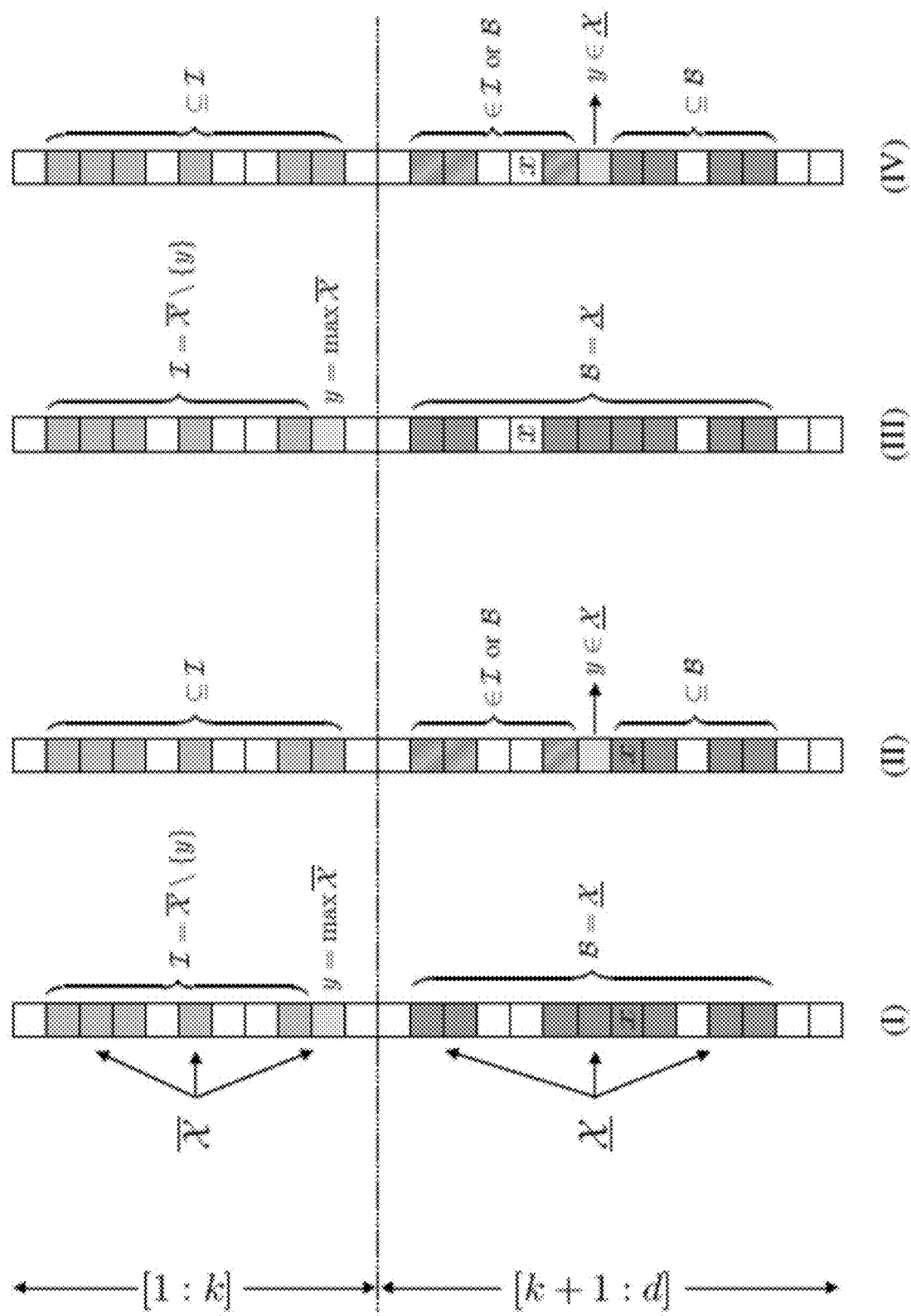
FIG. 6 is a conceptual diagram illustrating an example symbol injection, in accordance with the techniques described herein.

FIG. 6 is a conceptual diagram illustrating symbol injection, in accordance with the techniques of this disclosure. The shaded cells in the column indicate the set $\mathcal{X}$ for an element (x, $\mathcal{X}$). The primary injection for a v-symbols in $\mathcal{G}_{3,3}$ where x∈$\mathcal{X}$ in shown in (I). The coordinates of the injection are given by (y, $\mathcal{J}$)=(max$\overline{\mathcal{X}}$, $\overline{\mathcal{X}}$\{max$\mathcal{X}$}). Therefore, the child code is a determinant code of mode $|\mathcal{J}|=|\overline{\mathcal{X}}|$, designated by an injection pair (b, $\mathcal{B}$)=(x, $\underline{\mathcal{X}}$). The same v-symbol may be injected (perhaps multiple times) as secondary injections. As indicated in (II), the coordinates of a secondary injection are given by (y, $\mathcal{J}$) where i can be any element of $\underline{\mathcal{X}}$, and $\mathcal{J}$ includes the entire $\overline{\mathcal{X}}$ as well as an arbitrary subset of $\mathcal{Y} \subseteq \mathcal{X}_{[k+1:y-1]}$ (one injection for each pair of (y, $\mathcal{Y}$). The child code used for each such injection is a determinant code of mode $|\mathcal{J}|=|\overline{\mathcal{X}}\cup\mathcal{Y}|$, which is identified by an injection pair (b, $\mathcal{B}$)=(x, $\mathcal{X}_{[k+1:d]}\setminus(\mathcal{Y}\cup\{y\})$).

Primary injection of v-symbols: (20)

for any (x, X) such that $\overline{X} \neq \varnothing$ and $x \in \underline{X}$ (i.e., $v_{x;X} \in \mathcal{G}_3(P)$)

$$P_{x,X} = (-1)^{\sigma_P(x)} v_{x,X} \xrightarrow{\pm 1} \left[Q_{x,\underline{X} \atop \leftarrow P}\right]_{\max \overline{X}, \overline{X}\setminus\{\max\overline{X}\}} = (-1)^{\sigma_Q(\max\overline{X})} w^{(x,\underline{X},P)}_{\max\overline{X},\overline{X}}.$$

Here Q is a signed determinant code of mode mode(Q)=$|\overline{\mathcal{X}}|$−1, and the superscript of the w-symbol in the parent code's message matrix is a tuple of the form (b, $\mathcal{B}$, P) where (b, $\mathcal{B}$) is the injection-pair associated to the child code, and P is the parent, for which code Q is introduced. Moreover ±1 on the arrow indicates that the injection takes place after a proper change of sign. Here, this sign is determined by $$(-1)^{1+\sigma_P(\max\overline{X})+\text{ind}_X(\max\overline{X})}$$

More precisely, the symbol at row max$\overline{\mathcal{X}}$ and column $\overline{\mathcal{X}}$ of the child code may be modified from $$\left[Q_{x,\underline{X} \atop \leftarrow P}\right]_{\max\overline{X},\overline{X}\setminus\{\max\overline{X}\}} = (-1)^{\sigma_Q(\max\overline{X})} w^{(x,\underline{X},P)}_{\max\overline{X},\overline{X}} \text{ to}$$

$$\left[Q_{x,\underline{X} \atop \leftarrow P}\right]_{\max\overline{X},\overline{X}\setminus\{\max\overline{X}\}} = (-1)^{\sigma_Q(\max\overline{X})} w^{(x,\underline{X},P)}_{\max\overline{X},\overline{X}} +$$
$$(-1)^{1+\sigma_Q(\max\overline{X})+\text{ind}_X(\max\overline{X})}(-1)^{\sigma_P(x)} v_{x,X}.$$

Secondary injection of v-symbol: Beside the injections described in (I), a symbol $v_{x,x}$ with $\overline{\mathcal{X}}\neq\varnothing$ and x∈$\underline{\mathcal{X}}$ may be also injected as $$P_{x,X} = \qquad (21)$$
$$(-1)^{\sigma_P(x)} v_{x,X} \xrightarrow{\pm 1} \left[Q_{x,X_{[y+1:d]}\cup\mathcal{Y}' \atop \leftarrow P}\right]_{y,\overline{X}\cup\mathcal{Y}} = (-1)^{\sigma_Q(y)} w^{(x,X_{[y+1:d]}\cup\mathcal{Y}',P)}_{y,\overline{X}\cup\mathcal{Y}\cup\{y\}},$$

for every y∈$\underline{\mathcal{X}}$ and ($\mathcal{Y}$, $\mathcal{Y}'$) that partition $\mathcal{X}_{[k+1:y-1]}$, that is, $\mathcal{Y}\cap\mathcal{Y}'=\varnothing$ and $\mathcal{Y}\cup\mathcal{Y}'=\mathcal{X}_{[k+1:y-1]}$. Moreover, such a secondary injection may be performed only if x≤max $\mathcal{X}_{[y+1:d]}\cup\mathcal{Y}'$. The techniques described herein used $\mathcal{X}_{[k+1:y-1]}$ to denote the set $\mathcal{X} \cap [k+1: y-1]$, and $\mathcal{X}_{[y+1:d]}$ to specify the set $\mathcal{X} \cap [y+1:d]$. The sign of injection is given by $$(-1)^{1+\sigma_P(y)+ind_X(y)}.$$

Note that the mode of the child code is mode(Q)=$|\overline{\mathcal{X}} \cup \mathcal{Y}|$.

Primary injection of w-symbols: for every pair $(x, \mathcal{X})$ such that $\overline{\mathcal{X}} \neq \emptyset$, $x \in [k+1:d] \setminus \underline{\mathcal{X}}$ and $x < \max \mathcal{X}$ (i.e., $w_{x,\mathcal{X} \cup \{x\}} \cup \in \mathcal{G}_4(P)$), $$P_{x,X} = \qquad (22)$$

$$(-1)^{\sigma_P(x)} w_{x,X \cup \{x\}} \xrightarrow{\pm 1} \left[ Q_{\underline{x,X}} \right]_{max\overline{X}, \overline{X} \setminus \{max\overline{X}\}} = (-1)^{\sigma_Q(max\overline{X})} w_{max\overline{X}, X}^{(x,X,P)}.$$

Here, the sign of injected symbol is determined by $$(-1)^{1+\sigma_P(max\overline{X})+ind_X(max\overline{X})}$$

and the mode of the child code is mode(Q)=$|\overline{\mathcal{X}}| - 1$.

Secondary injection of w-symbols: Similar to the v-symbols, w-symbols may be also re-injected. Each $w_{x,\mathcal{X} \cup \{x\}}$ with $\overline{\mathcal{X}} \neq \emptyset$, $x \in [k+1:d] \setminus \underline{\mathcal{X}}$ with $x < \max \mathcal{X}$, may be injected as $$P_{x,X} = (-1)^{\sigma_P(x)} w_{x,X \cup \{x\}} \xrightarrow{\pm 1} \left[ Q_{x,X_{[y+1:d]} \cup \mathcal{Y}'} \right]_{y,\overline{X} \cup \mathcal{Y}} = \qquad (23)$$

$$(-1)^{\sigma_Q(y)} w_{y,\overline{X} \cup \mathcal{Y} \cup \{y\}}^{(x,X_{[y+1:d]} \cup \mathcal{Y}', P)},$$

for every $y \in \underline{\mathcal{X}}$ and $(\mathcal{Y}, \mathcal{Y}')$ that partition $\mathcal{X}_{[k+1:y-1]}$ Moreover, such a secondary injection may be performed only if $x \cdot \leq \max \mathcal{X}_{[y+1:d]} \cup \mathcal{Y}'$. The sign of injection is given by $$(-1)^{1+\sigma_P(y)+ind_X(y)},$$

and the sign of the child code is given by mode(Q)=$|\mathcal{X} \cup \mathcal{Y}|$.

Remark 6: Note that each symbol $v_{x,X} \in \mathcal{G}_{3,3}(P)$ may be injected multiple times, including one primary injection as specified in (20) and several secondary injections are given in (21). However, each secondary injection is performed into a different child code, as the injection-pairs $(b, \mathcal{B}) = (x, \mathcal{Y} \cup (\mathcal{X} \cap [y+1:d]))$ are different for distinct pairs of $(y, \mathcal{Y})$, when $\mathcal{Y} \subseteq \mathcal{X} \cap [k+1: y-1]$.

The primary injection governed by (20) is an injection into the top k rows of the child code (since the row index of the child symbol w is $y = \max \overline{\mathcal{X}} \in [k]$), and may be responsible for data recovery. Once such symbols are injected into a child code, the modified child code may not be a determinant code anymore, and its repair process may fail. The secondary injections of this symbol are proposed to maintain the repair structure. Note that in the injections specified in (21) the row index of the host symbol is $y \in \underline{\mathcal{X}} \subseteq [k+1: d]$, i.e., the injections performed into the lower (d–k) rows of the child codes.

A similar argument holds for the injection of w-symbols, as the primary injection in (22) is into the top k rows of the host code message matrix data recovery shows the injection for recovery in order to provide a backup for data recovery, and the secondary injection in (23) specifies all injections for the repair into the lower (d–k) rows of various children codes.

It is straightforward to evaluate the number of child codes of mode m introduced for a parent code of mode j. First note that for a parent code P of mode j, all the child codes are determinant codes of the form $$Q_{b,\mathcal{B}},$$

into which missing symbols of P may be injected. The mode of such child code is given by $$m = \text{mode}(Q) = \text{mode}(P) - |\mathcal{B}| - 1 = j - |\mathcal{B}| - 1.$$

In order to count the number of possible injection pairs (b, $\mathcal{B}$)'s the techniques described herein can distinguish two cases. First, if $b \in \mathcal{B}$, then there are $$\binom{d-k}{|\mathcal{B}|}$$

choices of $\mathcal{B}$, and there are $|\mathcal{B}|$ choices for $b \in \mathcal{B}$. Second, if $b \notin \mathcal{B}$, then $\mathcal{B} \cup \{b\}$ is a subset of $[k+1: d]$ of size $|\mathcal{B}|+1$. Then, there are $$\binom{d-k}{|\mathcal{B}|+1}$$

choices for $\mathcal{B} \cup \{b\}$, and for each choice, b can be any entry except the largest one.

Therefore the total number of injection pairs for a parent code of mode j is given by $$(j-m-1)\binom{d-k}{j-m-1} + (j-m-1)\binom{d-k}{j-m} = \qquad (24)$$

$$(j-m-1)\binom{d-k+1}{j-m}.$$

Remark 7: Recall from (20) and (22) that each primary injection may be into a w-symbol in the child code at the position $(\max \overline{\mathcal{X}}, \overline{\mathcal{X}} \setminus \{\max \overline{\mathcal{X}}\})$. The number of such w-symbols in a determinant code of mode m is only $$\binom{k}{m+1},$$

since $\overline{\mathcal{X}} \subseteq [k]$ and $|\overline{\mathcal{X}}| = m+1$. On the other hand, from (24), the number of child codes of mode m introduced for the primary injections of a parent code P of mode j. Therefore, the total number of w symbols hosting primary injections of a code of mode j is given by $$\sum_{m=0}^{j-1}(j-m-1)\binom{d-k+1}{j-m}\binom{k}{m+1}, \quad (25)$$

which is exactly the same as $|\mathcal{G}_3(P) \cup \mathcal{G}_4(P)|$, i.e., the number of symbols to be injected as evaluated in (16).

Remark 8. Consider a w-symbol in a child code hosting a symbol from the parent code. In primary injections of types I and III, such w-symbol is in the top k rows of the message matrix, and does not need protection. In secondary injections of types II and IV, the w-symbol is positioned in the bottom (d–k) rows. However, for such symbols $$ind_{\overline{\mathcal{X}} \cup \mathcal{Y} \cup \{y\}}(y) = m+1,$$

since $\overline{\mathcal{X}} \subseteq [k]$, $\mathcal{Y} \subseteq \mathcal{X}_{[k+1:y-1]}$ and $y \in [k+1: d]$. Hence, such symbol belongs to group $\mathcal{G}_2(Q)$ of the child code, and does not need to be injected into a grandchild code. The implication is that a w-symbol in a child code hosting a symbol from the parent code is never injected into a grandchild code, and therefore injected symbols may not be carried for multiple hops of injections. Moreover, the specification of injections form a parent code P into a child code Q does not depend on whether P is already modified by an earlier injection or not, that is, $$\Delta_{b,\mathcal{B}}_{\leftarrow P} = \Delta_{b,\mathcal{B}}_{\leftarrow P}.$$

The main property of the code proposed in this section is its reliability in spite of at most n–k node failures The following proposition is a formal statement for this property.

Proposition 4: By accessing any k nodes, the content of the stored data file can be recovered.

In the following, the techniques described herein discuss the exact repair property by introducing the repair data that a set of helper nodes $\mathcal{H}$ with $|\mathcal{H}|=d$ sent in order to repair a failed node $f \in [n]$.

The repair process is performed in a recursive manner from top-to-bottom, i.e., from segments of the codeword of node f with the highest mode to those with the lowest mode.

The repair data sent from a helper node $h \in \mathcal{H}$ to the failed node f is simply the concatenation of the repair data to be sent for each code segment. The repair data for each code segment can be obtained by treating each segment as a ordinary signed determinant code. More precisely, helper node h sends $$\bigcup_{P \text{ is a code segment}} \{\Psi_h \cdot P \cdot \Xi^{f,(mode(P))}\},$$

where $\Psi_h \cdot P$ is the codeword segment of node h corresponding to code segment P. In other words, for each codeword segment, the helper node needs to multiply it by the repair encoder matrix of the proper mode, and send the collection of all such multiplications to the failed node. Recall from Proposition 3 that the rank of $\Xi^{f,(P)}$ for a code segment of mode m is only $$\beta^{(m)} = \binom{d-1}{m-1}.$$

The overall repair bandwidth of the code is evaluated in (41).

Upon receiving all the repair data $\cup_P \{\Psi_h \cdot P \cdot \mu^{f,(mode(P))}: h \in \mathcal{H}\}$, the failed node stacks the segments corresponding to each code segment P to obtain $$\Psi[\mathcal{H},:] \cdot P \cdot \Xi^{f,(mode(P))},$$

from which, the repair spaces can be retrieved:

$$R^f(P) = \Psi[\mathcal{H},:]^{-1} \cdot \Psi[\mathcal{H},:] \cdot P \cdot \Xi^{f,(mode(P))}$$
$$= P \cdot \Xi^{f,(mode(P))},$$
$$\forall P: codesegments.$$

Note that invertibility of $\Psi[\mathcal{H},:]$ is guaranteed. Having the repair spaces for all the code segments, the content of node f can be reconstructed according to the following proposition.

Proposition 5: In the (n, k, d) proposed codes with parameters defined in this disclosure, for every failed node $f \in [n]$ and set of helpers $\mathcal{H} \subseteq [n]\setminus\{f\}$ with $|\mathcal{H}|=d$, the content of node f can be exactly regenerated from the received repair spaces. More precisely, the symbols at position $\mathcal{J}$ in a codeword segment corresponding to a code Q operating at mode m may be repaired through $$\left[\Psi_f \cdot Q_{b,\mathcal{B}}\right]_{\mathcal{J}} = \sum_{x \in \mathcal{J}} (-1)^{\sigma_Q(x)+ind_{\mathcal{J}}(x)} [R^f(Q)]_{x,\mathcal{J}\setminus\{x\}} - \quad (26)$$

$$\begin{cases} [R^f(P)]_{b,\mathcal{J} \cup \mathcal{B}} & \text{if } \mathcal{J} \cap \mathcal{B} = \varnothing, \\ 0 & \text{otherwise,} \end{cases}$$

where P is the parent code of Q.

Consider the construction of an (n, k, d) cascade code at mode μ, described in this disclosure. Let $\ell_m$ be the number of (d; m) determinant codes of mode m needed to complete all the injections. The super-message matrix M is obtained by concatenating all code segments, which results in a matrix with d rows and a total of $$\sum_{m=0}^{\mu} \ell_m \alpha_m$$

columns. Therefore, the per-node storage capacity of the resulting code may be $$\alpha(d, k; \mu) = \sum_{m=0}^{\mu} \ell_m \alpha_m = \sum_{m=0}^{\mu} \ell_m \binom{d}{m}. \quad (27)$$

Similarly, the repair bandwidth of the resulting code may be $$\beta(d, k; \mu) = \sum_{m=0}^{\mu} \ell_m \beta_m = \sum_{m=0}^{\mu} \ell_m \binom{d-1}{m-1}. \quad (28)$$

The total number of data symbols stored in matrix M is the sum of the number of data symbols in each code segment. A code segment of mode m can store up to $$F_m = m \binom{d+1}{m+1}$$

symbols. However, recall that data symbols in group $\mathcal{G}_1$ (see Definition 3) may be set to zero, which yields to a reduction in the of symbols. For an (n, d, d; m) determinant code used a code segment, the reduction due to nulling symbols in $\mathcal{G}_1$ is $$N_m = |\mathcal{G}_1| = |\{\mathcal{V}_{x,\mathcal{X}} : \overline{\mathcal{X}} = \emptyset\}| + \frac{m}{m+1} |\{\mathcal{W}_{x,\mathcal{Y}} : \overline{\mathcal{Y}} = \emptyset\}| \quad (29)$$

$$= m \binom{d-k}{m} + \frac{m}{m+1}(m+1)\binom{d-k}{m+1} \quad (30)$$

$$= m \left[ \binom{d-k}{m} + \binom{d-k}{m+1} \right] = m \binom{d-k+1}{m+1} \quad (31)$$

where the coefficient $$\frac{m}{m+1}$$

captures the fact that there are only m data symbols among m+1 w-symbols in each parity group. The number of possible $\mathcal{X}$'s is evaluated based on the facts that $|\mathcal{X}|=m$ and $\mathcal{X} \cap [k]=\emptyset$, which implies $\mathcal{X} \subseteq [k+1:d]$ and there are $$\binom{d-k}{m}$$

choices of $\mathcal{X}$. Moreover, $x \in \mathcal{X}$ can be any of the m elements of $\mathcal{X}$. A similar argument is used to compute the size of the second set. Finally, the techniques described herein used Pascal's identity. Therefore, the techniques described herein can evaluate the total number of data symbols in the super-message matrix as $$F(d, k; \mu) = \sum_{m=0}^{\mu} \ell_m (F_m - N_m) = \sum_{m=0}^{\mu} \ell_m m \left[ \binom{d+1}{m+1} - \binom{d-k+1}{m+1} \right]. \quad (32)$$

The rest of this section is dedicated to the evaluation of parameters $\ell_m$'s, the number of code segments of mode m, in order to fully characterize the parameters of the code.

In this section, the techniques described herein derive a recursive relationship between $\ell_m$ parameters. Next, the techniques described herein may solve the recursive equation to evaluate code parameters.

There is one root code with mode $\mu$, i.e., $\ell_\mu = 1$. Let m be an integer in $\{0, 1, \ldots, \mu-1\}$. In general, any code of mode j>m needs child codes of mode m. Recall from (24) that the number of child codes of mode m required for injection from a parent code of mode j is given by $$(j - m - 1) \binom{d-k+1}{j-m}.$$

Moreover, parent codes do not share children. Therefore, the total number of required child codes of mode m is given by $$\ell_m = \sum_{j=m+1}^{\mu} \ell_j (j - m - 1) \binom{d-k+1}{j-m}. \quad (33)$$

This is a reverse (top-to-bottom) recursive equation with starting point $\ell_\mu = 1$, and can be solved to obtain a non-recursive expression for $\ell_m$. Note that (33) potentially associates non-zero values to $\ell_m$'s with m<0. However, the techniques described herein only consider $m \in \{0, 1, \ldots, \mu-1\}$.

Let $\mu$ be a fixed non-negative integer. Recall that sequence $\{\ell_m\}$ is defined in (33) only for $m \in \{0, 1, \ldots, \mu\}$. The techniques described herein first expand the range of m to include all integers, by defining dummy variables $\{\ell_m: m<0 \text{ or } m>\mu\}$ such that $$\ell_m = \begin{cases} 1 & m = \mu, \\ \sum_{j=m+1}^{\mu} \ell_j (j-m-1) \binom{d-k+1}{j-m} & m \neq \mu. \end{cases} \quad (34)$$

Note that this immediately implies $\ell_m = 0$ for m>$\mu$. The techniques described herein also define a sequence $\{p_m\}_{m=-\infty}^{\infty}$ as $p_m = \ell_{\mu-m}$ for all $m \in \mathbb{Z}$. The next proposition provides a non-recursive expression for the sequence $\{p_m\}_m$.

Lemma 1: The parameters in sequence $\{p_m\}$ can be found from $$p_m = \sum_{t=0}^{m} (-1)^t (d-k)^{m-t} \binom{d-k+T-1}{t},$$

for $0 \leq m \leq \mu$.

It is clear that the techniques described herein can immediately find a non-recursive expression for $\ell_m$ using the fact that $\ell_m = p_{\mu-m}$. However, it turns out that such a conversion is not helpful, and the techniques described herein can continue with sequence $p_m$.

In this section the techniques described herein show that the code parameters obtained in (27), (28), and (32) are equal to the those proposed in Theorem 1. The following lemma may be helpful to simplify the derivation.

64Lemma 2: For integer numbers a, b∈ℤ, $$\sum_{m=-\infty}^{\infty} \ell_m \binom{d+a}{m+b} = \sum_{m=-b}^{\mu} (d-k)^{\mu-m}\binom{k+a}{m+b}.$$

Node storage size:

$$\alpha(d, k; \mu) = \sum_{m=0}^{\mu} \ell_m \alpha_m = \sum_{m=0}^{\mu} \ell_m \binom{d}{m} = \sum_{m=0}^{\mu} p_{m-\mu}\binom{d}{m} \quad (36)$$

$$= \sum_{m=-\infty}^{\infty} p_{m-\mu}\binom{d}{m} \quad (37)$$

$$= \sum_{m=0}^{\mu} (d-k)^{\mu-m}\binom{k}{m}. \quad (38)$$

Note that in (37) the techniques described herein used the fact that the summand is zero for $$m < 0 \text{ since } \binom{d}{m} = 0,$$

and for m>μ $p_{m-\mu}$=0, and (38) follows from Lemma 2 for a=b=0.

Repair bandwidth:

$$\beta(d, k; \mu) = \sum_{m=0}^{\mu} \ell_m \beta_m = \sum_{m=0}^{\mu} \ell_m \binom{d-1}{m-1} = \sum_{m=0}^{\mu} p_{m-\mu}\binom{d-1}{m-1} \quad (39)$$

$$= \sum_{m=-\infty}^{\infty} p_{m-\mu}\binom{d-1}{m-1} \quad (40)$$

$$= \sum_{m=1}^{\mu} (d-k)^{\mu-m}\binom{k-1}{m-1} \quad (41)$$

$$= \sum_{m=0}^{\mu} (d-k)^{\mu-m}\binom{k-1}{m-1}. \quad (42)$$

Here the steps are similar to (37), and (41) is due to Lemma 2 for a=b=−1.

File size:

$$F(d, k; \mu) = \sum_{m=0}^{\mu} m\ell_m \left[\binom{d+1}{m+1} - \binom{d-k+1}{m+1}\right] \quad (43)$$

$$= \sum_{m=-\infty}^{\infty} \ell_m\left[m\binom{d+1}{m+1} - m\binom{d-k+1}{m+1}\right]$$

$$= \sum_{m=-\infty}^{\infty} p_{\mu-m}\left[(m+1)\binom{d+1}{m+1} - \binom{d+1}{m+1} - (m+1)\binom{d-k+1}{m+1} + \binom{d-k+1}{m+1}\right] \quad (44)$$

$$= \sum_{m=-\infty}^{\infty} p_{\mu-m}\left[(d+1)\binom{d}{m} - \binom{d+1}{m+1} - (d-k+1)\binom{d-k}{m} + \binom{d-k+1}{m+1}\right]$$

$$= (d+1)\sum_{m=0}^{\mu}(d-k)^{\mu-m}\binom{k}{m} - \sum_{m=-1}^{\mu}(d-k)^{\mu-m}\binom{k+1}{m+1} - (d-k+1)\sum_{m=0}^{\mu}(d-k)^{\mu-m}\binom{k-k}{m} + \sum_{m=-1}^{\mu}(d-k)^{\mu-m}\binom{k-k+1}{m+1} \quad (45)$$

$$= (d+1)\sum_{m=0}^{\mu}(d-k)^{\mu-m}\binom{k}{m} - \sum_{m=-1}^{\mu}(d-k)^{\mu-m}\binom{k+1}{m+1} - [(d-k+1)(d-k)^{\mu}] + [(d-k)^{\mu+1} + (d-k)^{\mu}] \quad (46)$$

$$= (d+1)\sum_{m=0}^{\mu}(d-k)^{\mu-m}\binom{k}{m} - \sum_{m=-1}^{\mu}(d-k)^{\mu-m}\binom{k}{m} - \sum_{m=-1}^{\mu}(d-k)^{\mu-m}\binom{k}{m+1}$$

$$= d\sum_{m=0}^{\mu}(d-k)^{\mu-m}\binom{k}{m} - \sum_{m=0}^{\mu+1}(d-k)^{\mu+1-m}\binom{k}{m} \quad (47)$$

$$= \sum_{m=0}^{\mu} k(d-k)^{\mu-m}\left[\binom{k}{m} - \binom{k}{\mu+1}\right].$$

Note that (43) holds since $$\ell_m = 0 \text{ for } m > \mu \text{ and } \left[\binom{d+1}{m+1} - \binom{d-k+1}{m+1}\right] = 0 \text{ for } m < 0,$$

in (44) the techniques described herein used $\ell_m$=$p_{\mu-m}$ and some combinatorial manipulation to expand the coefficient, and (45) follows from four times evaluation of Lemma 2 for (a, b)=(0,0), (a, b)=(1,1), (a, b)=(−k, 0), and (a, b)=(−k+1,1). The equality in (46) holds since the terms in the third summation in (45) are zero except for m=0, and similarly the terms in the forth summation are zero except for m=−1,0. Finally, the second summation in (47) is absorbed in the first summation by noting that $$\binom{k}{-1} = 0,$$

and the third summation is rewritten after a change of variable.

This section is dedicated to constructing an example of the proposed codes, and showing its fundamental properties. The techniques described herein may demonstrate all the ingredients of the construction, including encode matrix, code signature, concatenation of code segments, the grouping of the symbols in the lower (d−k) rows, and primary and secondary injection of v and w symbols.

Consider an (n, k=4, d=6; μ=4) code with parameters (α, β, F)=(81,27,324), as indicated by (3). Note that a code with parameters (α, β, F)=(81,27,324) is indeed an MSR code since F=kα and β=α/(d−k+1), for which several code constructions are known. However, while existing codes can be constructed for a given n (the number of nodes in the system) and node contents and parameters of the codes are functions of n, in the construction n is an arbitrary integer number, that only affects the field size (the field size may be greater than n). Nevertheless, this example is rich enough to demonstrate the techniques needed for the code construction as well as the formal proofs.

The first ingredient is an n×d encoder matrix with the properties in Definition 2. For the sake of illustration, the techniques described herein choose n=9 here, but the generalization of this encoder matrix to any integer n>d=6 is straightforward. The techniques described herein pick a Vandermonde matrix of size n×d=9×6. The underlying finite field may have at least n distinct elements. So, the techniques described herein pick $\mathbb{F}_{13}$, and all the arithmetic operations below are performed in modulus 13.

In order to design the super-message matrix M, the techniques described herein start with an (n, k=6, d=6; m=4). Throughout the construction, the techniques described herein may introduce child codes for each code segment until the techniques described herein complete all the injections, and provide a backup copy for every symbol in groups of $\mathcal{G}_3 \cup \mathcal{G}_4$ of each segment message matrix. This leads to a concatenation of multiple signed determinant codes with various modes. The number of code segments at each mode can be found from (33), that is ($\ell_4, \ell_3, \ell_2, \ell_1, \ell_0$)=(1,0,3,2,9). Therefore, the resulting super-message matrix code M can be obtained from cascading a total of $\Sigma_{m=0}^{\mu} \ell_m$=15 code segments. For the sake of illustration the techniques described herein denote these code segments by $T_0, T_1, \ldots, T_{14}$, that is, $$M=[T_0 T_1 \ldots T_{14}], \quad (48)$$

in which code segment $T_i$ is the modified message matrix (after injection) of an (n, d, d; $m_i$) signed determinant code with mode $m_i$=mode($T_i$), where $$(m_0, m_1, \ldots, m_{14})=(4,2,2,2,1,1,0,0,0,0,0,0,0,0,0).$$

The techniques described herein also use superscript $\langle i \rangle$ to distinguish the data symbols of the code segment $T_i$. The hierarchy of parents/children codes and symbol injection is shown in FIG. 7.

Figure 7:
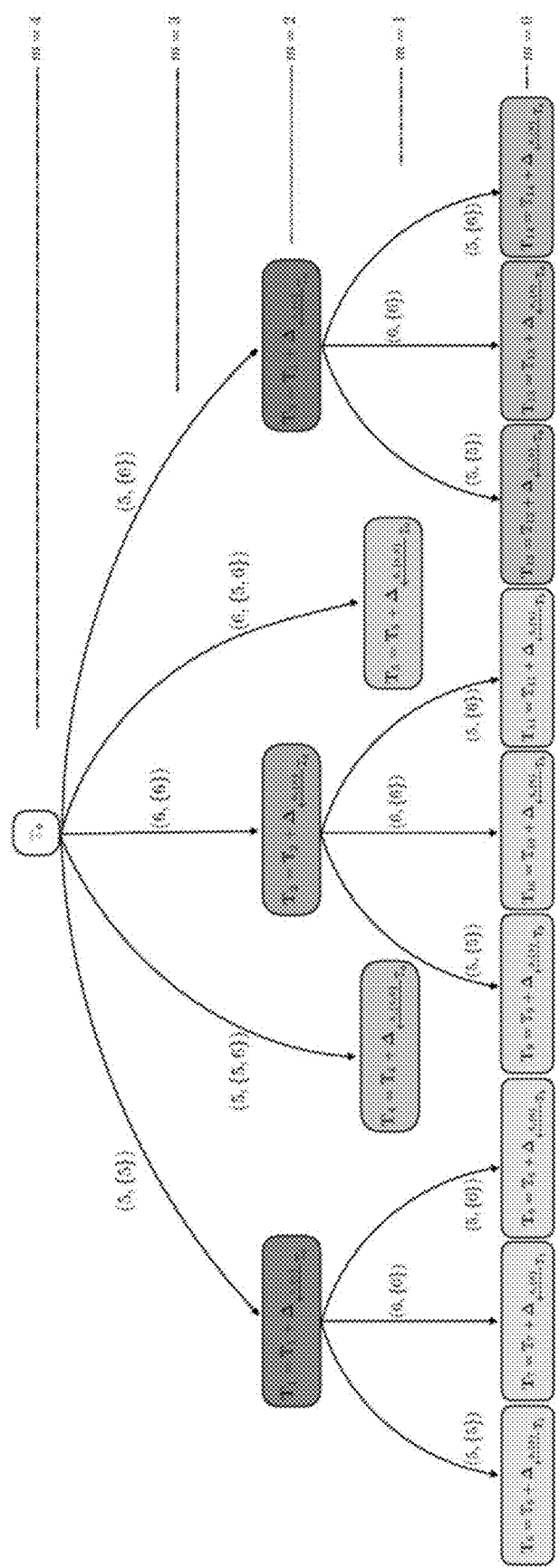
FIG. 7 is a conceptual diagram illustrating an example hierarchical tree for an (n, k=4, d=6; μ=4) code, in accordance with the techniques described herein.

FIG. 7 is a conceptual diagram illustrating the hierarchical tree for an (n, k=4, d=6; μ=4) code. Each level on the tree shows codes with the same mode. The injection from the parent codes to child codes are shown by arrows, labeled by the corresponding injection pair.

The first code segment is a (d=6; m=4) signed determinant code, with message matrix $T_0$ and signature $\sigma_{T_0}(x)=0$ for every x∈[d], i.e., $\sigma_{T_0}$=(0,0,0,0,0,0). Note that no injection takes place into $T_0$, and hence, $T_0=T_0$, i.e., $T_0$ is a purely signed determinant message matrix of mode $m_0$=4. The size of this matrix is $$d \times \alpha_{m_0} = d \times \binom{d}{m_0} = 6 \times \binom{6}{4} = 6 \times 15.$$

This matrix is given in (49).

$$\Psi_{9\times 6} = \begin{bmatrix} \Psi_1 \\ \Psi_2 \\ \Psi_3 \\ \Psi_4 \\ \Psi_5 \\ \Psi_6 \\ \Psi_7 \\ \Psi_8 \\ \Psi_9 \end{bmatrix} = \begin{bmatrix} \psi_{1,1} & \psi_{1,2} & \psi_{1,3} & \psi_{1,4} & \psi_{1,5} & \psi_{1,6} \\ \psi_{2,1} & \psi_{2,2} & \psi_{2,3} & \psi_{2,4} & \psi_{2,5} & \psi_{2,6} \\ \psi_{3,1} & \psi_{3,2} & \psi_{3,3} & \psi_{3,4} & \psi_{3,5} & \psi_{3,6} \\ \psi_{4,1} & \psi_{4,2} & \psi_{4,3} & \psi_{4,4} & \psi_{4,5} & \psi_{4,6} \\ \psi_{5,1} & \psi_{5,2} & \psi_{5,3} & \psi_{5,4} & \psi_{5,5} & \psi_{5,6} \\ \psi_{6,1} & \psi_{6,2} & \psi_{6,3} & \psi_{6,4} & \psi_{6,5} & \psi_{6,6} \\ \psi_{7,1} & \psi_{7,2} & \psi_{7,3} & \psi_{7,4} & \psi_{7,5} & \psi_{7,6} \\ \psi_{8,1} & \psi_{8,2} & \psi_{8,3} & \psi_{8,4} & \psi_{8,5} & \psi_{8,6} \\ \psi_{9,1} & \psi_{9,2} & \psi_{9,3} & \psi_{9,4} & \psi_{9,5} & \psi_{9,6} \end{bmatrix} = \begin{bmatrix} 1 & 1 & 1 & 1 & 1 & 1 \\ 1 & 2 & 4 & 8 & 3 & 6 \\ 1 & 3 & 9 & 1 & 3 & 9 \\ 1 & 4 & 3 & 12 & 9 & 10 \\ 1 & 5 & 12 & 8 & 1 & 5 \\ 1 & 6 & 10 & 8 & 9 & 2 \\ 1 & 7 & 10 & 5 & 9 & 11 \\ 1 & 8 & 12 & 5 & 1 & 8 \\ 1 & 9 & 3 & 1 & 9 & 3 \end{bmatrix} \pmod{13}.$$

$$\mathbb{T}_0 = \begin{array}{c} 1 \\ 2 \\ 3 \\ 4 \\ 5 \\ 6 \end{array} \begin{bmatrix} v^{<0>}_{1,\{1,2,3,4\}} & v^{<0>}_{1,\{1,2,3,5\}} & v^{<0>}_{1,\{1,2,3,6\}} & \cdots & \cdots & v^{<0>}_{1,\{1,2,4,5\}} & v^{<0>}_{1,\{1,2,4,6\}} & v^{<0>}_{1,\{1,2,5,6\}} & \cdots & \cdots \\ v^{<0>}_{2,\{1,2,3,4\}} & v^{<0>}_{2,\{1,2,3,5\}} & v^{<0>}_{2,\{1,2,3,6\}} & \cdots & \cdots & v^{<0>}_{2,\{1,2,4,5\}} & v^{<0>}_{2,\{1,2,4,6\}} & v^{<0>}_{2,\{1,2,5,6\}} & \cdots & \cdots \\ v^{<0>}_{3,\{1,2,3,4\}} & v^{<0>}_{3,\{1,2,3,5\}} & v^{<0>}_{3,\{1,2,3,6\}} & \cdots & \cdots & w^{<0>}_{3,\{1,2,3,4,5\}} & w^{<0>}_{3,\{1,2,3,4,6\}} & w^{<0>}_{3,\{1,2,3,5,6\}} & \cdots & \cdots \\ v^{<0>}_{4,\{1,2,3,4\}} & w^{<0>}_{4,\{1,2,3,4,5\}} & w^{<0>}_{4,\{1,2,3,4,6\}} & \cdots & \cdots & v^{<0>}_{4,\{1,2,4,5\}} & v^{<0>}_{4,\{1,2,4,6\}} & w^{<0>}_{4,\{1,2,4,5,6\}} & \cdots & \cdots \\ w^{<0>}_{5,\{1,2,3,4,5\}} & v^{<0>}_{5,\{1,2,3,5\}} & w^{<0>}_{5,\{1,2,3,5,6\}} & \cdots & \cdots & v^{<0>}_{5,\{1,2,4,5\}} & w^{<0>}_{5,\{1,2,4,5,6\}} & v^{<0>}_{5,\{1,2,5,6\}} & \cdots & \cdots \\ w^{<0>}_{6,\{1,2,3,4,6\}} & w^{<0>}_{6,\{1,2,3,5,6\}} & v^{<0>}_{6,\{1,2,3,6\}} & \cdots & \cdots & w^{<0>}_{6,\{1,2,4,5,6\}} & v^{<0>}_{6,\{1,2,4,6\}} & v^{<0>}_{6,\{1,2,5,6\}} & \cdots & \cdots \end{bmatrix}$$

{1, 2, 3, 4}  {1, 2, 3, 5}  {1, 2, 3, 6}   {1, 2, 4, 5}  {1, 2, 4, 6}  {1, 2, 5, 6}   (49)

{1, 3, 4, 5}  {1, 3, 4, 6}  {1, 3, 5, 6}   {1, 4, 5, 6}  {2, 3, 4, 5}  {2, 3, 4, 6}

-continued $$\begin{matrix}
v_{1,\{1,3,4,5\}}^{<0>} & v_{1,\{1,3,4,6\}}^{<0>} & v_{1,\{1,3,5,6\}}^{<0>} & \cdots & \cdots & v_{1,\{1,4,5,6\}}^{<0>} & w_{1,\{1,2,3,4,5\}}^{<0>} & w_{1,\{1,2,3,4,6\}}^{<0>} & \cdots & \cdots \\
w_{2,\{1,2,3,4,5\}}^{<0>} & w_{2,\{1,2,3,4,6\}}^{<0>} & w_{2,\{1,2,3,5,6\}}^{<0>} & \cdots & \cdots & v_{2,\{1,2,4,5,6\}}^{<0>} & v_{2,\{2,3,4,5\}}^{<0>} & v_{2,\{2,3,4,6\}}^{<0>} & \cdots & \cdots \\
v_{3,\{1,3,4,5\}}^{<0>} & v_{3,\{1,3,4,6\}}^{<0>} & v_{3,\{1,3,5,6\}}^{<0>} & \cdots & \cdots & w_{3,\{1,3,4,5,6\}}^{<0>} & v_{3,\{2,3,4,5\}}^{<0>} & v_{3,\{2,3,4,6\}}^{<0>} & \cdots & \cdots \\
v_{4,\{1,3,4,5\}}^{<0>} & v_{4,\{1,3,4,6\}}^{<0>} & w_{4,\{1,3,4,5,6\}}^{<0>} & \cdots & \cdots & v_{4,\{1,4,5,6\}}^{<0>} & v_{4,\{2,3,4,5\}}^{<0>} & v_{4,\{2,3,4,6\}}^{<0>} & \cdots & \cdots \\
\hline
v_{5,\{1,3,4,5\}}^{<0>} & w_{5,\{1,3,4,5,6\}}^{<0>} & v_{5,\{1,3,5,6\}}^{<0>} & \cdots & \cdots & w_{5,\{1,4,5,6\}}^{<0>} & v_{5,\{2,3,4,5\}}^{<0>} & w_{5,\{2,3,4,5,6\}}^{<0>} & \cdots & \cdots \\
w_{6,\{1,3,4,5,6\}}^{<0>} & v_{6,\{1,3,4,6\}}^{<0>} & v_{6,\{1,3,5,6\}}^{<0>} & \cdots & \cdots & v_{6,\{1,4,5,6\}}^{<0>} & w_{6,\{2,3,4,5,6\}}^{<0>} & v_{6,\{2,3,4,6\}}^{<0>} & \cdots & \cdots \\
\end{matrix}$$

$\{2,3,5,6\} \quad \{2,4,5,6\} \quad \{3,4,5,6\}$ $$\begin{bmatrix}
w_{1,\{1,2,3,5,6\}}^{<0>} & w_{1,\{1,2,4,5,6\}}^{<0>} & w_{1,\{1,3,4,5,6\}}^{<0>} \\
v_{2,\{2,3,5,6\}}^{<0>} & v_{2,\{2,4,5,6\}}^{<0>} & w_{2,\{2,3,4,5,6\}}^{<0>} \\
v_{3,\{2,3,5,6\}}^{<0>} & w_{3,\{2,3,4,5,6\}}^{<0>} & v_{3,\{3,4,5,6\}}^{<0>} \\
w_{4,\{2,3,4,5,6\}}^{<0>} & v_{4,\{2,4,5,6\}}^{<0>} & v_{4,\{3,4,5,6\}}^{<0>} \\
\hline
v_{5,\{2,3,5,6\}}^{<0>} & v_{5,\{2,4,5,6\}}^{<0>} & v_{5,\{3,4,5,6\}}^{<0>} \\
v_{6,\{2,3,5,6\}}^{<0>} & v_{6,\{2,4,5,6\}}^{<0>} & v_{6,\{3,4,5,6\}}^{<0>} \\
\end{bmatrix}$$

Note that horizontal line in the matrix separates the top k=4 rows from the bottom (d−k)=6−4=2 rows. The top 4×15 sub-matrix is denoted by $\overline{T_0}$ and the bottom 2×15 sub-matrix is denoted by $\underline{T_0}$.

According to Definition 3, the symbols in $\underline{T_0}$ can be grouped as follows.

$\mathcal{G}_1(\underline{T_0}) = \phi$ $\mathcal{G}_2(\underline{T_0}) =$
$\{w_{5,\{1,2,3,4,5\}}^{(0)}, w_{6,\{1,2,3,4,6\}}^{(0)}, w_{6,\{1,2,3,5,6\}}^{(0)}, w_{6,\{1,2,4,5,6\}}^{(0)}, w_{6,\{1,3,4,5,6\}}^{(0)}, w_{6,\{2,3,4,5,6\}}^{(0)}\},$ $\mathcal{G}_3(\underline{T_0}) =$
$\left\{\begin{matrix}
v_{5,\{1,2,3,5\}}^{(0)}, & v_{5,\{1,2,4,5\}}^{(0)}, & v_{5,\{1,2,5,6\}}^{(0)}, & v_{5,\{1,3,4,5\}}^{(0)}, & v_{5,\{1,3,5,6\}}^{(0)}, \\
v_{5,\{1,4,5,6\}}^{(0)}, & v_{5,\{2,3,4,5\}}^{(0)}, & v_{5,\{2,3,5,6\}}^{(0)}, & v_{5,\{2,4,5,6\}}^{(0)}, & v_{5,\{3,4,5,6\}}^{(0)}, \\
v_{6,\{1,2,3,6\}}^{(0)}, & v_{6,\{1,2,4,6\}}^{(0)}, & v_{6,\{1,2,5,6\}}^{(0)}, & v_{6,\{1,3,4,6\}}^{(0)}, & v_{6,\{1,3,5,6\}}^{(0)}, \\
v_{6,\{1,4,5,6\}}^{(0)}, & v_{6,\{2,3,4,6\}}^{(0)}, & v_{6,\{2,3,5,6\}}^{(0)}, & v_{6,\{2,4,5,6\}}^{(0)}, & v_{6,\{3,4,5,6\}}^{(0)} \\
\end{matrix}\right\},$ $\mathcal{G}_4(\underline{T_0}) =$
$\{w_{5,\{1,2,3,5,6\}}^{(0)}, w_{5,\{1,2,4,5,6\}}^{(0)}, w_{5,\{1,3,4,5,6\}}^{(0)}, w_{5,\{2,3,4,5,6\}}^{(0)}\}.$ Since $\mathcal{G}_1(\underline{T_0})=\phi$, no symbol may be set to zero. Symbols in $\mathcal{G}_2(\underline{T_0})$ can be recovered from the parity equations. For instance, for $w_{5,\{1,2,3,4,5\}}^{<0>} \in \mathcal{G}_2(\underline{T_0})$, from (7)– $w_{1,\{1,2,3,4,5\}}^{<0>}+w_{2,\{1,2,3,4,5\}}^{<0>}-w_{3,\{1,2,3,4,5\}}^{<0>}+w_{4,\{1,2,3,4,5\}}^{<0>}-w_{5,\{1,2,3,4,5\}}^{<0>}=0,$ in which all the symbols except $w_{5,\{1,2,3,4,5\}}^{<0>}$ are located in the top k=4 rows of the matrix $\underline{T_0}$.

The symbols in groups $\mathcal{G}_3(\underline{T_0})$ and $\mathcal{G}_4(\underline{T_0})$ are marked in boxes in (49), to indicate that they need to be injected into other code segments with lower modes. Moreover, two groups of injections are designated by colored boxes, namely, symbols in a first group of boxes may be injected into $T_2$ and those in a second group of boxes may be injected into $T_5$. The details of the injection are discussed in the following.

Consider symbol $v_{x,\mathcal{X}}^{<0>} = v_{6,\{1,2,5,6\}}^{<0>} \in \mathcal{G}_3(\underline{T_0})$ with x=6 and $\mathcal{X}=\{1,2,5,6\}$, which implies $\overline{\mathcal{X}}=\{1,2\}$ and $\underline{\mathcal{X}}=\{5,6\}$. According to (20), this symbol is primarily injected into a code of mode $m=|\overline{\mathcal{X}}|-1=1$, with injection pair $(x, \mathcal{X})=(6, \{5,6\})$. The row of the injection may be $\max\overline{\mathcal{X}}=\max\{1,$ 2\}=2 and its column is $\overline{\mathcal{X}}\setminus\{\max\overline{\mathcal{X}}\}=\{1,2\}\setminus\{2\}=\{1\}$. Finally, the sign of the injection is given by $$(-1)^{1+\sigma_{T_0}(\max\overline{\mathcal{X}})+\text{ind}_{\mathcal{X}}(\max\overline{\mathcal{X}})} = (-1)^{1+0+2} = (-1)^3 = -1.$$

This is formally written as $$[T_0]_{x,\mathcal{X}} =$$

$$v_{6,\{1,2,5,6\}}^{(0)} \xrightarrow{\mathcal{X}(-1)} \left[T_{5\overset{6,\{5,6\}}{\leftarrow}T_0}\right]_{2,\{1\}} = (-1)^{\sigma_{T_5}(2)} w_{2,\{1,2\}}^{(6,\{5,6\},T_0)} = (-1)^{\sigma_{T_5}(2)} w_{2,\{1,2\}}^{(5)},$$

that is, $-v_{6,\{1,2,5,6\}}^{<0>}$ may be added to the symbol at position $(2, \{1\})$ of the child code. This child code is originally a signed determinant code denoted by $$T_{5\overset{6,\{5,6\}}{\leftarrow}T_0},$$

into which (some of) the symbols of $T_0$ may be injected. Note that $$T_5 = T_{5\overset{6,\{5,6\}}{\leftarrow}T_0}$$

is message matrix for a signed determinant code of mode 1 with the injection pair $(6,\{5,6\})$, and hence has $$\binom{d}{m} = \binom{6}{1} = 6 \text{ columns}.$$

and its columns are labeled with subsets of {1,2,3,4,5,6} of size 1. As a short-hand notation, the techniques described herein denote this message matrix before injection by $T_5$ and after injection by $\mathbb{T}_5$, as indicated in FIG. 7. Then $$T_5 = T_5 + \Delta_{6,\{5,6\}\underleftarrow{\qquad}T_0}.$$

The signature of this child code can be found from (17) as $$\sigma_{T_5} = (2,2,2,2,2,3). \tag{50}$$

In summary, the primary injection of this symbol is given by $$[T_5]_{2,\{1\}} = w_{2,\{1,2\}}^{<5>} - v_{6,\{1,2,5,6\}}^{<0>}.$$

The complete form of matrices $$T_{5\,6,\{5,6\}\underleftarrow{\qquad}T_0} \text{ and } \Delta_{6,\{5,6\}\underleftarrow{\qquad}T_0}$$

are given in (51) and (52).

$$\mathbb{T}_5 = \begin{array}{c} \\ 1 \\ 2 \\ 3 \\ 4 \\ 5 \\ 6 \end{array} \begin{bmatrix} \{1\} & \{2\} & \{3\} & \{4\} & \{5\} & \{6\} \\ v_{1,\{1\}}^{<5>} & w_{1,\{1,2\}}^{<5>} & w_{1,\{1,3\}}^{<5>} & \cdots \cdots & w_{1,\{1,4\}}^{<5>} & w_{1,\{1,5\}}^{<5>} & w_{1,\{1,6\}}^{<5>} \\ w_{2,\{1,2\}}^{<5>} & v_{2,\{2\}}^{<5>} & w_{2,\{2,3\}}^{<5>} & \cdots \cdots & w_{2,\{2,4\}}^{<5>} & w_{2,\{2,5\}}^{<5>} & w_{2,\{2,6\}}^{<5>} \\ w_{3,\{1,3\}}^{<5>} & w_{3,\{2,3\}}^{<5>} & v_{3,\{3\}}^{<5>} & \cdots \cdots & w_{3,\{3,4\}}^{<5>} & w_{3,\{3,5\}}^{<5>} & w_{3,\{3,6\}}^{<5>} \\ w_{4,\{1,4\}}^{<5>} & w_{4,\{2,4\}}^{<5>} & w_{4,\{3,4\}}^{<5>} & \cdots \cdots & v_{4,\{4\}}^{<5>} & w_{4,\{4,5\}}^{<5>} & w_{4,\{4,6\}}^{<5>} \\ w_{5,\{1,5\}}^{<5>} & w_{5,\{2,5\}}^{<5>} & w_{5,\{3,5\}}^{<5>} & \cdots \cdots & w_{5,\{4,5\}}^{<5>} & v_{5,\{5\}}^{<5>} = 0 & w_{5,\{5,6\}}^{<5>} = 0 \\ -w_{6,\{1,6\}}^{<5>} & -w_{6,\{2,6\}}^{<5>} & -w_{6,\{3,6\}}^{<5>} & \cdots \cdots & -w_{6,\{4,6\}}^{<5>} & -w_{6,\{5,6\}}^{<5>} = 0 & -v_{6,\{6\}}^{<5>} = 0 \end{bmatrix} \tag{51}$$

$$\Delta_{6,\{5,6\}\underleftarrow{\qquad}\mathbb{T}_0} = \begin{array}{c} \\ 1 \\ 2 \\ 3 \\ 4 \\ 5 \\ 6 \end{array} \begin{bmatrix} \{1\} & \{2\} & \{3\} & \{4\} & \{5\} & \{6\} \\ 0 & 0 & 0 & 0 & 0 & 0 \\ -v_{6,\{1,2,5,6\}}^{<0>} & 0 & 0 & 0 & 0 & 0 \\ -v_{6,\{1,3,5,6\}}^{<0>} & -v_{6,\{2,3,5,6\}}^{<0>} & 0 & 0 & 0 & 0 \\ -v_{6,\{1,4,5,6\}}^{<0>} & -v_{6,\{2,4,5,6\}}^{<0>} & -v_{6,\{3,4,5,6\}}^{<0>} & 0 & 0 & 0 \\ 0 & 0 & 0 & 0 & 0 & 0 \\ 0 & 0 & 0 & 0 & 0 & 0 \end{bmatrix} \tag{52}$$

As it is clear from (52), the group of symbols $\{v_{6,\{1,2,5,6\}}^{<0>}, v_{6,\{1,3,5,6\}}^{<0>}, v_{6,\{1,4,5,6\}}^{<0>}, v_{6,\{2,3,5,6\}}^{<0>}, v_{6,\{2,4,5,6\}}^{<0>}, v_{6,\{3,4,5,6\}}^{<0>}\}$ of $\mathcal{G}_3(T_0)$ may be all primarily injected into the symbols of the $T_5$. Note that all the primary injections are performed in $\overline{T_5}$. Similarly, the symbols $\{v_{5,\{1,2,5,6\}}^{<0>}, v_{5,\{1,3,5,6\}}^{<0>}, v_{5,\{1,4,5,6\}}^{<0>}, v_{5,\{2,3,5,6\}}^{<0>}, v_{5,\{2,4,5,6\}}^{<0>}, v_{5,\{3,4,5,6\}}^{<0>}\}$ may be injected into $$T_4 = T_4 \underset{T_0}{\overset{5,\{5,6\}}{\longleftarrow}},$$

another child code of $T_0$ with injection pair $(5, \{5,6\})$.

Note that the entries in the last row of $$T_5 \underset{T_0}{\overset{6,\{5,6\}}{\longleftarrow}}$$

in (51) have negative sign, due to (50). Moreover, from Definition 3

$$\mathcal{G}_1(T_5) = \{v_{5,\{5\}}^{<5>}, -v_{6,\{6\}}^{<5>}, w_{5,\{5,6\}}^{<5>}, -w_{6,\{5,6\}}^{<5>},\},$$

$$\mathcal{G}_2(T_5) = \begin{Bmatrix} w_{5,\{1,5\}}^{<5>}, w_{5,\{2,5\}}^{<5>}, w_{5,\{3,5\}}^{<5>}, w_{5,\{4,5\}}^{<5>}, \\ -w_{6,\{1,6\}}^{<5>}, -w_{6,\{2,6\}}^{<5>}, -w_{6,\{3,6\}}^{<5>}, -w_{6,\{4,6\}}^{<5>} \end{Bmatrix},$$

$$\mathcal{G}_3(T_5) = \mathcal{G}_4(T_5) = \phi.$$

The symbols in $\mathcal{G}_{1,1}(T_5)$ are marked in (51), and set to zero. It is worth mentioning that since $\mathcal{G}_{3,3}(T_5) = \mathcal{G}_{4,4}(T_5) = \phi$, no further injection from $T_5$ is needed, and hence $T_5$ does not have any child (see FIG. 7).

Beside its primary injection to $T_5$, the symbols in $\mathcal{G}_{3,3}(T_0)$ are also subject to secondary injection(s). Let us consider $v_{6,\{1,2,5,6\}}^{<0>}$. According to (21), a secondary injection of $v_{6,\{1,2,5,6\}}^{<0>}$ is determined by an integer $y \in \mathcal{X} = \{5,6\}$ and subsets ($\mathcal{Y}, \mathcal{Y}'$):

For y=5, $\mathcal{X}_{[k+1:y-1]} = \mathcal{X}_{[5:4]} = \emptyset$. Hence $\mathcal{Y} = \mathcal{Y}' = \emptyset$ and $x=6 \leq \max(\mathcal{X}_{[y+1:d]} \cup \mathcal{Y}') = \max(\mathcal{X}_{[6:6]} \cup \emptyset) = 6$ is satisfied. Hence this injection is needed.

If y=6, then $\mathcal{X}_{[k+1:y-1]} = \mathcal{X}_{[5:5]} = \{5\}$. Hence, either ($\mathcal{Y}, \mathcal{Y}'$) = ($\emptyset, \{5\}$) or ($\mathcal{Y}, \mathcal{Y}'$) = ($\{5\}, \emptyset$). However, since $\mathcal{X}_{[y+1:d]} = \mathcal{X}_{[7:5]} = \emptyset$, the condition $x=6 \leq \max(\mathcal{X}_{[y+1:d]} \cup \mathcal{Y}')$ cannot be satisfied. Thus, there is no injection for y=6.

For the only secondary injection satisfying conditions of (21), i.e., y=5 and $\mathcal{Y} = \mathcal{Y}' = \emptyset$, the injection pair is given by $$(x, \mathcal{X}_{[y+1:d]} \cup \mathcal{Y}') = (x, \mathcal{X}_{[6:6]} \cup \emptyset) = (6, \{6\}),$$

and the mode of the child code is $$m = |\mathcal{X} \cup \mathcal{Y}| = |\{1,2\} \cup \emptyset| = 2.$$

This code is denoted by $T_2$ in FIG. 7. Hence, $$[T_0]_{x,X} =$$

$$v_{6,\{1,2,5,6\}}^{(0)} \xrightarrow{\times (-1)^{1+\sigma_{T_0}(5)+ind_{\{1,2,5,6\}}(5)}} \left[T_2 \underset{\leftarrow T_0}{\overset{6,\{6\}}{\longleftarrow}}\right]_{5,\{1,2\}} = (-1)^{\sigma_{T_2}(5)} w_{5,\{1,2,5\}}^{(6,\{6\},T_0)}.$$

Recall that $T_2$ is a code of mode $$m_2 = 2 \text{ with } \binom{d}{m_2} = \binom{6}{2} = 15 \text{ columns},$$

columns, each labeled by a subset of $\{1, \ldots, 6\}$ of size 2. The signature of $T_2$ can be obtained from (17) as $$\sigma_{T_2}(i) = 1 + \sigma_{T_0}(i) + ind_{\{6\} \cup \{i\}}(i) = 2 \,\forall i \in \{1,2,3,4,5,6\}.$$

The complete representation of the message matrix $$T_2 = T_2 \underset{T_0}{\overset{6,\{6\}}{\longleftarrow}}$$

is given in (53).

$$T_2 = \begin{array}{c} \phantom{x} \\ 1 \\ 2 \\ 3 \\ 4 \\ 5 \\ 6 \end{array} \begin{bmatrix} \{1,2\} & \{1,3\} & \{1,4\} & & \{1,5\} & \{1,6\} & \{2,3\} & & \\ v_{1,\{1,2\}}^{<2>} & v_{1,\{1,3\}}^{<2>} & v_{1,\{1,4\}}^{<2>} & \cdots & v_{1,\{1,5\}}^{<2>} & v_{1,\{1,6\}}^{<2>} & w_{1,\{1,2,3\}}^{<2>} & \cdots \\ v_{2,\{1,2\}}^{<2>} & w_{2,\{1,2,3\}}^{<2>} & w_{2,\{1,2,4\}}^{<2>} & \cdots & w_{2,\{1,2,5\}}^{<2>} & w_{2,\{1,2,6\}}^{<2>} & v_{2,\{2,3\}}^{<2>} & \cdots \\ w_{3,\{1,2,3\}}^{<2>} & v_{3,\{1,3\}}^{<2>} & w_{3,\{1,3,4\}}^{<2>} & \cdots & w_{3,\{1,3,5\}}^{<2>} & w_{3,\{1,3,6\}}^{<2>} & v_{3,\{2,3\}}^{<2>} & \cdots \\ w_{4,\{1,2,4\}}^{<2>} & w_{4,\{1,3,4\}}^{<2>} & v_{4,\{1,4\}}^{<2>} & \cdots & w_{4,\{1,4,5\}}^{<2>} & w_{4,\{1,4,6\}}^{<2>} & w_{4,\{2,3,4\}}^{<2>} & \cdots \\ \hline w_{5,\{1,2,5\}}^{<2>} & w_{5,\{1,3,5\}}^{<2>} & w_{5,\{1,4,5\}}^{<2>} & \cdots & v_{5,\{1,5\}}^{<2>} & w_{5,\{1,5,6\}}^{<2>} & w_{5,\{2,3,5\}}^{<2>} & \cdots \\ w_{6,\{1,2,6\}}^{<2>} & w_{6,\{1,3,6\}}^{<2>} & w_{6,\{1,4,6\}}^{<2>} & \cdots & w_{6,\{1,5,6\}}^{<2>} & v_{6,\{1,6\}}^{<2>} & w_{6,\{2,3,6\}}^{<2>} & \cdots \end{bmatrix} \quad (53)$$

$$\begin{array}{cccccccc} \{2,4\} & \{2,5\} & \{2,6\} & & \{3,4\} & \{3,5\} & \{3,6\} & \\ w_{1,\{1,2,4\}}^{<2>} & w_{1,\{1,2,5\}}^{<2>} & w_{1,\{1,2,6\}}^{<2>} & \cdots & w_{1,\{1,3,4\}}^{<2>} & w_{1,\{1,3,5\}}^{<2>} & w_{1,\{1,3,6\}}^{<2>} & \cdots \\ v_{2,\{2,4\}}^{<2>} & v_{2,\{2,5\}}^{<2>} & v_{2,\{2,6\}}^{<2>} & \cdots & w_{2,\{2,3,4\}}^{<2>} & w_{2,\{2,3,5\}}^{<2>} & w_{2,\{2,3,6\}}^{<2>} & \cdots \\ w_{3,\{2,3,4\}}^{<2>} & w_{3,\{2,3,5\}}^{<2>} & w_{3,\{2,3,6\}}^{<2>} & \cdots & v_{3,\{3,4\}}^{<2>} & v_{3,\{3,5\}}^{<2>} & v_{3,\{3,6\}}^{<2>} & \cdots \\ v_{4,\{2,4\}}^{<2>} & w_{4,\{2,4,5\}}^{<2>} & w_{4,\{2,4,6\}}^{<2>} & \cdots & v_{4,\{3,4\}}^{<2>} & w_{4,\{3,4,5\}}^{<2>} & w_{4,\{3,4,6\}}^{<2>} & \cdots \\ \hline w_{5,\{2,4,5\}}^{<2>} & v_{5,\{2,5\}}^{<2>} & w_{5,\{2,5,6\}}^{<2>} & \cdots & w_{5,\{3,4,5\}}^{<2>} & v_{5,\{3,5\}}^{<2>} & w_{5,\{3,5,6\}}^{<2>} & \cdots \\ w_{6,\{2,4,6\}}^{<2>} & w_{6,\{2,5,6\}}^{<2>} & v_{6,\{2,6\}}^{<2>} & \cdots & w_{6,\{3,4,6\}}^{<2>} & w_{6,\{3,5,6\}}^{<2>} & v_{6,\{3,6\}}^{<2>} & \cdots \end{array}$$

$$\{4,5\} \quad \{4,6\} \quad \{5,6\}$$

-continued $$\begin{bmatrix} w_{1,\{1,4,5\}}^{<2>} & w_{1,\{1,4,6\}}^{<2>} & w_{1,\{1,5,6\}}^{<2>} \\ w_{2,\{2,4,5\}}^{<2>} & w_{2,\{2,4,6\}}^{<2>} & w_{2,\{2,5,6\}}^{<2>} \\ w_{3,\{3,4,5\}}^{<2>} & w_{3,\{3,4,6\}}^{<2>} & w_{3,\{3,5,6\}}^{<2>} \\ \hline v_{4,\{4,5\}}^{<2>} & v_{4,\{4,6\}}^{<2>} & w_{4,\{4,5,6\}}^{<2>} \\ \hline v_{5,\{4,5\}}^{<2>} & w_{5,\{4,5,6\}}^{<2>} & v_{5,\{5,6\}}^{<2>}=0 \\ w_{6,\{4,5,6\}}^{<2>} & v_{6,\{4,6\}}^{<2>} & v_{6,\{5,6\}}^{<2>}=0 \end{bmatrix}$$

The modified version of this signed determinant code is given by $$T_2 = T_{2_{\underset{T_0}{\leftarrow}}6\{6\}} = T_{2_{\underset{T_0}{\leftarrow}}6\{6\}} + \Delta_{6,\{6\}_{\underset{T_0}{\leftarrow}}}.$$

In summary, the secondary injection of $v_{6,\{1,2,5,6\}}^{<0>}$ is given by $$[T_2]_{5,\{1,2\}} = w_{5,\{1,2,5\}}^{(6,\{6\},T_0)} + v_{2,\{1,2,5,6\}}^{<0>} = w_{5,\{1,2,5\}}^{<2>} + v_{6,\{1,2,5,6\}}^{<0>}.$$

It is very important to mention that the child code $T_2$ is initially introduced for the primary injection of symbols $$\{v_{6,\{1,2,5,6\}}^{<0>}, v_{6,\{1,2,4,6\}}^{<0>}, v_{6,\{1,3,4,6\}}^{<0>}, v_{6,\{2,3,4,6\}}^{<0>}\} \subseteq \mathcal{G}_3(T_0),$$

while it is also used for secondary injection of some other symbols including $v_{6,\{1,2,5,6\}}^{<0>}$. For instance, followed from (20), the primary injection of $v_{6,\{1,2,3,6\}}^{<0>}$ with $x = 6$, $\bar{X} = \{1, 2, 3\}$ and $\underline{X} = \{6\}$ is given by $$[T_0]_{x,X} = v_{6,\{1,2,3,6\}}^{(0)} \xrightarrow{\times(-1)^{1+\sigma_{T_0}(3)+ind_{\{1,2,3,6\}}(3)}} \left[T_{2_{\underset{T_0}{\leftarrow}}6\{6\}}\right]_{3,\{1,2\}} = (-1)^{\sigma_{T_2}(3)} w_{3,\{1,2,3\}}^{(2;6,\{6\},T_0)},$$

which is performed into the same child code $T_2$. The matrix representing all the injections into $T_2$ is given in (54). Note that all the primary injections are performed into $\overline{T_2}$, and the secondary injections take place in $\underline{T_2}$.

$$\Delta_{6,\{6\}} \underset{T_0}{\leftarrow} = \begin{array}{c} \phantom{0} \\ 1 \\ 2 \\ 3 \\ 4 \\ \hline 5 \\ 6 \end{array} \begin{bmatrix} \{1,2\} & \{1,3\} & \{1,4\} & \{1,5\} & \{1,6\} & \{2,3\} & \{2,4\} & \{2,5\} & \{2,6\} & \{3,4\} & \\ 0 & 0 & 0 & 0 & 0 & \ldots & \ldots & 0 & 0 & 0 & 0 & \ldots & \ldots \\ 0 & 0 & 0 & 0 & 0 & \ldots & \ldots & 0 & 0 & 0 & 0 & \ldots & \ldots \\ v_{6,\{1,2,3,6\}}^{<0>} & 0 & 0 & 0 & 0 & \ldots & \ldots & 0 & 0 & 0 & 0 & \ldots & \ldots \\ v_{6,\{1,2,4,6\}}^{<0>} & v_{6,\{1,3,4,6\}}^{<0>} & 0 & 0 & 0 & \ldots & \ldots & v_{6,\{2,3,4,6\}}^{<0>} & 0 & 0 & 0 & \ldots & \ldots \\ \hline v_{6,\{1,2,5,6\}}^{<0>} & v_{6,\{1,3,5,6\}}^{<0>} & v_{6,\{1,4,5,6\}}^{<0>} & 0 & 0 & \ldots & \ldots & v_{6,\{2,3,5,6\}}^{<0>} & v_{6,\{2,4,5,6\}}^{<0>} & 0 & 0 & v_{6,\{3,4,5,6\}}^{<0>} & \ldots & \ldots \\ 0 & 0 & 0 & 0 & 0 & \ldots & \ldots & 0 & 0 & 0 & 0 & \ldots & \ldots \end{bmatrix} \quad (54)$$

$$\begin{array}{ccccc} \{3,5\} & \{3,6\} & \{4,5\} & \{4,6\} & \{5,6\} \end{array}$$

$$\begin{bmatrix} 0 & 0 & 0 & 0 & 0 \\ 0 & 0 & 0 & 0 & 0 \\ 0 & 0 & 0 & 0 & 0 \\ 0 & 0 & 0 & 0 & 0 \\ \hline 0 & 0 & 0 & 0 & 0 \\ 0 & 0 & 0 & 0 & 0 \end{bmatrix}$$

Finally, according to Definition 3, the symbols in $\underline{T_2}$ can be partitioned to $$\mathcal{G}_1(T_2) = \{v_{5,\{5,6\}}^{(2)}, v_{6,\{5,6\}}^{(2)}\}, \quad (55)$$

$$\mathcal{G}_2(T_2) = \left\{ \begin{array}{l} w_{5,\{1,2,5\}}^{(2)}, w_{5,\{1,3,5\}}^{(2)}, w_{5,\{1,4,5\}}^{(2)}, w_{5,\{2,3,5\}}^{(2)}, w_{5,\{2,4,5\}}^{(2)}, w_{5,\{3,4,5\}}^{(2)}, w_{6,\{1,2,6\}}^{(2)}, w_{6,\{1,3,6\}}^{(2)}, \\ w_{6,\{1,4,6\}}^{(2)}, w_{6,\{1,5,6\}}^{(2)}, w_{6,\{2,3,6\}}^{(2)}, w_{6,\{2,4,6\}}^{(2)}, w_{6,\{2,5,6\}}^{(2)}, w_{6,\{3,4,6\}}^{(2)}, w_{6,\{3,5,6\}}^{(2)}, w_{6,\{4,5,6\}}^{(2)} \end{array} \right\},$$

$$\mathcal{G}_3(T_2) = \{v_{5,\{1,5\}}^{(2)}, v_{5,\{2,5\}}^{(2)}, v_{5,\{3,5\}}^{(2)}, v_{5,\{4,5\}}^{(2)}, v_{6,\{1,6\}}^{(2)}, v_{6,\{2,6\}}^{(2)}, v_{6,\{3,6\}}^{(2)}, v_{6,\{4,6\}}^{(2)}\},$$

$$\mathcal{G}_4(T_2) = \{w_{5,\{1,5,6\}}^{(2)}, w_{5,\{2,5,6\}}^{(2)}, w_{5,\{3,5,6\}}^{(2)}, w_{5,\{4,5,6\}}^{(2)}\}.$$

The code segment $T_2$ has 3 child codes, namely, $T_9$, $T_{10}$, $T_{11}$. For instance, according to (22), the primary injection of $w_{5,\{2,5,6\}}^{<2>} \in \mathcal{G}_4(T_2)$ with x=5 and $\mathcal{X}=\{2,6\}$ takes place into a code of mode 0 with injection pair (5, {6}). This child code is called $T_{11}$ in FIG. 7. Therefore, $$[T_2]_{5,\{2,6\}} = (-1)^{\sigma T_2^{(5)}} w_{5,\{2,5,6\}}^{<2>} \xrightarrow{\times(-1)^{1+\sigma T_2^{(2)}+ind_{\{2,6\}}(2)}} [T_{11} \underset{\leftarrow T_2}{5,\{6\}}]_{2,\phi} = (-1)^{\sigma T_{11}^{(2)}} w_{2,\phi}^{(5,\{6\},T_2)} = 0.$$

Recall that for the code segment $T_{11}$ with mode($T_{11}$)=0, all the entries in the message matrix (before injection) are zero, as given in (56). Therefore the modified code is obtained by $$T_{11} = T_{11} + \Delta_{5\{6\}} \underset{\leftarrow T_2}{} = \Delta_{5\{6\}} \underset{\leftarrow T_2}{}.$$

The injection matrix $$\Delta_{5\{6\}} \underset{\leftarrow T_2}{}$$

is also given in (56).

$$\mathbb{T}_{11} = \begin{matrix} 1 \\ 2 \\ 3 \\ 4 \\ 5 \\ 6 \end{matrix} \begin{bmatrix} 0 \\ 0 \\ 0 \\ 0 \\ \overline{0} \\ 0 \end{bmatrix} \overset{\Delta_{5\{6\}}}{\longleftarrow} \mathbb{T}_2 = \begin{matrix} 1 \\ 2 \\ 3 \\ 4 \\ 5 \\ 6 \end{matrix} \begin{bmatrix} w_{5,\{1,5,6\}}^{<2>} \\ w_{5,\{2,5,6\}}^{<2>} \\ w_{5,\{3,5,6\}}^{<2>} \\ w_{5,\{4,5,6\}}^{<2>} \\ 0 \\ 0 \end{bmatrix}$$

The super-message matrix M may be obtained by concatenating all the code segments, as given in (48). Finally, the code may be obtained by multiplying this super-message matrix by the encoder matrix $\Psi$, i.e., $\mathcal{C} = \Psi \cdot M$, and the i-the row of $\mathcal{C}$ may be stored in node i.

Consider the data recovery from an arbitrary subset of k=4 nodes, say nodes in $\mathcal{K} = \{3,5,7,8\}$. By downloading and stacking the content of nodes in $\mathcal{K}$, the techniques described herein obtain $\Psi[\mathcal{K}, :] \cdot M$. Here $\Psi[\mathcal{K}, :]$ is the k×d sub-matrix of $\Psi$ consisting of rows indexed by $i \in \mathcal{K}$. Unlike the (n,k=d,d) signed determinant codes, this matrix is not square, and hence is not invertible. So, the techniques described herein cannot simply multiply retrieve M from $\Psi$ $[\mathcal{K}, :] \cdot M$. Nevertheless, using properties of the encoder matrix in Definition 2, $\Psi[\mathcal{K}, :]$ can be decomposed to $\Psi$ $[\mathcal{K}, :] = [\Gamma[\mathcal{K}, :] | Y[\mathcal{K}, :]]$, where $\Gamma[\mathcal{K}, :]$ is an invertible matrix. Multiplying the $\Psi[\mathcal{K}, :] \cdot M$ matrix by $\Gamma[\mathcal{K}, :]^{-1}$, $$\Gamma[\mathcal{K}, :]^{-1} \cdot (\Psi_{\mathcal{K}} \cdot M) = \Gamma[\mathcal{K}, :]^{-1} \cdot [\Gamma[\mathcal{K}, :] | Y[\mathcal{K}, :]] \cdot M \quad (57)$$

$$= [I_{k \times k} | \Gamma[\mathcal{K}, :]^{-1} Y[\mathcal{K}, :]] \cdot \begin{bmatrix} \overline{T_0} & \overline{T_1} & \dots & \overline{T_{14}} \\ \underline{T_0} & \underline{T_1} & \dots & \underline{T_{14}} \end{bmatrix}$$

-continued $$= \begin{bmatrix} \overline{T_0} + \Gamma[\mathcal{K}, :]^{-1} \cdot Y[\mathcal{K}, :] \underline{T_0} \\ \overline{T_1} + \Gamma Y[\mathcal{K}, :]^{-1} \cdot Y[\mathcal{K}, :] \cdot \underline{T_1} \\ \dots \\ \overline{T_{14}} + \Gamma[\mathcal{K}, :]^{-1} \cdot Y[\mathcal{K}, :] \cdot \underline{T_{14}} \end{bmatrix}.$$

The ultimate goal is to recover all entries of M from this equation.

The techniques described herein start with code segments at the lower level of the injection tree in FIG. 7, i.e., code segments with mode zero, namely, $T_6, \ldots, T_{14}$. Note that $\underline{T_6} = \underline{T_7} = \ldots = \underline{T_{14}} = 0$, since no injection takes place in the bottom part message matrices of mode m=0 (for instance see $$\Delta_{5\{6\}} \underset{\leftarrow T_2}{}$$

in (56)). Therefore, $$\overline{T_i} + \Gamma[\mathcal{K}, :]^{-1} \cdot Y[\mathcal{K}, :] \cdot \underline{T_i} = \overline{T_i} + \Gamma[\mathcal{K}, :]^{-1} \cdot Y[\mathcal{K}, :] \cdot 0 = \overline{T_i},$$

for i=6, . . . ,14, which implies the top parts $\overline{T_i}$ for i=16, . . . ,14 can be retrieved from (57).

Next, the techniques described herein decode the message matrix of code segments with mode 1. Without loss of generality, consider $T_5$. Recall from (51) and (52) that $[T_5]_{5,\{5\}} = [T_5]_{5,\{6\}} = [T_5]_{6,\{5\}} = [T_5]_{6,\{6\}} = 0$. That is, the bot- (56)

tom parts of columns {5} and {6} of $T_5$ indicated by are zero, and hence, the top parts of these columns can be recovered from (57). Then the techniques described herein can use the parity equation (7) to recover the remaining symbols in $\overline{T_5}$: $w_{5,\{1,5\}}^{<5>} = w_{1,\{1,5\}}^{<5>}$, $w_{5,\{2,5\}}^{<5>} = w_{2,\{2,5\}}^{<5>}$, etc. Once $\overline{T_5}$ is fully decoded, the techniques described herein can remove its contribution from $T5 + \Gamma[\mathcal{K}, :]^{-1} \cdot Y[\mathcal{K}, :] \cdot \underline{T_5}$, and recover entries of $\overline{T_5}$. Note that $T_4$ can be decoded in a similar fashion.

The next step consists of decoding message matrices of code segments with mode 2, i.e., $T_1$, $T_2$, and $T_3$. Here the techniques described herein focus on decoding $T_2$ for the sake of illustration. First, recall the partitioning of symbols in $\underline{T_2}$ given in (55), and the fact that symbols in $\mathcal{G}_1(T_2)$ are zero. Moreover, symbols in $\mathcal{G}_3(T_2) \cup \mathcal{G}_4(T_2)$ are injected into code segments $T_9$, $T_{10}$, and $T_{11}$, and can be recovered from the decoding of the lower mode codes. Therefore, the bottom parts of columns {1,6}, {2,6}, {3,6}, {4,6}, and {5,6} are known. From the bottom part and the collected information for data recovery $\overline{T_2} + \Gamma[\mathcal{K}, :]^{-1} \cdot Y[\mathcal{K}, :] \cdot \underline{T_2}$ the techniques described herein can also decode the top part of these columns. The techniques described herein scan the columns of $T_2$ (in (53) and (54)) from right to left, to find the first not-yet-decoded column of $T_2$, that is {4,5}. Note that the entry of $T_2$ at position (6, {4,5}) is given by $[T_2]_{6,\{4,5\}} =$ $\left[T_{2\xleftarrow{6,\{6\}}T_0}\right]_{6,\{4,5\}} = \left[T_{2\xleftarrow{6,\{6\}}T_0}\right]_{6,\{4,5\}} + \left[\Delta_{\xleftarrow{6\{6\}}T_0}\right]_{6,\{4,5\}} = (-1)^{\sigma_{T_2}(6)} w^{(2)}_{6,\{4,5,6\}} + 0.$ So, it suffice to find $w_{6,\{4,5,6\}}^{<2>}$, which can be obtained from the parity equation $w^{(2)}_{6,\{3,4,6\}} =$ $-w^{(2)}_{3,\{3,4,6\}} + w^{(2)}_{4,\{3,4,6\}} = -(-1)^{\sigma_{T_2}(3)}[T_2]_{3,\{4,6\}} + (-1)^{\sigma_{T_2}(4)}[T_2]_{4,\{3,6\}}.$ Note that the latter symbols are located in columns $\{5,6\}$ and $\{4,6\}$, which are already decoded. After decoding $[T_2]_{6,\{4,5\}}$, the entire column $\{4,5\}$ can be recovered.

Then the techniques described herein proceed with the recovery of not-yet-decoded columns. A similar procedure may be applied to column $\{3,5\}$. However, the decoding of column $\{3,4\}$ is more challenging, since the techniques described herein have two uncoded symbols, namely, $[T_2]_{5,\{3,4\}} = w_{5,\{3,4,5\}}^{<2>} + v_{6,\{3,4,5,6\}}^{<0>},$ (58)

$[T_2]_{6,\{3,4\}} = w_{6,\{3,4,6\}}^{<2>}.$ (59)

First note that $w_{6,\{3,4,6\}}^{<2>}$ can be found from the parity equation $w_{6,\{3,4,6\}}^{<2>} =$ $-w_{3,\{3,4,6\}}^{<2>} + w_{4,\{3,4,6\}}^{<2>} = -(-1)^{\sigma_{T_2}(3)}[T_2]_{3,\{4,6\}} + (-1)^{\sigma_{T_2}(4)}[T_2]_{4,\{3,6\}},$ since columns $\{4,6\}$ and $\{3,6\}$ are already decoded. The first term in (58) can be also found in a similar manner.

$w_{5,\{3,4,5\}}^{<2>} =$ (60)

$-w_{3,\{3,4,5\}}^{<2>} + w_{4,\{3,4,5\}}^{<2>} = -(-1)^{\sigma_{T_2}(3)}[T_2]_{3,\{4,5\}} + (-1)^{\sigma_{T_2}(4)}[T_2]_{4,\{3,5\}},$ where the latter symbols are located in columns $\{4,5\}$ and $\{3,5\}$, and hence already decoded.

In order to find the second term in (58), one may note that the injection of $v_{6,\{3,4,5,6\}}^{<0>}$ is secondary, and the same symbol is also primarily injected into position $(4, \{3\})$ of code segment $T_5$ (see (52)), i.e., $[T_5]_{4,\{3\}} = w_{4,\{3,4\}}^{<5>} - v_{6,\{3,4,5,6\}}^{<0>}.$ (61)

Recall that $\text{mode}(T_5)=1<2=\text{mode}(T_2)$, and hence $T_5$ is already decoded. Hence, $w_{4,\{3,4\}}^{<5>} = w_{3,\{3,4\}}^{<5>} = (-1)^{\sigma_{T_5}(3)}[T_5]_{3,\{4\}}.$ (62)

Therefore, the techniques described herein can retrieve $w_{4,\{3,4\}}^{<5>}$ from (62), and plug it into (61) to obtain $v_{6,\{3,4,5,6\}}^{<0>}$. Combining this with (60), the techniques described herein can decode both $[T_2]_{5,\{3,4\}}$ and $[T_2]_{6,\{3,4\}}$. Upon decoding the bottom part of column $\{3,4\}$, its top part can be recovered as before. Repeating a similar procedure the techniques described herein can decode all the columns of $T_2$. Once all three code segments of mode 1, i.e., $T_1$, $T_2$, and $T_3$ are decoded, the techniques described herein can proceed to the recovery of the root code segment $T_0$.

Assume a node f fails, and its codeword needs to be repaired using the repair data received from a set of helper nodes, say $\mathcal{H}$ with $|\mathcal{H}|=d$. The repair data sent by each helper node is simply the collection of the repair data sent for each code segment. Here each helper node $h \in \mathcal{H}$ sends $\cup_{i=0}^{14} \{\Psi_h \cdot T_i \cdot \Xi^{f,(m_i)}\}$ to node f, where $m_i$ is the mode of code $T_i$, e.g., $m_0=4$.

The content of node f may be reconstructed segment by segment. In contrast to the data recovery, the repair process is a top-to-bottom process. The process starts from the codeword segment (corresponding to the code segment with mode $\mu$ located at the root of the injection tree) of the failed node f. Note that no symbol is injected into $T_0=T_0$, and hence the repair of the first $\alpha^{(4)}=15$ symbols of node f is identical to that of a signed determinant code, as described in Proposition 2.

Once the segment corresponding to $T_0$ is repaired, the techniques described herein can proceed with the codeword segments corresponding to the child codes in the injection tree.

Let us focus on the repair of the symbol at position $\{2,3\}$ of the codeword segment corresponding to $T_2$, i.e., $[\Psi_f \cdot T_2]_{(2,3)} = \psi_{f,1} w^{(2)}_{1,\{1,2,3\}} + \psi_{f,2} v^{(2)}_{2,\{2,3\}} + \psi_{f,3} v^{(2)}_{3,\{2,3\}} + \psi_{f,4} w^{(2)}_{4,\{2,3,4\}} +$ (63)
$v^{(0)}_{3,\{2,3,4,6\}} + \psi_{f,5}(w^{(2)}_{5,\{2,3,5\}} + v^{(0)}_{6,\{2,3,5,6\}}) + \psi_{f,6} w^{(2)}_{6,\{2,3,6\}}$ Upon receiving the repair symbols, node f recovers $R^f(T_2) = T_2 \cdot \Xi^{f,(2)}$, where $\Xi^{f,(2)}$ is defined in (9). Following (26) for $\mathcal{J} = \{2,3\}$, $\sum_{x \in \{2,3\}} (-1)^{\sigma_{T_2}(x) + \text{ind}\{2,3\}(x)} [R^f(T_2)]_{x, \{2,3\} \setminus \{x\}} =$ (64)

$-[R^f(T_2)]_{2,\{3\}} + [R^f(T_2)]_{3,\{2\}} =$ $-\sum_{\substack{\mathcal{L} \subseteq [6] \\ |\mathcal{L}|=2}} [T_2]_{2,\mathcal{L}} \Xi^{f,(2)}_{\mathcal{L},\{3\}} + \sum_{\substack{\mathcal{L} \subseteq [6] \\ |\mathcal{L}|=2}} [T_2]_{3,\mathcal{L}} \Xi^{f,(2)}_{\mathcal{L},\{2\}} =$ $-\sum_{y \in \{1,2,4,5,6\}} [T_2]_{2,\{y,3\}} \Xi^{f,(2)}_{\{y,3\},\{3\}} + \sum_{y \in \{1,3,4,5,6\}} [T_2]_{3,\{y,2\}} \Xi^{f,(2)}_{\{y,2\},\{2\}} =$ $-(-\psi_{f,1} w^{(2)}_{2,\{1,2,3\}} - \psi_{f,2} v^{(2)}_{2,\{2,3\}} + \psi_{f,4} w^{(2)}_{2,\{2,3,4\}} + \psi_{f,5} w^{(2)}_{2,\{2,3,5\}} +$
$\psi_{f,6} w^{(2)}_{2,\{2,3,6\}}) + (-\psi_{f,1}(w^{(2)}_{3,\{1,2,3\}} + v^{(0)}_{6,\{1,2,3,6\}}) + \psi_{f,3}$
$v^{(2)}_{3,\{2,3\}} + \psi_{f,4} w^{(2)}_{3,\{2,3,4\}} + \psi_{f,5} w^{(2)}_{3,\{2,3,5\}} + \psi_{f,6} w^{(2)}_{3,\{2,3,6\}}) =$
$\psi_{f,1} w^{(2)}_{1,\{1,2,3\}} + \psi_{f,2} v^{(2)}_{2,\{2,3\}} + \psi_{f,3} v^{(2)}_{3,\{2,3\}} + \psi_{f,4} w^{(2)}_{4,\{2,3,4\}} +$
$\psi_{f,5} w^{(2)}_{5,\{2,3,4\}} + \psi_{f,6} w^{(2)}_{6,\{2,3,4\}} - \psi_{f,1} v^{(0)}_{6,\{1,2,3,6\}}$ Comparing (63) and (64), $[\Psi_f \cdot T_2]_{(2,3)} - \sum_{x \in \{2,3\}} (-1)^{+\sigma_{T_2}(x) + \text{ind}\{2,3\}(x)} [R^f(T_2)]_{x,\{2,3\} \setminus \{x\}} =$ (65)

$\psi_{f,1} v^{(0)}_{6,\{1,2,3,6\}} + \psi_{f,4} v^{(0)}_{6,\{2,3,4,6\}} + \psi_{f,5} v^{(0)}_{6,\{2,3,5,6\}}.$ That means, the code segment $T_2$ cannot be individually repaired. However, all the three terms in the difference above are symbols of the code segment $T_0$. Interestingly, the repair space of the parent code $T_0$ at position $(b, \mathcal{J} \cup \mathcal{B}) = (6, \{2,3,6\})$ includes $$-[R^f(T_0)]_{6,\{2,3,6\}} = -[R^f(T_0)]_{6,\{2,3\}\cup\{6\}} = \qquad (66)$$

$$-\sum_{\substack{\mathcal{L}\subseteq[6]\\|\mathcal{L}|=4}} [T_0]_{6,\mathcal{L}} \Xi^{f,(4)}_{\mathcal{L},\{2,3,6\}} = -\sum_{y\in\{1,4,5\}} [T_0]_{6,\{y,2,3,6\}} \Xi^{f,(4)}_{\{y,2,3,6\},\{2,3,6\}} =$$

$$\psi_{f,1} v^{(4)}_{6,\{1,2,3,6\}} + \psi_{f,4} v^{(4)}_{6,\{2,3,4,6\}} + \psi_{f,5} v^{(4)}_{6,\{2,3,5,6\}}.$$

Therefore, summing up (64) and (66), the techniques described herein can exactly recover the missing symbol in (63). A similar procedure can be used to repair all the other symbols and codeword segments of the failed node f.

Consider an arbitrary subset of nodes $\mathcal{K} \subseteq [n]$ with $|\mathcal{K}|=k$. Let $\Psi[\mathcal{K},:]$ denote the k×d sub-matrix formed by collecting corresponding k rows of $\Psi$. The collection of coded symbols stored in these k nodes can be written as $\Psi[\mathcal{K},:]\cdot M$. The goal is to recover the original message super-matrix M from the observed data $\Psi[\mathcal{K},:]\cdot M$.

The message super-matrix M consists of several code segments such as T, each operating at a mode m=mode(T). The message matrix T of a code segment operating at mode m is a d×$\alpha_m$ matrix and can be partitioned into $\overline{T}$ and $\underline{T}$, corresponding to the top k and bottom (d−k) rows of T, respectively. The data recovery is a bottom-to-top process. More precisely, the techniques described herein start by recovering the data symbols in the code segments at the lowest level of the injection tree (with the smallest mode) and proceed to the parent code segments, until the techniques described herein reach to the code segment at the root of the injection tree.

The message matrix T is a combination of an original signed determinant code T and the symbols injected from the parent code of T, namely P. More precisely, $$T_{b,\mathcal{B}}_{\leftarrow P} = T_{b,\mathcal{B}}_{\leftarrow P} + \Delta_{b,\mathcal{B}}_{\leftarrow P}.$$

Decoding this segment means decoding the entries of T, i.e., the combination of the original symbols and the injected symbols. The following lemma indicates the injected symbols can be easily separated from the original symbols.

Lemma 3 If a code segment $$T = T_{b,\mathcal{B}}_{\leftarrow P} = T_{b,\mathcal{B}}_{\leftarrow P} + \Delta_{b,\mathcal{B}}_{\leftarrow P}$$

is decoded (all entries of T are retrieved), then the symbols of the original signed determinant code $$T_{b,\mathcal{B}}_{\leftarrow P}$$

and the injected symbols $$\Delta_{b,\mathcal{B}}_{\leftarrow P}$$

can be uniquely extracted.

Proof of Lemma-\reflm:decode:separate: Recall that there is redundancy among the entries of T. The claim on this lemma follows from the fact that there is (at most) one injection into each parity group. To see that, recall (19), which implies an injection into position (x, $\mathcal{X}$) of T takes place only if x>max $\mathcal{Z}$. That means $\mathbf{T}_{x,\mathcal{X}}$ may be last w-symbol in the parity group $\{w_{y,\mathcal{X}\cup\{x\}}: y\in\mathcal{X}\cup\{x\}\}$. More precisely, for a position (x, $\mathcal{X}$), with x≤max$\mathcal{X}$, $$\left[\Delta_{b,\mathcal{B}}_{\leftarrow P}\right]_{x,\mathcal{X}} = 0, \left[T_{b,\mathcal{B}}_{\leftarrow P}\right]_{x,\mathcal{X}} = \left[T_{b,\mathcal{B}}_{\leftarrow P}\right]_{x,\mathcal{X}}.$$

Otherwise, if x>max$\mathcal{X}$, $$\left[T_{b,\mathcal{B}}_{\leftarrow P}\right]_{x,\mathcal{X}} =$$

$$(-1)^{\sigma_T(x)} w_{x,\mathcal{X}\cup\{x\}} = (-1)^{\sigma_T(x)+|\mathcal{X}|} \sum_{y\in\mathcal{X}} (-1)^{ind_\mathcal{X}(y)} w_{y,\mathcal{X}\cup\{x\}} =$$

$$(-1)^{\sigma_T(x)+|\mathcal{X}|} \sum_{y\in\mathcal{X}} (-1)^{\sigma_T(y)+ind_\mathcal{X}(y)} \left[T_{b,\mathcal{B}}_{\leftarrow P}\right]_{y,(\mathcal{X}\cup\{x\})\setminus\{y\}}.$$

Finally, once $$\left[T_{b,\mathcal{B}}_{\leftarrow P}\right]_{x,\mathcal{X}}$$

is recovered, the techniques described herein can find the injected symbol from $$\left[\Delta_{b,\mathcal{B}}_{\leftarrow P}\right]_{x,\mathcal{X}} = \left[T_{b,\mathcal{B}}_{\leftarrow P}\right]_{x,\mathcal{X}} - \left[T_{b,\mathcal{B}}_{\leftarrow P}\right]_{x,\mathcal{X}}.$$

Now consider an arbitrary code segment T. Note that the coded symbols in the codeword segment corresponding to T can be represented as $$\Psi[\mathcal{K},:]\cdot T = [\Gamma[\mathcal{K},:] \mid Y[\mathcal{K},:]]\begin{bmatrix}\overline{T}\\ \underline{T}\end{bmatrix}, \qquad (67)$$

where $\Gamma[\mathcal{K},:]$ is an invertible matrix. Multiplying both sides of (67) by $\Gamma[\mathcal{K},:]^{-1}$, $$\Gamma[\mathcal{K},:]^{-1}\cdot\Psi[\mathcal{K},:]\cdot T = [I \mid \Gamma[\mathcal{K},:]^{-1}\cdot Y[\mathcal{K},:]]\begin{bmatrix}\overline{T}\\ \underline{T}\end{bmatrix} = \qquad (68)$$

$$\overline{T} + \Gamma[\mathcal{K},:]^{-1}\cdot Y[\mathcal{K},:]\cdot\underline{T}.$$

Note that (68) holds for every column of T. More precisely, for a column of T labeled by $\mathcal{X}$, the data collector observes $$\overline{\mathbf{T}}_\mathcal{X} + \Gamma[\mathcal{K},:]^{-1}\cdot Y[\mathcal{K},:]\cdot\underline{\mathbf{T}}_\mathcal{X}, \qquad (69)$$

where $\overline{\mathbf{T}}_\mathcal{X}$ is the k×1 column and $\underline{\mathbf{T}}_\mathcal{X}$ is a (d−k)×1 column. Therefore, for each column $\mathbf{T}_\mathcal{X}$ upon decoding $\underline{\mathbf{T}}_\mathcal{X}$, the techniques described herein can compute the term $\Gamma[\mathcal{K},:]^{-1}\cdot Y[\mathcal{K},:]\cdot\underline{\mathbf{T}}_\mathcal{X}$, and cancel it from (69) to obtain $\overline{\mathbf{T}}_\mathcal{X}$, and fully decode $\mathbf{T}_\mathcal{X}$.

Algorithm 1: Construction of Cascade Codes Super-Message Matrix
Input: Parameters k, d and $\mu$
Output: Super-Message Matrix (M) of a cascade code operating at mode $\mu$ 1: $\mathbb{T}_0 \leftarrow$ SGNDETCODEMSGMAT $(d, \mu, o_{1 \times d})$; add $\mathbb{T}_0$ to UnivisitedNodeCollection;

2: $\Delta_0 \leftarrow O_{dx\binom{d}{\mu}}$; $T_0 \leftarrow \mathbb{T}_0 + \Delta_0$; $M \leftarrow T_0$;

3: while there exists a node $\mathbb{P}$ in UnvisitedNodeCollection do
4:    for each $\mathcal{B} \subseteq [k+1:d]$ with $|\mathcal{B}| <$ mode $(\mathbb{P})$ do
5:       $m \leftarrow$ mode $(\mathbb{P}) - |\mathcal{B}| - 1$;
6:       for each $x \in [k+1:d]$ with $x \leq \max \mathcal{B}$ do
7:          for $i \leftarrow 1$ to d do $\sigma_{\mathbb{Q}}(i) \leftarrow 1 + \sigma_{\mathbb{Q}}(i) + \text{ind}_{\mathcal{B} \cup \{t\}}(i)$;
8:          $\mathbb{Q}_{\leftarrow \mathbb{P}}^{x,\mathcal{B}} \leftarrow$ SGNDETCODEMSGMAT$(k, d, m, \sigma_\mathbb{Q})$;
9:          $\mathbb{Q}_{\leftarrow \mathbb{P}}^{x,\mathcal{B}} \leftarrow$ INJECTIONMAT$(d, m, x, \mathcal{B}, \mathbb{P})$;
10:         $\mathbb{Q}_{\leftarrow \mathbb{P}}^{x,\mathcal{B}} \leftarrow \mathbb{Q}_{\leftarrow \mathbb{P}}^{x,\mathcal{B}} + \Delta_{\leftarrow \mathbb{P}}^{x,\mathcal{B}}$;
11:         $M \leftarrow [M | \mathbb{Q}_{\leftarrow \mathbb{P}}^{x,\mathcal{B}}]$; add $\mathbb{Q}_{\leftarrow \mathbb{P}}^{x,\mathcal{B}}$ to UnvisitedNodeCollection;
12:       end
13:    end
14:    remove $\mathbb{P}$ from UnvisitedNodeCollection;
15: end
16: return M;
17: Procedure SGNDETCODEMSGMAT$(k, d, m, \sigma_D)$:
18:    for $x \leftarrow 1$ to d do
19:       for each $I \subseteq [d]$ with $|I| = m$ do
20:          if $x \in [k+1:d]$ and $I \cap [k] = \phi$ then $\mathbb{D}_{x,I} \leftarrow 0$;
21:          else If $x \in I$ then $\mathbb{D}_{x,I} \leftarrow (-1)^{\sigma_D(x)} v_{x,I}^{(\mathcal{B})}$;
22:          else $\mathbb{D}_{x,I} \leftarrow (-1)^{\sigma_D(x)} w_{x,\{x\} \cup I}^{(\mathcal{B})}$;
23:       end
24:    end
25: return $\mathbb{D}$;
26: Procedure INJECTIONMAT$(d, m, x, \mathcal{B}, \mathbb{P})$:
27:    for $x \leftarrow 1$ to d do
28:       for each $I \subseteq [d]$ with $|I| = m$ do
29:          if $i > \max I$, $i \notin \mathcal{B}$, $I \cap B = \phi$ then $\Delta_{t,l} \leftarrow (-1)^{1+\sigma_\mathbb{P}(t)+\text{ind}_{I \cup \{t\} \cup \mathcal{P}(t)}} \mathbb{P}_{x,I \cup \{t\} \cup \mathcal{B}}$
30:          else $\Delta_{t,J} \leftarrow 0$;
31:       end
32:    end
33: return $\Delta$;

The general decoding procedure includes the following stages:

1. Recursive decoding across code segments, from segments with mode 0 to those with higher modes, until the techniques described herein reach the root of the tree;
2. Within each code segment, the techniques described herein decode the columns recursively, according to the reverse lexicographical order; For each column labeled by $\mathcal{X}$:

(a) The techniques described herein first decode the entries at the bottom part of column $\mathcal{X}$ belonging to $\mathbf{T}_\mathcal{X}$ ($\mathcal{G}_1$) to zero.

(b) The entries of the bottom part of column $\mathcal{X}$ that belong to either $\mathcal{G}_3(\mathbf{T}_\mathcal{X})$ or $\mathcal{G}_4(\mathbf{T}_\mathcal{X})$ may be decoded using the child codes (who have a lower mode, and hence already decoded).

(c) Then the techniques described herein decode the entries of the bottom part of column $\mathcal{X}$ belonging to group $\mathcal{G}_2(\mathbf{T}_\mathcal{X})$, using the child codes and the parity equation. To this end, the techniques described herein need to use the symbols in columns $\mathcal{Y}$ where $\mathcal{Y} \succ \mathcal{X}$.

(d) Once the lower part of column $\mathcal{X}$ is decoded, the techniques described herein can recover its upper by canceling $\mathbf{T}_\mathcal{X}$ from the collected data in (69).

The techniques described herein start with the following lemma, which guarantees that the decoding procedure explained above can start.

Lemma 4: There is no injection to the bottom part of any code segment of mode 0.

Proof of Lemma~\reflm:bottom-mode0: Consider a code with message matrix T with mode(T)=0, which is introduced by its parent P via injection pair (b, $\mathcal{B}$). Note that the only column of T is indexed by ø. According to (19), a possible injection to position (x, ø) of T may be $$P_{b,\varnothing \cup \{x\} \cup \mathcal{B}} = P_{b,\{x\} \cup \mathcal{B}}$$

(up to a sign). For a position in the lower part of T, the techniques described herein have $x \in [k+1:d]$. This together with $\mathcal{B} \subseteq [k+1:d]$ implies that $$P_{b,\{x\} \cup \mathcal{B}}$$

$\in \mathcal{G}_1(P)$ (see Definition 3), and hence, this symbol is set to zero, and not injected.

Based on this lemma, the stage (i) of decoding can be started, the techniques described herein recover symbols in the message matrices of codes with mode 0. Next, consider decoding a code segment T with mode(T)=m. Assume that all the message matrices with mode less than m, including all the child codes of T are already decoded. Stage (ii) of the decoding procedure can be performed as follows.

$\_P_{x,\mathcal{X}} \in \mathcal{G}_1(T)$: Recall that symbols in the first group are set to zero. Hence, no recovery is needed.

$\_P_{x,\mathcal{X}} \in \mathcal{G}_3(T) \text{Å} \mathcal{G}_4(T)$: For a symbol $P_{x,\mathcal{X}}$ in groups $\mathcal{G}_3$ or $\mathcal{G}_4$ the techniques described herein have 1. no injection is performed to position (x, $\mathcal{X}$) of T.

2. $T_{x,\mathcal{X}}$ is injected into a chide code Q of T, and hence, it can be recovered from the decoded child code.

To see (1), recall the injection equation (19), which implies a host position (x, $\mathcal{X}$) may satisfy x>max$\mathcal{X}$, which is in contradiction with x∈$\mathcal{X}$ for $\mathcal{G}_3$ and with x<max$\mathcal{X}$ for $\mathcal{G}_4$. Moreover, (2) is followed from Lemma 3.

The last column of the code segment message matrix T of mode m is labeled by $$\mathcal{X} = [d-m+1:d].$$

If a symbol $T_{x,\mathcal{X}}$ in the lower (d−k) rows of this column belongs to group $\mathcal{G}_2(T)$, then it may satisfy x>max$\mathcal{X}$ =d, which is not possible. This argument shows that the last column has no element from $\mathcal{G}_2$, and hence is fully decoded as the only possible entries are from $\mathcal{G}_1$, $\mathcal{G}_3$ or $\mathcal{G}_4$.

Consider an arbitrary column $\mathcal{X} \subseteq [d]$ with $|\mathcal{X}|=m$, and an element $T_{x,\mathcal{X}} \in \mathcal{G}_{2,2}$, i.e., x∈[k+1: d] and x>max$\mathcal{X}$. The goal is to decode $T_{x,\mathcal{X}}$. First, note that position (x, $\mathcal{X}$) may be hosting a (secondary) injection from the parent code P. According to (19)

$$T_{x,\mathcal{X}} = \left[T_{b,\mathcal{B}}\underset{\leftarrow P}{}\right]_{x,\mathcal{X}} = \left[T_{b,\mathcal{B}}\underset{\leftarrow P}{}\right]_{x,\mathcal{X}} + \Delta_{b,\mathcal{B}}\underset{\leftarrow P}{} = (-1)^{\sigma_T(x)} w_{x,\mathcal{X}\cup\{x\}} + (-1)^{1+\sigma_P(x)+ind_{\mathcal{X}\cup\{x\}\cup\mathcal{B}(x)}} P_{b,\mathcal{X}\cup\{x\}\cup\mathcal{B}} x \notin \mathcal{B}, \mathcal{X} \cap \mathcal{B} = \varnothing \quad (70)$$

So, in order to decode $T_{x,\mathcal{X}}$ the techniques described herein need to find both $T_{x,\mathcal{X}}$ and the injected symbol $P_{b,\mathcal{X}\cup\{x\}\cup\mathcal{B}}$. However, note that this injection is a secondary one for $P_{b,\mathcal{X}\cup\{x\}\cup\mathcal{B}}$, since the injection position is in the lower part of the child code. This symbol is also primarily injected into another child code Q with mode satisfying $$\text{mode}(Q) = |\overline{\mathcal{X} \cup \{x\} \cup \mathcal{B}}| - 1 \quad (71)$$

$$= |\overline{\mathcal{X}}| + |\overline{\{x\}}| + |\overline{\mathcal{B}}| - 1 = |\overline{\mathcal{X}}| - 1 \quad (72)$$

$$< |\overline{\mathcal{X}}| < |\mathcal{X}| = \text{mode}(T) \quad (73)$$

where (71) follows the primary injections in (20) and (22), (72) follows the facts that x∈[k+1: d] and $\mathcal{B} \subseteq [k+1: d]$, and (73) holds since columns of T are indexed by subsets of size $|\mathcal{X}|$. Therefore, (73) immediately implies the child code hosting the primary injection of $P_{b,\mathcal{X}\cup\{x\}\cup\mathcal{B}}$ has a lower mode, and hence is already decoded before the techniques described herein decode T. Therefore, the injected symbol $P_{b,\mathcal{X}\cup\{x\}\cup\mathcal{B}}$ is known.

The second term in (70) can be decoded using the parity equation (7). Note that, $w_{x,\mathcal{X}\cup\{x\}}$ satisfies a parity equation along with $\{w_{y,\mathcal{X}\cup\{x\}}: y \in \mathcal{X}\}$. Each w-symbol $w_{y,\mathcal{X}\cup\{x\}}$ is located in column $\mathcal{Y} = (\mathcal{X} \cup \{x\}) \setminus \{y\}$, i.e., y in $\mathcal{X}$ is replaced by x in $\mathcal{Y}$. Since x>y, the lexicographical order between $\mathcal{X}$ and $\mathcal{Y}$ satisfies $\mathcal{X} \prec \mathcal{Y}$. Therefore, due to the recursive procedure, every symbol in column $\mathcal{Y}$ including $T_{y,\mathcal{Y}}$ is already decoded. This allows us to retrieve $T_{x,\mathcal{X}}$ from $$T_{x,\mathcal{X}} = (-1)^{\sigma_T(x)+|\mathcal{X}|+1} \sum_{y \in \mathcal{X}} (-1)^{\sigma_T(y)+ind_{\mathcal{X}\cup\{x\}}(y)} T_{x,(\mathcal{X}\cup\{x\})\setminus\{y\}}.$$

Once both terms in (70) are found, the techniques described herein can decode $T_{x,\mathcal{X}}$. A similar decoding rule can be applied to each symbol in the lower part of column $\mathcal{X}$ that belongs to $\mathcal{G}_2(T)$. Once all symbols in $\underline{T}_{\mathcal{X}}$ are decoded, the techniques described herein can use (69) to obtain $\overline{T}_{\mathcal{X}}$. This may complete the recovery of column $T_{\mathcal{X}}$. Then the techniques described herein can proceed with the next column of T until the message matrix T is fully decoded.

---

Algorithm 2: Data Recovery algorithm
Input: Stacked contents of $\mathcal{K}$nodes $\mathcal{K} \subseteq [n]$ in the form of $\Psi [\mathcal{K},:]$, M.
Output : Recovered data file (entries of the super message matrix M).

```
1:  M ← [ ];
2:  for m ← 0 to μ do
3:  |   for each Ψ [𝒦,:] S_{y,y} ⇌_p in Ψ[𝒦,:] · M with mode (S_{y,y} ⇌_p) = m do ▷ Loop 1
4:  |   |   S_{y,y} ⇌_p ← DECODESEGMENT(Ψ[𝒦,:] · S_{y,y} ⇌_p); ▷ Loop 2
5:  |   |   M ← S_{y,y} ⇌_p[M];
6:  |   |   S_{y,y} ⇌_p, Δ_{y,y} ⇌_p ← GETDELTAS(S_{y,y} ⇌_p); ▷ Globally store S_{y,y} ⇌_p and Δ_{y,y} ⇌_p
7:  |   end
8:  end
9:  return M ;
10: Procedure DECODESEGMENT(Ψ 𝒦,:] · S_{y,y} ⇌_p):
11: |   for each I ⊆ [d] with [I] = m in the reverse lexicographical order do
12: |   |   [S]_{:,I} ← DECODECOLUMNBOTTOM (Ψ[𝒦,:] · S_{y,y} ⇌_p,I);
13: |   |   S_{:,I} ← r𝒦,:]^{-1} · [Ψ 𝒦,:] · S]_{:,I}... ▷ Decode upper part using (73)
    |   |   ... −r[𝒦,:]^{-1} · Ψ [𝒦,:] · [S]_{:,I};
14: |   end
```

-continued

Algorithm 2: Data Recovery algorithm
Input: Stacked contents of $\mathcal{K}$nodes $\mathcal{K} \subseteq$ [n] in the form of $\Psi$ [$\mathcal{K}$,:], M.
Output : Recovered data file (entries of the super message matrix M).

15: $\quad \underline{S}_{(y,\underline{y})_\mathbb{P}} \leftarrow \begin{bmatrix} \bar{S} \\ \underline{S} \end{bmatrix}$ 16: return $\underline{S}_{y,\underline{y}_\mathbb{P}}$ 17: Procedure DECODECOLUMNBOTTOM ($\Psi$ $\mathcal{K}$,:] $\cdot$ $\underline{S}_{y,\underline{y}_\mathbb{P}}$, I):

18: $\quad \mathcal{A} \leftarrow I \cap [k]; \mathcal{B} \leftarrow I \cap [k+1:d]$;

19: $\quad$ for $x \leftarrow k+1$ to $d$ do

20: $\quad\quad$ if $x \leq \max \mathcal{B}$ and $\mathcal{A} \neq \phi$ then    ▷ Symbol belonging to $\mathcal{G}_1(\underline{S})$ 21: $\quad\quad\quad [\underline{S}]_{x,I} \leftarrow (-1)^{1+\sigma_S(\max \mathcal{A}) + \text{ind}_{\mathcal{A} \cup \mathcal{B}}(\max \mathcal{A})} \left[ \underline{\Delta}_{x,\mathcal{B}} \right]_{\max \mathcal{A}, \mathcal{A} \setminus \{\max \mathcal{A}\}}$ ... ▷ Get injected symbol using (17)

22: $\quad\quad$ else if $x \leq \max \mathcal{B}$ and $\mathcal{A} = \phi$ then    ▷ Symbol belonging to $\mathcal{G}_2(\underline{S})$ 23: $\quad\quad\quad [\underline{S}]_{x,I} \leftarrow 0$ 24: $\quad\quad$ else if $x \leq \max \mathcal{B}$ then    ▷ Symbol belonging to $\mathcal{G}_3(\underline{S})$ 25: $\quad\quad\quad [\underline{S}]_{x,I} \leftarrow (-1)^{\sigma_S(x)+m} \sum_{t \in I} (-1)^{\sigma_S(t)+\text{ind}_{I \cup \{x\}}(t)} \left[ \underline{S}_{y,\underline{y}_\mathbb{P}} \right]_{t,(I \cup \{x\}) \setminus \{t\}}$ 26: $\quad\quad\quad$ if $x \notin \mathcal{Y}$ and $I \cap \mathcal{Y} = \phi$ and $m > 0$ then ▷ A symbol is injected into $[\underline{s}]_{x,I}$ 27: $\quad\quad\quad\quad B = B \cup \{x\} \cup \mathcal{Y} \mathbb{F}_{y,I \cup \{x\} \cup y} \leftarrow \ldots$ ▷ Get injected symbol $\quad\quad\quad\quad \ldots (-1)^{1+\sigma_\mathbb{P}(\max \mathcal{A}) + \text{ind}_{\mathcal{A} \cup \mathcal{B}}(\max \mathcal{A})} \left[ \underline{\Delta}_{y,\mathcal{B}'} \right]_{\max \mathcal{A}, \mathcal{A} \setminus \{\max \mathcal{A}\}}$ 28: $\quad\quad\quad\quad \left[ \underline{\Delta}_{y,\underline{y}_\mathbb{P}} \right]_{x,I} \leftarrow (-1)^{1+\sigma_\mathbb{P}(x) + \text{ind}_{I \cup \{x\} \cup y}(x)} \mathbb{F}_{y,I \cup \{x\} \cup y} [\underline{S}]_{x,I} \leftarrow [\underline{S}]_{x,I} \ldots$ $\quad\quad\quad\quad \ldots + \left[ \underline{\Delta}_{y,\underline{y}_\mathbb{P}} \right]_{x,I'}$ 29: $\quad\quad\quad$ end 30: $\quad\quad$ end 31: $\quad$ end 32: return $[\underline{S}]_{:,I}$ 36: Procedure GETDELTAS $\left( \underline{S}_{y,\underline{y}_\mathbb{P}} \right)$:

37: $\quad m \leftarrow \text{mode}(\underline{S}_{y,\underline{y}_\mathbb{P}})$;

38: $\quad$ for $i \leftarrow 1$ to $d$ do

39: $\quad\quad$ for $I \subseteq [d+1]$ with $|I| = m$ do

40: $\quad\quad\quad$ if $i > \max X$ and $i \in \mathcal{Y}$ and $I \cap Y = \phi$ then 41: $\quad\quad\quad\quad \left[ \underline{\mathbb{S}}_{y,\underline{y}_\mathbb{P}} \right]_{i,I} \leftarrow (-1)^{\sigma_S(i)+m} \sum_{t \in I} (-1)^{\sigma_S(t) + \text{ind}_I(t)} \left[ \underline{S}_{y,\underline{y}_\mathbb{P}} \right]_{t,(I \cup \{i\}) \setminus \{t\}}$ 42: $\quad\quad\quad$ else 43: $\quad\quad\quad\quad \left[ \underline{\mathbb{S}}_{y,\underline{y}_\mathbb{P}} \right]_{i,I} \leftarrow \left[ \underline{S}_{y,\underline{y}_\mathbb{P}} \right]_{i,I}$ 44: $\quad\quad\quad$ end 45: $\quad\quad\quad \left[ \underline{\Delta}_{y,\underline{y}_\mathbb{P}} \right]_{i,I} \leftarrow \left[ \underline{S}_{y,\underline{y}_\mathbb{P}} \right]_{i,I} - \left[ \underline{\mathbb{S}}_{y,\underline{y}_\mathbb{P}} \right]_{i,I}$;

46: $\quad\quad$ end

47: $\quad$ end

48: return $\underline{\mathbb{S}}_{y,\underline{y}_\mathbb{P}}, \underline{\Delta}_{y,\underline{y}_\mathbb{P}}$ where $R^f(Q)$ is the repair space of the code segment Q, and $R^f(P)$ is the repair space of its parent code segment.

Note that for positions $\mathcal{J}$ that have an overlap with $\mathcal{B}$ (the second injection parameter), the repair identity above reduces to (11), and the repair may be performed as in an ordinary signed determinant code. For positions $\mathcal{J}$ which are disjoint from $\mathcal{B}$, the original repair equation has an interference caused by the injected symbols. However, this interference can be canceled using the repair space of the parent code.

In this section, the techniques described herein may show that upon failure of any node, its content can be exactly reconstructed by accessing d helper nodes and downloading $\beta(d, k; \mu)$ symbols from each. More formally, the techniques described herein prove that for any failed node $f \in [n]$, any symbol at position $\mathcal{J}$ of any code segment $$Q_{\underset{\leftarrow P}{b,\mathcal{B}}}^{(m)}$$

of node f can be repaired using identity (26)

$$\left[\Psi_f \cdot Q_{\underset{\leftarrow P}{b,\mathcal{B}}}\right]_{\mathcal{J}} = \sum_{x \in \mathcal{J}} (-1)^{\sigma_Q(x) + \mathrm{ind}_{\mathcal{J}}(x)} [R^f(Q)]_{x,\mathcal{J}\setminus\{x\}} - \begin{pmatrix} [R^f(P)]_{b,\mathcal{J} \cup \mathcal{B}} & \text{if } \mathcal{J} \cup \mathcal{B} = \varnothing, \\ 0 & \text{otherwise,} \end{pmatrix}$$

The formal proof of identity (26) is given in the following.

Proof of Proposition~\refprop:nkd:repair. Let node f fails, and its content needs to be repaired using the repair data received from the helper nodes in $\mathcal{H}$ with $|\mathcal{H}|=d$. The content of node f may be reconstructed segment by segment.

Consider a code segment $$Q = Q_{\underset{\leftarrow P}{b,\mathcal{B}}},$$

that is a determinant code with mode m and injection pair (b, $\mathcal{B}$), into which symbols from its parent code P with mode (P)=j are injected. Recall that the corresponding code segment matrix can be written as $$Q_{\underset{\leftarrow P}{b,\mathcal{B}}} = Q_{\underset{\leftarrow P}{b,\mathcal{B}}} + \Delta_{\underset{\leftarrow P'}{b,\mathcal{B}}}$$

where the first term is a signed determinant code and the second term indicates the contribution of injection. For a given position $\mathcal{J}$ within this codeword segment, with $\mathcal{J} \subseteq [d]$ with $|\mathcal{J}|=m$, the corresponding symbol of the failed node is given by $$\left[\Psi_f \cdot Q_{\underset{\leftarrow P}{b,\mathcal{B}}}\right]_{\mathcal{J}} = \left[\Psi_f \cdot Q_{\underset{\leftarrow P}{b,\mathcal{B}}}\right]_{\mathcal{J}} + \left[\Psi_f \cdot \Delta_{\underset{\leftarrow P'}{b,\mathcal{B}}}\right]_{\mathcal{J}}.$$

As it is clear from (26), the repair of segment Q of the codeword of f may be performed similar to that of the determinant codes using the repair space $R^f(Q)=Q \cdot \Xi^{f,(m)}$, together with a correction using the repair space of the repair of the parent code, that is $R^f(P)=P \cdot \Xi^{f,(j)}$. Note that the latter correction may take care of the deviation of the code segment from the standard determinant code which is caused by injection of the symbols from the parent code P.

The techniques described herein start with the first term in the right-hand-side of (26), which is $$\sum_{x \in \mathcal{J}} (-1)^{\sigma_Q(x) + \mathrm{ind}_{\mathcal{J}}(x)} [R^f(Q)]_{x,\mathcal{J}\setminus\{x\}} = \sum_{x \in \mathcal{J}} (-1)^{\sigma_Q(x) + \mathrm{ind}_{\mathcal{J}}(x)} \left[Q_{\underset{\leftarrow P}{b,\mathcal{B}}} \Xi^{f,(m)}\right]_{x,\mathcal{J}\setminus\{x\}} \quad (74)$$

$$= \sum_{x \in \mathcal{J}} (-1)^{\sigma_Q(x) + \mathrm{ind}_{\mathcal{J}}(x)} \left[Q_{\underset{\leftarrow P}{b,\mathcal{B}}} \Xi^{f,(m)}\right]_{x,\mathcal{J}\setminus\{x\}} +$$

$$\sum_{x \in \mathcal{J}} (-1)^{\sigma_Q(x) + \mathrm{ind}_{\mathcal{J}}(x)} \left[\Delta_{\underset{\leftarrow P}{b,\mathcal{B}}} \Xi^{f,(m)}\right]_{x,\mathcal{J}\setminus\{x\}}$$

$$= \left[\Psi_f \cdot Q_{\underset{\leftarrow P}{b,\mathcal{B}}}\right]_{\mathcal{J}} + \sum_{x \in \mathcal{J}} (-1)^{\sigma_Q(x) + \mathrm{ind}_{\mathcal{J}}(x)} \left[\Delta_{\underset{\leftarrow P}{b,\mathcal{B}}} \Xi^{f,(m)}\right]_{x,\mathcal{J}\setminus\{x\}} \quad (75)$$

where (74) holds due to the linearity of the operations, and (75) used Proposition 2 for the repair of $$Q_{b,\mathcal{B} \leftarrow P}$$

which is a (d; m) signed determinant code with signature vector $\sigma_Q$. Therefore, proving the claimed identity reduces to show $$\text{Term}_1 - \text{Term}_2 = \text{Term}_3, \tag{76}$$

where $\text{Term}_1 = \left[\Psi_f \Delta_{b,\mathcal{B} \leftarrow P}\right]_{\mathcal{J}}$ (77)

$$\text{Term}_2 = \sum_{x \in \mathcal{J}} (-1)^{\sigma_Q(x)+\text{ind}_{\mathcal{J}}(x)} \left[\Delta_{b,\mathcal{B} \leftarrow P} \Xi^{f,(m)}\right]_{x,\mathcal{J}\setminus\{x\}}$$

$$\text{Term}_3 = -\left[R^f(P)\right]_{b,\mathcal{J} \cup \mathcal{B}} 1\{\mathcal{J} \cap \mathcal{B} = \emptyset\}$$

Note that all the data symbols appearing in (77) belong the parent code segment matrix P. The techniques described herein can distinguish the following two cases in order to prove (76).

Case I: $\mathcal{J} \cap \mathcal{B} = \emptyset$: Starting by $\text{Term}_1$ $$\text{Term}_1 = \left[\Psi_f \Delta_{b,\mathcal{B} \leftarrow P}\right]_{\mathcal{J}} = \sum_{y \in [d]} \psi_{f,y} \left[\Delta_{b,\mathcal{B} \leftarrow P}\right]_{y,\mathcal{J}}$$

$$= \sum_{y \in [\max\mathcal{J}+1:d] \setminus \mathcal{B}} \psi_{f,y} \left[\Delta_{b,\mathcal{B} \leftarrow P}\right]_{y,\mathcal{J}} \tag{78}$$

$$= \sum_{y \in [\max\mathcal{J}+1:d] \setminus \mathcal{B}(\mathcal{J} \cup \mathcal{B})} \psi_{f,y} \left[\Delta_{b,\mathcal{B} \leftarrow P}\right]_{y,\mathcal{J}} \tag{79}$$

$$= \sum_{y \in [\max\mathcal{J}+1:d] \setminus (\mathcal{J} \cup \mathcal{B})} (-1)^{1+\sigma_P(y)+\text{ind}_{\mathcal{J} \cup \{y\} \cup \mathcal{B}}(y)} \psi_{f,y} P_{b,\mathcal{J} \cup \{y\} \cup \mathcal{B}}, \tag{80}$$

where (78) follows the definition of the injection symbols in (19) which implies a non-zero injection occurs at position $(y, \mathcal{J})$ only if $y > \max\mathcal{J}$ and $y \notin \mathcal{B}$; (79) holds since $[\max\mathcal{J}+1:d] \cap \mathcal{J} = \emptyset$; and in (80) the techniques described herein plugged in the entries of $$\Delta_{b,\mathcal{B} \leftarrow P}$$

from (19).

Next, for $\text{Term}_2$ $$\text{Term}_2 = \sum_{x \in \mathcal{J}} (-1)^{\sigma_Q(x)+\text{ind}_{\mathcal{J}}(x)} \left[\Delta_{b,\mathcal{B} \leftarrow P} \Xi^{f,(m)}\right]_{x,\mathcal{J}\setminus\{x\}}$$

$$= \sum_{x \in \mathcal{J}} (-1)^{\sigma_Q(x)+\text{ind}_{\mathcal{J}}(x)} \sum_{\substack{\mathcal{L} \subseteq [d] \\ |\mathcal{L}|=m}} \left[\Delta_{b,\mathcal{B} \leftarrow P}\right]_{x,\mathcal{L}} \left[\Xi^{f,(m)}\right]_{\mathcal{L},\mathcal{J}\setminus\{x\}}$$

$$= \sum_{x \in \mathcal{J}} (-1)^{\sigma_Q(x)+\text{ind}_{\mathcal{J}}(x)} \sum_{\substack{y \in [d] \\ y \notin \mathcal{J}\setminus\{x\}}} \left[\Delta_{b,\mathcal{B} \leftarrow P}\right]_{x,(\mathcal{J}\setminus\{x\}) \cup \{y\}} \left[\Xi^{f,(m)}\right]_{(\mathcal{J}\setminus\{x\}) \cup \{y\}, \mathcal{J}\setminus\{x\}} \tag{81}$$

$$= \sum_{x=\max\mathcal{J}} (-1)^{\sigma_Q(x)+\text{ind}_{\mathcal{J}}(x)} \sum_{\substack{y<x \\ y \notin (\mathcal{J} \cup \mathcal{B})}} \left[\Delta_{b,\mathcal{B} \leftarrow P}\right]_{x,(\mathcal{J}\setminus\{x\}) \cup \{y\}} \left[\Xi^{f,(m)}\right]_{(\mathcal{J}\setminus\{x\}) \cup \{y\}, \mathcal{J}\setminus\{x\}} \tag{82}$$

$$= (-1)^{\sigma_Q(\max\mathcal{J})+\text{ind}_{\mathcal{J}}(\max\mathcal{J})} \sum_{y \in [\max\mathcal{J}] \setminus (\mathcal{J} \cup \mathcal{B})} \left[\Delta_{b,\mathcal{B} \leftarrow P}\right]_{\max\mathcal{J},\mathcal{J} \cup \{y\} \setminus (\max\mathcal{J})} \left[\Xi^{f,(m)}\right]_{\mathcal{J} \cup \{y\} \setminus (\max\mathcal{J}), \mathcal{J} \setminus (\max\mathcal{J})} \tag{83}$$

$$= (-1)^{\sigma_Q(\max\mathcal{J})+\text{ind}_{\mathcal{J}}(\max\mathcal{J})} \sum_{y \in [\max\mathcal{J}] \setminus (\mathcal{J} \cup \mathcal{B})} \{[(-1)^{1+\sigma_P(\max\mathcal{J})+\text{ind}_{\mathcal{J} \cup \{y\} \cup \mathcal{B}}(\max\mathcal{J})} P_{b,\mathcal{J} \cup \{y\} \cup \mathcal{B}}] \cdot \tag{84}$$

$$[(-1)^{\sigma_Q(y)+\text{ind}_{(\mathcal{J}\setminus\{\max\mathcal{J}\}) \cup \{y\}}(y)} \psi_{f,y}]\}.$$

Note that in (81) the techniques described herein have used the definition of matrix $\Xi^{f,(m)}$ in (9) that implies the entry in position $(\mathcal{L}, \mathcal{J}\backslash\{x\})$ is non-zero only if $\mathcal{L} = (\mathcal{J}\backslash\{x\})\cup\{y\}$ for some $y \in \mathcal{J}\backslash\{x\}$. Moreover, (82) follows from the definition of injected entries in (19), which implies the entry of $$\Delta_{b,\mathcal{B}}_{\leftarrow P}$$

at position $(x, (\mathcal{J}\backslash\{x\})\cup\{y\})$ is non-zero only if all the following conditions hold:

$$\begin{cases} x > \max(\mathcal{J}\backslash\{x\})\cup\{y\} & \Rightarrow y < x \text{ and } x > \max(\mathcal{J}\backslash\{x\}), \\ ((\mathcal{J}\backslash\{x\})\cup\{y\})\cap \mathcal{B} = \varnothing & \Rightarrow y \notin \mathcal{B}, \end{cases}$$

which together imply $x = \max \mathcal{J}$ and $y \in [\max \mathcal{J}]\backslash(\mathcal{J}\cup\mathcal{B})$. In (84) the matrix entries are replaced from their definitions in (9) and (19).

Next note that the overall sign in (84) can be simplified as follows. First, $$\sigma_Q(\max\mathcal{J}) + \text{ind}_{\mathcal{J}}(\max\mathcal{J}) + \sigma_P(\max\mathcal{J}) + \quad (85)$$
$$\text{ind}_{\mathcal{J}\cup\{y\}\cup\mathcal{B}}(\max\mathcal{J}) = [1 + \sigma_P(\max\mathcal{J}) + \text{ind}_{\mathcal{B}\cup\{\max\mathcal{J}\}}(\max\mathcal{J})] + $$
$$\text{ind}_{\mathcal{J}}(\max\mathcal{J}) + \sigma_P(\max\mathcal{J}) + \text{ind}_{\mathcal{J}\cup\{y\}\cup\mathcal{B}}(\max\mathcal{J})$$

$$\equiv 1 + \text{ind}_{\mathcal{B}\cup\{\max\mathcal{J}\}}(\max\mathcal{J}) + \text{ind}_{\mathcal{J}}(\max\mathcal{J}) + \text{ind}_{\mathcal{J}\cup\{y\}\cup\mathcal{B}}(\max\mathcal{J}) \quad (86)$$
$$(\text{mod}2) = 1 + |\{u \in \mathcal{B}\cup\{\max\mathcal{J}\}: u \leq \max\mathcal{J}\}| + $$
$$|\{u \in \mathcal{J}: u \leq \max\mathcal{J}\}| + |\{u \in \mathcal{J}\cup\{y\}\cup\mathcal{B}: u \leq \max\mathcal{J}\}|$$

$$= 1 + [|\{u \in \mathcal{B}: u \leq \max\mathcal{J}\}| + 1] + \quad (87)$$
$$|\{u \in \mathcal{J}: u \leq \max\mathcal{J}\}| + [|\{u \in \mathcal{J}\cup\mathcal{B}: u \leq \max\mathcal{J}\}| + 1]$$

$$= 3 + 2|\{u \in \mathcal{J}\cup\mathcal{B}: u \leq \max\mathcal{J}\}| \quad (88)$$

$$\equiv 1(\text{mod}2), \quad (89)$$

where (85) is due to the definition of the child code's signature in (17); (86) plugged in the definition of ind·(•) from (2); equality in (87) holds since $y < \max\mathcal{J} = x$; and (88) is due the fact that sets $\mathcal{J}$ and $\mathcal{B}$ are disjoint. Similarly, $$\sigma_Q(y) + \quad (90)$$
$$\text{ind}_{(\mathcal{J}\backslash\{\max\mathcal{J}\})\cup\{y\}}(y) = [1 + \sigma_P(y) + \text{ind}_{\mathcal{B}\cup\{y\}}(y)] + \text{ind}_{(\mathcal{J}\backslash\{\max\mathcal{J}\})\cup\{y\}}(y)$$

$$= 1 + \sigma_P(y) + |\{u \in \mathcal{B}\cup\{y\}: u \leq y\}| + \quad (91)$$
$$|\{u \in (\mathcal{J}\backslash\{\max\mathcal{J}\})\cup\{y\}: u \leq y\}|$$

$$= 1 + \sigma_P(y) + |\{u \in \mathcal{B}\cup\{y\}: u \leq y\}| + |\{u \in \mathcal{J}\cup\{y\}: u \leq y\}| \quad (92)$$

$$= 1 + \sigma_P(y) + |\{u \in \mathcal{J}\cup\{y\}\cup\mathcal{B}: u \leq y\} + 1| \quad (93)$$

$$\equiv \sigma_P(y) + \text{ind}_{\mathcal{J}\cup\mathcal{B}\cup\{y\}}(y)(\text{mod}2), \quad (94)$$

where (90) used the definition of the child code's signature in (17); (91) and (94) plugged in the definition of ind·(•) given in (2); equality in (92) follows the fact that $y < \max\mathcal{J}$; and (93) holds since $\mathcal{B}$ and $\mathcal{J}$ are disjoint sets.

Plugging (89) and (94) into (84)

$$\text{Term}_2 = -\sum_{y \in [\max\mathcal{J}]\backslash(\mathcal{J}\cup\mathcal{B})} (-1)^{1+\sigma_P(y) + \text{ind}_{\mathcal{J}\cup\{y\}\cup\mathcal{B}}(y)} \psi_{f,y} P_{b,\mathcal{J}\cup\{y\}\cup\mathcal{B}}. \quad (95)$$

Lastly, $$-\text{Term}_3 = -[R^f(P)]_{b,\mathcal{J}\cup\mathcal{B}} = -[P \cdot \Xi^{f,(j)}]_{b,\mathcal{J}\cup\mathcal{B}} \quad (96)$$

$$= -\sum_{\mathcal{L}\subseteq[d]} P_{b,\mathcal{L}} \cdot [\Xi^{f,(j)}]_{\mathcal{L},\mathcal{J}\cup\mathcal{B}} \quad (97)$$

$$= -\sum_{y \in [d]\backslash(\mathcal{J}\cup\mathcal{B})} P_{b,\mathcal{J}\cup\{y\}\cup\mathcal{B}} \cdot [\Xi^{f,(j)}]_{\mathcal{J}\cup\{y\}\cup\mathcal{B},\mathcal{J}\cup\mathcal{B}} \quad (98)$$

$$= \sum_{y \in [d]\backslash(\mathcal{J}\cup\mathcal{B})} (-1)^{1+\sigma_P(y)+\text{ind}_{\mathcal{J}\cup\{y\}\cup\mathcal{B}}(y)} \psi_{f,y} P_{b,\mathcal{J}\cup\{y\}\cup\mathcal{B}} \quad (99)$$

$$= \sum_{y \in [d]\backslash(\mathcal{J}\cup\mathcal{B})} (-1)^{1+\sigma_P(y)+\text{ind}_{\mathcal{J}\cup\{y\}\cup\mathcal{B}}(y)} \psi_{f,y} P_{b,\mathcal{J}\cup\{y\}\cup\mathcal{B}} \quad (100)$$

where (100) holds since an injection at position $(b, \mathcal{J}\cup\{y\}\cup\mathcal{B})$ of matrix P may be performed only if $b > \max\{\mathcal{J}\cup\{y\}\cup\mathcal{B}\}$ which is in contradiction with $b \leq \max \mathcal{B}$, which is a required condition for the injection pair $(b, \mathcal{B})$ as specified. Therefore, from (80) and (95)

$$\text{Term}_1 - \text{Term}_2 = $$
$$\sum_{y \in [\max\mathcal{J}+1:d]\backslash(\mathcal{J}\cup\mathcal{B})} (-1)^{1+\sigma_P(y)+\text{ind}_{\mathcal{J}\cup\{y\}\cup\mathcal{B}}(y)} \psi_{f,y} P_{b,\mathcal{J}\cup\{y\}\cup\mathcal{B}} + $$
$$\sum_{y \in [\max\mathcal{J}]\backslash(\mathcal{J}\cup\mathcal{B})} (-1)^{1+\sigma_P(y)+\text{ind}_{\mathcal{J}\cup\{y\}\cup\mathcal{B}}(y)} \psi_{f,y} P_{b,\mathcal{J}\cup\{y\}\cup\mathcal{B}} = $$
$$\sum_{y \in [d]\backslash(\mathcal{J}\cup\mathcal{B})} (-1)^{1+\sigma_P(y)+\text{ind}_{\mathcal{J}\cup\{y\}\cup\mathcal{B}}(y)} \psi_{f,y} P_{b,\mathcal{J}\cup\{y\}\cup\mathcal{B}} = \text{Term}_3,$$

which is the desired identity in (76).

Case II: $\mathcal{J} \cap \mathcal{B} \neq \varnothing$: First note that each term in (78) consists of at entry from $$\Delta_{b,\mathcal{B}}_{\leftarrow P}$$

a position $(y, \mathcal{J})$, which is zero for $\mathcal{J}\cap\mathcal{B} \neq \varnothing$. Therefore the techniques described herein have $\text{Term}_1 = 0$.

Similarly, the entry of $$\Delta_{b,\mathcal{B}}_{\leftarrow P}$$

at position $(x, (\mathcal{J}\backslash\{x\})\cup\{y\})$ is non-zero only if $((\mathcal{J}\backslash\{x\})\cup\{y\})\cap \mathcal{B} = 0$ and $x \notin \mathcal{B}$. This implies $$0 = |((\mathcal{J}\backslash\{x\})\cup\{y\})\cap\mathcal{B}| \geq |(\mathcal{J}\backslash\{x\})\cap\mathcal{B}| \geq |\mathcal{J}\cap\mathcal{B}| - |\{x\}\cap\mathcal{B}| = $$
$$|\mathcal{J}\cap\mathcal{B}| \geq 1.$$

This contradiction implies that all the terms in (81) are zero, and hence $\text{Term}_2 = 0$. Finally, $\text{Term}_3$ is zero by its definition. Therefore, the identity (76) clearly holds. This completes the proof.

In this section, the techniques described herein compare the code construction proposed in this disclosure with the product-matrix (PM) code. Since both code constructions are linear, they both can be written as a product of encoder matrix and a message matrix, i.e., $\mathcal{C} = \Psi \cdot M$. However, there are several important differences between the two constructions. Some of the main distinctions between the two code construction are highlighted in Table 2.

TABLE 2

A comparison between the product-matrix and cascade codes

| Product-Matrix Code | The techniques described herein |
|---|---|
| Only for extreme points MBR and MSR | For the entire storage - bandwidth trade-off |
| MSR code construction: only for $d \geq 2k - 1$ | MSR code construction: all parameter sets |
| MSR point parameters: $(\alpha, \beta, F) = (d - k + 1, 1, k(d - k + 1))$ | MSR point parameters: $(\alpha, \beta, F) = ((d - k + 1)^k, (d - k + 1)^{k-1}, k(d - k + 1)^k)$ |
| Different structure and requirement for the encoder matrix of MBR and MSR codes | 2*Universal code construction for the entire trade-off |
| Repair data encoders are rows of the main code encoder | A systematic repair encoder $\Xi$ for each point on the trade-off |

The MSR point is fundamentally different. To show this, the techniques described herein can rely on the standard notion of similarity is a well-defined criterion to check if two codes are convertible to each other. Two linear codes $\mathcal{C}$ and $\mathcal{C}'$ are equivalent if $\mathcal{C}'$ can be represented in terms of $\mathcal{C}$ by 1. a change of basis of the vector space generated by the message symbols (i.e., a remapping of the message symbols), and
2. a change of basis of the column-spaces of the nodal generator matrices (i.e., a remapping of the symbols stored within a node).
3. scale parameters of $(\alpha, \beta, F)$ of codes by an integer factor so that both codes have the same parameters.

To show that the two codes are not similar, the techniques described herein focus on a special case, namely an MSR code with for an (n, k, d=2k−2) distributed storage system for k>2. For such a system, the parameters of the MSR cascade code are given from Corollary 1 as $(\alpha, \beta, F=(k-1)^k, (k-1)^{k-1}, k(k-1)^k)$. On the hand, the parameters of the PM code are given by $(\alpha, \beta, F)=(k-1, 1, k(k-1))$, and its message matrix can be written as $$M' = \begin{bmatrix} S_1 \\ S_2 \end{bmatrix},$$

where $S_1$ and $S_2$ are $\alpha \times \alpha$ symmetric matrices. Hence, the number data symbols in M' is $$2\binom{\alpha+1}{2} = (\alpha+1)\alpha = k(k-1).$$

The encoder matrix is of the form $$\Psi' = [\Phi | \Lambda \Phi], \quad (101)$$

where $\Phi$ is an $n \times \alpha$ matrix and $\Lambda$ is an $n \times n$ diagonal matrix. The matrices $\Phi$ and $\Lambda$ may be chosen that
 any d rows of $\Psi'$ are linearly independent.
 any $\alpha$ rows of $\Phi$ are linearly independent.
 the diagonal entries of $\Lambda$ are distinct.

Even though the requirements above are different for the proposed code construction, a Vandermonde matrix satisfies conditions both constructions. The MSR PM code is given by $\mathcal{C}' = \Psi' \cdot M'$. So, in order for a fair comparison, one needs to concatenate $N=(k-1)^{k-1}$ copies of little PM codes with independent message matrices $M'_1, M'_2, \ldots, M'_N$ to obtain a code with the same parameters as the cascade code.

The techniques described herein denote by $\text{Rep}_{h \to f}$ and $\text{Rep}'_{h \to f}$ the vector space spanned by the repair symbols sent by a helper node h to repair of a failed node f for the cascade and PM codes, respectively. Then, the following proposition highlights at least one important difference in the structure of two codes, to show that they are not similar with respect to the above definition.

Proposition 6: For an MSR code for an (n, k, d=2k−2) distributed storage system with parameters $(\alpha, \beta, F)=((k-1)^k, (k-1)^{k-1}, k(k-1)^k)$, and three distinct nodes h, f, and g, $$\dim(\text{Rep}_{h \to f} \cap \text{Rep}_{h \to g}) = \sum_{m=0}^{\mu} (d-k)^{\mu-m} \left[ 2\binom{k-1}{m-1} - \binom{k}{m} - \binom{k-2}{m} \right] \quad (102)$$

while $$\dim(\text{Rep}'_{h \to f} \cap \text{Rep}'_{h \to g}) = 0. \quad (103)$$

Proof of Proposition~\refprop:diff: Recall that the repair data $\text{Rep}_{h \to f}$ is simply the concatenation of repair data for each code segment, which is a (modified) signed determinant code. For evaluation for the overlap between two subspaces spanned by the repair symbols sent for two failed nodes for any code segment: for code segment with mode m, the dimension of the overlap between the subspaces spanned by the repair symbols sent from h to f and g is given by $$2\binom{d-1}{m-1} - \left[\binom{d}{m} + \binom{d-2}{m}\right].$$

Hence, summing up over all code segments, $$\dim(\text{Rep}_{h \to f} \cap \text{Rep}_{h \to g}) = \sum_{m=0}^{\mu} \ell_m \left[2\binom{d-1}{m-1} - \binom{d}{m} - \binom{d-2}{m}\right] = \quad (104)$$

$$\sum_{m=0}^{\mu} \ell_m \left[2\beta_m - \alpha_m + \binom{d-2}{m}\right] =$$

$$\sum_{m=-\infty}^{\infty} p_{\mu-m} \left[2\beta_m - \alpha_m + \binom{d-2}{m}\right] =$$

$$\sum_{m=0}^{\mu} (d-k)^{\mu-m} \left[2\binom{k-1}{m-1} - \binom{k}{m} - \binom{k-2}{m}\right].$$

where (104) used (37) and (41), for the first and second summands, respectively. Moreover, the third summand in the summation can be simplified using Lemma 2 for a=−2 and b=0.

Next, note that resulting PM code is obtained from concatenating independent little PM codes, each with β=1.

Hence, for each little PM code, the overlap between the spaces spanned by repair symbols sent for two failed nodes may be of dimension either 0 or 1. Assume the latter holds. Then the repair symbol sent from h to f and g are identical (up to a multiplicative constant), i.e., $\text{Rep}'_{h \to f} = \text{Rep}'_{h \to g}$. By symmetry, the same may hold for any other failed node. Now, consider a set of helper nodes $\mathcal{H}$ with $|\mathcal{H}|=d$, and a set of failed nodes with $\mathcal{F}$ with $|\mathcal{F}|=k$. The techniques described herein can repair the entire set $\mathcal{F}$ by sending downloading only $\beta=1$ symbol from each of the helper nodes in $\mathcal{H}$, since $\text{Rep}'_{h \to f} = \text{Rep}'_{h \to g}$ for any f, g $\in \mathcal{F}$ and any h $\in \mathcal{H}$. On the other hand, the entire file of the little PM code may be recoverable for the content of nodes in $\mathcal{F}$. This implies $$k(k-1) = F \le \sum_{h \in \mathcal{H}} \dim(\text{Rep}'_{h \to f}) = d\beta = 2(k-1),$$

which is in contradiction with k>2. Therefore, the techniques described herein have $\dim(\text{Rep}'_{h \to f} \cap \text{Rep}'_{h \to g})=0$ for any little PM code. Summing up over all copies of independent little PM codes the techniques described herein obtain the claim of the proposition.

An immediate consequence of this proposition is that cascade codes and PM codes are not similar, and cannot be converted to each other by any scaling and mapping of the raw or coded symbols.

The parity equation (7) and the redundant symbols in the message matrices play a critical role in the proposed code construction. Such symbols were initially introduced to facilitate node repair in the original determinant codes, without being important for data recovery. While having such redundancy could cause an inefficiency for the overall storage capacity of the code, the lower bounds show that determinant codes are optimum for d=k.

These redundant symbols play two roles in the cascade codes: (1) they help with the repair mechanism, similar to their role in determinant codes, and (2) they make the data recovery possible, in spite of the fact that the data collector only accesses k<d nodes. More intuitively, this redundancy is used to provide a backup copy of the symbols who could be missed in data recovery, due to the fact that a k×d sub-matrix of the encoder, i.e., $\Psi[\mathcal{K}, :]$, is not invertible for k<d.

Surprisingly, the number of such missing symbols (evaluated in (16)) is exactly the same as the number of redundant symbols in the entire code (given in (25)). This suggests the proposed code has no further room to be improved. On the other hand, the proposed construction universally achieves the optimum trade-off for MBR codes (see Corollary 1), MSR codes (see Corollary 1), an interior operating point on the cut-set bound (see Corollary 2), codes with k=d, and for an (n, k, d)=(5,3,4) system, for which a matching lower bound is provided. These facts altogether support the conjecture that the cascades codes are optimum exact regenerating codes for any set of parameters (n, k, d).

These evidences altogether support the injection that the cascades codes are optimum exact regenerating codes for any set of parameters (n, k, d). Of course, a matching lower bound for the trade-off is needed to prove the conjecture.

The main remaining problem to be addressed in this direction is to provide a lower bound for the trade-off between the storage and repair-bandwidth for exact-repair regenerating codes. As mentioned above, a tight lower bound may match with the trade-off achieved in this disclosure, indicating the optimality of the proposed construction.

There are some aspects of this work that can be improved. For instance, even though the sub-packetization of the codes provided in this disclosure is independent of the number of nodes n, it is exponential in parameter k. An interesting question is to develop construction that achieves the same trade-off with smaller sub-packetization and independent of n. Multiple failure repair is another interesting problem to be studied. More importantly, the problem of dynamic repair, referring to the flexibility of dynamically changing number of helper nodes (d $\in$ [k: n–1]) is of both practical and theoretical interest.

There is recent attention to the clustered distributed storage systems. A modified version of the proposed construction might be applicable to such clustered systems. Finally, the exact-repair regenerating codes can be viewed in the context of interference alignment problem, where the repair scenario is equivalent to aligning and canceling the interference (mismatch) exists between a failed symbol and a coded symbol of a helper node. Therefore, the techniques and results of this disclosure might be also applicable to the design of interference alignment codes for wireless communication.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through multi-threaded processing, interrupt processing, or multiple processors, rather than sequentially.

In this section the proof of Proposition 2 is presented. From the RHS of (11), $$\sum_{x \in \mathcal{J}} (-1)^{\sigma_D(x)+\text{ind}_{\mathcal{J}}(x)} [R^f(D)]_{x, \mathcal{J} \setminus \{x\}} = \tag{105}$$

$$\sum_{x \in \mathcal{J}} (-1)^{\sigma_D(x)+\text{ind}_{\mathcal{J}}(x)} [D \cdot \Xi^{f,(m)}]_{x, \mathcal{J} \setminus \{x\}} =$$

$$\sum_{x \in \mathcal{J}} (-1)^{\sigma_D(x)+\text{ind}_{\mathcal{J}}(x)} \sum_{\substack{\mathcal{L} \subseteq [d] \\ |\mathcal{L}|=m}} D_{x, \mathcal{L}} \cdot \Xi^{f,(m)}_{\mathcal{L}, \mathcal{J} \setminus \{x\}} =$$

$$\sum_{x \in \mathcal{J}} (-1)^{\sigma_D(x)+\text{ind}_{\mathcal{J}}(x)} \sum_{y \in [d] \setminus (\mathcal{J} \setminus \{x\})} D_{x, \mathcal{J} \setminus \{x\} \cup \{y\}} \cdot \Xi^{f,(m)}_{\mathcal{J} \setminus \{x\} \cup \{y\}, \mathcal{J} \setminus \{x\}}$$

$$= \sum_{x \in \mathcal{J}} (-1)^{\sigma_D(x)+\text{ind}_{\mathcal{J}}(x)} \left[ D_{x, \mathcal{J}} \Xi^{f,(m)}_{\mathcal{J}, \mathcal{J} \setminus \{x\}} + \right. \tag{106}$$

$$\left. \sum_{y \in [d] \setminus \mathcal{J}} D_{x, \mathcal{J} \setminus \{x\} \cup \{y\}} \cdot \Xi^{f,(m)}_{\mathcal{J} \setminus \{x\} \cup \{y\}, \mathcal{J} \setminus \{x\}} \right]$$

$$= \sum_{x \in \mathcal{J}} (-1)^{\sigma_D(x)+\text{ind}_{\mathcal{J}}(x)} \left[ (-1)^{\sigma_D(x)+\text{ind}_{\mathcal{J}}(x)} \psi_{f,x} D_{x, \mathcal{J}} + \right. \tag{107}$$

$$\left. \sum_{y \in [d] \setminus \mathcal{J}} (-1)^{\sigma_D(x)+\text{ind}_{(\mathcal{J} \setminus \{x\}) \cup \{y\}}(y)} \psi_{f,x} D_{x, \mathcal{J} \setminus \{x\} \cup \{y\}} \right]$$

$$= \sum_{x \in \mathcal{J}} \psi_{f,x} D_{x, \mathcal{J}} + \tag{108}$$

$$\sum_{y \in [d] \setminus \mathcal{J}} \sum_{x \in \mathcal{J}} (-1)^{\sigma_D(x)+\sigma_D(y)+\text{ind}_{\mathcal{J}}(x)+\text{ind}_{(\mathcal{J} \setminus \{x\}) \cup \{y\}}(y)} \psi_{f,y} D_{x, \mathcal{J} \setminus \{x\} \cup \{y\}}$$

$$= \sum_{x \in \mathcal{J}} \psi_{f,x} D_{x, \mathcal{J}} + \tag{109}$$

$$\sum_{y \in [d] \setminus \mathcal{J}} \sum_{x \in \mathcal{J}} (-1)^{\sigma_D(x)+\sigma_D(y)+\text{ind}_{\mathcal{J} \cup \{y\}}(y)+\text{ind}_{\mathcal{J} \cup \{y\}}(x)+1} \psi_{f,y} D_{x, \mathcal{J} \setminus \{x\} \cup \{y\}}$$

-continued $$= \sum_{x \in \mathcal{J}} \psi_{f,x} D_{x,\mathcal{J}} + \sum_{y \in [d] \setminus \mathcal{J}} (-1)^{\sigma_D(y) + \mathrm{ind}_{\mathcal{J} \cup \{y\}}(y)+1} \psi_{f,y} \quad (110)$$

$$\sum_{x \in \mathcal{J}} (-1)^{\mathrm{ind}_{\mathcal{J} \cup \{y\}}(x)} (-1)^{\sigma_D(x)} D_{x, \mathcal{J} \setminus \{x\} \cup \{y\}}$$

$$= \sum_{x \in \mathcal{J}} \psi_{f,x} D_{x,\mathcal{J}} + \quad (111)$$

$$\sum_{y \in [d] \setminus \mathcal{J}} (-1)^{\sigma_D(y) + \mathrm{ind}_{\mathcal{J} \cup \{y\}}(y)+1} \psi_{f,y} \sum_{x \in \mathcal{J}} (-1)^{\mathrm{ind}_{\mathcal{J} \cup \{y\}}(x)} w_{x,\mathcal{J} \cup \{y\}}$$

$$= \sum_{x \in \mathcal{J}} \psi_{f,x} D_{x,\mathcal{J}} + \quad (112)$$

$$\sum_{y \in [d] \setminus \mathcal{J}} (-1)^{\sigma_D(y) + \mathrm{ind}_{\mathcal{J} \cup \{y\}}(y)+1} \psi_{f,y} \left[ (-1)^{\mathrm{ind}_{\mathcal{J} \cup \{y\}}(y)+1} w_{y,\mathcal{J} \cup \{y\}} \right]$$

$$= \sum_{x \in \mathcal{J}} \psi_{f,x} D_{x,\mathcal{J}} + \quad (113)$$

$$\sum_{y \in [d] \setminus \mathcal{J}} (-1)^{\sigma_D(y) + \mathrm{ind}_{\mathcal{J} \cup \{y\}}(y)+1} \psi_{f,y} \left[ (-1)^{\mathrm{ind}_{\mathcal{J} \cup \{y\}}(y)+1} (-1)^{\sigma_D(y)} D_{y,\mathcal{J}} \right]$$

$$= \sum_{x \in \mathcal{J}} \psi_{f,x} D_{x,\mathcal{J}} + \sum_{y \in [d] \setminus \mathcal{J}} \psi_{f,y} D_{y,\mathcal{J}} \quad (114)$$

$$= \sum_{x \in [d]} \psi_{f,x} D_{x,\mathcal{J}} = [\Psi_f \cdot D]_{\mathcal{J}}, \quad (115)$$

where

In (105) the definition of $\Xi^{f,(m)}$ is from (9), where the entry $\Xi^{f,(m)}_{\mathcal{L},\mathcal{J} \setminus \{x\}}$ is non-zero only if $\mathcal{J}$ includes $\mathcal{L} \setminus \{x\}$. This implies that for non zero $\Xi^{f,(m)}_{\mathcal{L},\mathcal{J} \setminus \{x\}}$, $\mathcal{J}$ may satisfy $\mathcal{J} = (\mathcal{L} \setminus \{x\}) \cup \{y\}$ for some $y \in [d] \setminus (\mathcal{L} \setminus \{x\})$;

In (106), the summation is split into two cases: y=x and y≠x;

In (107), $\Xi^{f,(m)}_{\mathcal{J} \setminus \{x\} \cup \{y\}, \mathcal{J} \setminus \{x\}}$ is replaced by $(-1)^{\sigma_D(y) + \mathrm{ind}_{\mathcal{J} \setminus \{x\} \cup \{y\}}(y)} \psi_{f,y}$ from its definition in (9);

In (108) the two summations over x and y are swapped;

In (109), the definition of ind·(•) function is used to write $$\mathrm{ind}_{\mathcal{J} \cup \{y\}}(x) + \mathrm{ind}_{\mathcal{J} \cup \{y\}}(y) = |\{u \in \mathcal{J} \cup \{y\}: u \leq x\}| + |\{u \in \mathcal{J} \cup \{y\}: u \leq y\}|$$

$$= |\{u \in \mathcal{J}: u \leq x\}| + 1[y \leq x] +$$

$$|\{u \in (\mathcal{J} \setminus \{x\}) \cup \{y\}: u \leq y\}| + 1[x \leq y]$$

$$= \mathrm{ind}_{\mathcal{J}}(x) + \mathrm{ind}_{(\mathcal{J} \setminus \{x\}) \cup \{y\}}(y) + 1,$$

where the last equality holds since $x \in \mathcal{L}$ and $y \in [d] \setminus \mathcal{L}$, which implies x≠y, and therefore 1[x≤y]+1[y≤x]=1. This leads to $\mathrm{ind}_{\mathcal{J}}(x) + \mathrm{ind}_{(\mathcal{J} \setminus \{x\}) \cup \{y\}}(y) \equiv \mathrm{ind}_{\mathcal{J} \cup \{y\}}(y) + \mathrm{ind}_{\mathcal{J} \cup \{y\}}(x) + 1$ modulo 2.

In (111) the definition of D is used from (8): since $x \notin (\mathcal{L} \setminus \{x\}) \cup \{y\}$ then $$D_{x,(\mathcal{J} \setminus \{x\}) \cup \{y\}} = (-1)^{\sigma_D(x)} w_{x,\mathcal{J} \cup \{y\}}.$$

A similar argument is used in (113);

In (112) the parity equation from (7) is used. In particular, $$\sum_{x \in \mathcal{J} \cup \{y\}} (-1)^{\mathrm{ind}_{\mathcal{J} \cup \{y\}}(x)} w_{x, \mathcal{I} \cup \{y\}} = 0,$$

which implies $$\sum_{x \in \mathcal{J}} (-1)^{\mathrm{ind}_{\mathcal{J} \cup \{y\}}(x)} w_{x, \mathcal{I} \cup \{y\}} = -(-1)^{\mathrm{ind}_{\mathcal{J} \cup \{y\}}(y)} w_{y, \mathcal{I} \cup \{y\}}.$$

This completes the proof of Proposition 2.

Remark 9: Note that in the chain of equations above the techniques described herein aim to repair the coded symbol at position $\mathcal{J}$ of the failed node, which is a linear combination of symbols in column $\mathcal{J}$ of the message matrix. However, the linear combination in (110) misses some of the symbols of column $\mathcal{J}$ (i.e., $D_{x,\mathcal{J}}$ when $x \notin \mathcal{J}$) and includes symbols from columns of the message matrix (i.e., $D_{x,\mathcal{J}}$ when $\mathcal{J} \neq \mathcal{J}$). However, these two interference perfectly cancel each other due to the parity equation in (7). This is identical to the notion of interference neutralization, which is well studied in multi-hop wireless networks.

Definition 4: The techniques described herein call a (signed) determinant or cascade code semi-systematic if the first k nodes store symbols from the message matrix, without any encoding. The encoder of a semi-systematic code may consist of a k×k identity matrix in its upper-left and a k×(d−k) zero matrix in its upper-right corner.

Consider an (n, k, d) regenerating code obtained from an encoder matrix $\Psi$. Here, the techniques described herein show that the techniques described herein can modify the encoder matrix such that the resulting code becomes semi-systematic, that is, the first k nodes store pure symbols from the message matrix. Consider a general encoder matrix $$\Psi_{n \times d} = [\Gamma_{n \times k} \ Y_{n \times (d-k)}] = \begin{bmatrix} A_{k \times k} & B_{k \times (d-k)} \\ C_{(n-k) \times k} & D_{(n-k) \times (d-k)} \end{bmatrix}.$$

Any k rows of $\Gamma_{n \times k}$ are linearly independent. Thus, $A_{k \times k}$ is a full-rank and invertible matrix.

$$X = \begin{bmatrix} A_{k \times k}^{-1} & -A_{k \times k}^{-1} B_{k \times (d-k)} \\ O_{(d-k) \times k} & I_{(d-k) \times (d-k)} \end{bmatrix}$$

Note that $$X^{-1} = \begin{bmatrix} A_{k \times k} & B_{k \times (d-k)} \\ O_{(d-k) \times k} & I_{(d-k) \times (d-k)} \end{bmatrix},$$

and hence X is a full-rank matrix.

Therefore, the techniques described herein can modify the encoder matrix to $$\tilde{\Psi}_{n \times d} = \Psi_{n \times d} \cdot X = \begin{bmatrix} I_{k \times k} & O_{k \times (d-k)} \\ CA^{-1} & D - CA^{-1}B \end{bmatrix} = [\tilde{\Gamma}_{n \times k} \ \tilde{Y}_{n \times (d-k)}].$$

It is easy to verify that $\tilde{\Psi}$ satisfy conditions. To this end, let $\mathcal{K}$ be an arbitrary set of rows indices with $|\mathcal{K}|=k$. The techniques described herein have $\tilde{\Gamma}[\mathcal{K},:]=-\Gamma[\mathcal{K},:]A_{k\times k}^{-1}$ which is a full-rank matrix, since both $\Gamma[\mathcal{K},:]$ and $A_{k\times k}^{-1}$ are full-rank. This shows the condition holds for $\tilde{\Psi}$. Similarly, for an arbitrary set $\mathcal{H}\subseteq[n]$ with $|\mathcal{H}|=d\tilde{\Psi}[\mathcal{H},:]=\Psi[\mathcal{H},:]X$, which is again full-rank, because both $\Psi[\mathcal{H},:]$ are X full-rank.

The techniques described herein may use the $\mathcal{Z}$ transform to solve the recursive equation in (33) for $\ell_m$'s, and evaluate the code parameters in (27), (28), and (32). For the sake of completeness, the techniques described herein start with the definition and some of the main properties of this transformation.

Definition 5: The two-sided $\mathcal{Z}$-transform of a sequences $x_m$ is defined as $$X(z) = \mathcal{Z}\{x_m\} = \sum_{m=-\infty}^{\infty} x_m z^{-m} \tag{116}$$

where z is a complex number. The region of convergence (ROC) of X(z) is defined as the set of points in the complex plane ($z \in \mathbb{C}$) for which X(z) converges, that is, $$ROC = \left\{ z: \left| \sum_{m=-\infty}^{\infty} x_m z^{-m} \right| < \infty \right\} \tag{117}$$

Definition 6: The inverse $\mathcal{Z}$-transform of X(z) is defined as a sequence $\{x_m\}_{m=-\infty}^{\infty}$ where $$x_m = \mathcal{Z}^{-1}\{X(z)\} = \frac{1}{2\pi j} \oint_C X(z) z^{m-1} dz, m \in \mathbb{Z}, \tag{118}$$

where C is a counterclockwise closed path encircling the origin and entirely located in the region of convergence (ROC).

For a given ROC, there is a one-to-one correspondence between the sequences $x_m$ and its $\mathcal{Z}$-transform, X(z). Some properties of the $\mathcal{Z}$-transform as well as some pairs of sequences and their $\mathcal{Z}$-transforms are listed in Table 3 and Table 4, respectively.

TABLE 3

Properties of the $\mathcal{Z}$-transform.

| | Time Domain | Z-Domain | ROC |
|---|---|---|---|
| Linearity | $w_m = ax_m + by_m$ | $W(z) = aX(z) + bY(z)$ | $ROC_x \cap ROC_y$ |
| Convolution | $w_m = x_m * y_m$ | $W(z) = X(z)Y(z)$ | $ROC_x \cap ROC_y$ |
| Differentiation | $w_m = mx_m$ | $W(z) = -z\dfrac{dX(z)}{dz}$ | $ROC_x$ |
| Scaling in the z-domain | $a^{-m}x_m$ | $X(a \cdot z)$ | $ROC_x/|a|$ |
| (Generalized) Accumulation | $w_m = \sum_{t=-\infty}^{m} a^{m-t}x_t$ | $W(z) = \dfrac{1}{1-az^{-1}}X(z)$ | $ROC_x \cap \{z: |z| > |a|\}$ |
| Time shifting | $w_m = x_{m-b}$ | $W(z) = z^{-b}X(z)$ | $ROC_x$ |

TABLE 4

Some useful pairs of $\mathcal{Z}$-transform.

| Sequence | $\mathcal{Z}$-Transform | ROC |
|---|---|---|
| $x_m = \delta(m)$ | $X(z) = 1$ | all $z \in \mathbb{C}$ |
| $x_m = \binom{r}{m}$ | $X(z) = (1 + z^{-1})^r$ | all $z \in \mathbb{C}$ |
| $x = \binom{m+b-1}{m}a^m, b \in \mathbb{Z}^+$ | $X(z) = \dfrac{1}{(1-az^{-1})^b}$ | $|x| > |a|$ |
| $x = \binom{b}{m}a^m, b \in \mathbb{Z}^+$ | $X(z) = (1 + az^{-1})^b$ | all $z \in \mathbb{C}$ |

The techniques described herein start from the definition of $p_m$ and use (33) to obtain a recursive equation. For any m with $m \neq 0$, $$p_m = \ell_{\mu-m} = \sum_{j=(\mu-m)+1}^{\mu} \ell_j \cdot (j-(\mu-m)-1)\binom{d-k+1}{j-(\mu-m)} \tag{119}$$

$$= \sum_{t=1}^{m} \ell_{t+\mu-m} \cdot (t-1)\binom{d-k+1}{t} \tag{120}$$

$$= \sum_{t=1}^{m} p_{m-t} \cdot (t-1)\binom{d-k+1}{t}, \tag{121}$$

where (119) is implied by (33), and in (120) used a change of variable $t=j-\mu+m$. Note that the summand in (121) corresponding to $$t = 0 \text{ in } p_{m-0} \cdot (0-1)\binom{d-k+1}{0} = -p_m.$$

Hence, by including $t=0$ in the summation, $$\sum_{t=0}^{m} p_{m-t} \cdot (t-1)\binom{d-k+1}{t} = 0, m \neq 0. \tag{122}$$

Finally, for m=0, $$\sum_{t=0}^{0} p_{0-t} \cdot (t-1)\binom{d-k+1}{t} = -p_0 = -\ell_{\mu-0} = -1. \tag{123}$$

Putting (122) and (123) together, $$\sum_{t=0}^{m} p_{m-t} \cdot (t-1)\binom{d-k+1}{t} = -\delta_m \cdot \forall m \in \mathbb{Z}. \tag{124}$$

Next, define a sequence $$q_t = (t-1)\binom{d-k+1}{t}$$

for every integer t. Note that $q_t=0$ for $t<0$. Then (124) can be rewritten as $$-\delta_m = \sum_{t=0}^{m} p_{m-t} \cdot (t-1)\binom{d-k+1}{t} = \sum_{t=0}^{m} p_{m-t} \cdot q_t = \sum_{t=-\infty}^{\infty} p_{m-t} \cdot q_t \quad (125)$$

$$= p_m * q_m, \quad (126)$$

where (125) holds since $q_t=0$ for $t<0$, and $p_{m-t}=\ell_{\mu+(t-m)}=0$ is zero for $t>m$ (see definition of $\ell_m$ in (34)). Here, operator * denotes the convolution between two sequences $p_m$ and $q_m$. The techniques described herein can take the $\mathcal{Z}$-transform from both sides of (126) and use Table 3 and Table 4 to obtain $$P(z)Q(z) = -1. \quad (127)$$

The $\mathcal{Z}$-transform of $q_m$ can be easily found using the property and pairs used from Table 3 and Table 4 is follows.

$$Q(z) = \mathcal{Z}\{q_m\} = \quad (128)$$

$$\mathcal{Z}\left\{(m-1)\binom{d-k+1}{m}\right\} = \mathcal{Z}\left\{m\binom{d-k+1}{m}\right\} - \mathcal{Z}\left\{\binom{d-k+1}{m}\right\}$$

$$= -z\frac{d\mathcal{Z}\left\{\binom{d-k+1}{m}\right\}}{dz} - \mathcal{Z}\left\{\binom{d-k+1}{m}\right\} \quad (129)$$

$$= -z\frac{d}{dz}(1+z^{-1})^{d-k+1} - (1+z^{-1})^{d-k+1} \quad (130)$$

$$= -z(d-k+1)(-z^{-2})(1+z^{-1})^{d-k} - (1+z^{-1})^{d-k+1} = \quad (131)$$

$$(1+z^{-1})^{d-k}\left[(d-k)z^{-1} - 1\right].$$

where (128) holds due to linearity of the $\mathcal{Z}$-transform, in (129) the techniques described herein used the differentiation effect, and the techniques described herein used the fourth pair in Table 4 for a=1 and b=d−k+1 in (130). Plugging (131) into (127), $$P(z) = \frac{-1}{Q(z)} = \frac{1}{1-(d-k)z^{-1}}\left(\frac{1}{1+z^{-1}}\right)^{d-k}, \quad (132)$$

where the region of convergence is given by $ROC_p=\{z: |z|>|d-k|\}$. It remains to find $p_m$ from $P(z)$ by computing its inverse $\mathcal{Z}$-transform.

$$p_m = \mathcal{Z}^{-1}\{P(z)\} = \sum_{t=-\infty}^{m} (d-k)^{m-t} \mathcal{Z}^{-1}\left\{\left(\frac{1}{1+z^{-1}}\right)^{d-k}\right\} \quad (133)$$

$$= \sum_{t=-\infty}^{m} (d-k)^{m-t} \cdot (-1)^t \binom{t+d-k-1}{t} \quad (134)$$

$$= \sum_{t=0}^{m} (-1)^t (d-k)^{m-t} \binom{t+d-k-1}{t}. \quad (135)$$

where in (133) the techniques described herein used the generalized accumulation rule in Table 3 for a=d−k. It is worth mentioning that the inverse $\mathcal{Z}$-transform of $$\left(\frac{1}{1+z^{-1}}\right)^{d-k}$$

may be taken with respect to variable t. To this end, in (134) the techniques described herein have used the third pair in Table 4 with a=−1 and b=d−k. Finally, in (135) the techniques described herein have limited the range of t by noticing the fact that the binomial coefficient is zero for t<0. This shows the desired identity and completes the proof.

Let us define $$u_\mu = \sum_{m=-\infty}^{\infty} \ell_m \binom{d+a}{m+b} = \sum_{m=-\infty}^{\infty} p_{\mu-m} \binom{d+a}{m+b},$$

$$v_\mu = \sum_{m=-b}^{\mu} (d-k)^{\mu-m} \binom{k+a}{m+b} = \sum_{m=0}^{\mu+b} (d-k)^{\mu+b-m} \binom{k+a}{m},$$

for every integer μ. The claim of this lemma is equivalent to $u_\mu = v_\mu$ for all $\mu \in \mathbb{Z}$. Instead of directly showing in the μ-domain, the techniques described herein may prove that the two sequences are identical in the z-domain, and have the same ROCs.

$$U(z) = \mathcal{Z}\left\{\sum_{m=-\infty}^{\infty} p_{\mu-m}\binom{d+a}{m+b}\right\} = \quad (136)$$

$$\mathcal{Z}\left\{p_\mu * \binom{d+a}{\mu+b}\right\} = \mathcal{Z}\{p_\mu\} \cdot \mathcal{Z}\left\{\binom{d+a}{\mu+b}\right\}$$

$$= P(z) \cdot z^b \mathcal{Z}\left\{\binom{d+a}{\mu}\right\} \quad (137)$$

$$= \frac{1}{1-(d-k)z^{-1}}(1+z^{-1})^{d+a} \cdot z^b \cdot \left(\frac{1}{1+z^{-1}}\right)^{d-k} \quad (138)$$

$$= z^b \frac{1}{1-(d-k)z^{-1}}(1+z^{-1})^{k+a}, \quad (139)$$

where in (136) and (137) the techniques described herein used the convolution and time-shift properties from Table 3, respectively. Moreover, the techniques described herein have used (132) and the $\mathcal{Z}$-transforms in Table 4 to simplify (138). Note that $ROC_u=ROC_p=\{z:|z|>|d-k|\}$.

Similarly, for sequence $\{v_\mu\}$ $$V(z) = \mathcal{Z}\left\{\sum_{m=0}^{\mu+b}(d-k)^{\mu+b-m}\binom{k+a}{m}\right\} = \quad (140)$$

$$z^{-(-b)} \cdot \mathcal{Z}\left\{\sum_{m=0}^{\mu}(d-k)^{\mu-m}\binom{k+a}{m}\right\}$$

$$= z^b \cdot \mathcal{Z}\left\{\sum_{m=-\infty}^{\mu}(d-k)^{\mu-m}\binom{k+a}{m}\right\} \quad (141)$$

$$= z^b \cdot \frac{1}{1-(d-k)z^{-1}} \mathcal{Z}\left\{\binom{k+a}{m}\right\} \quad (142)$$

$$= z^b \cdot \frac{1}{1-(d-k)z^{-1}}(1+z^{-1})^{k+a} \quad (143)$$

where in (140) and (142) the techniques described herein used time-shift property and generalized accumulation property from Table 3, respectively. Moreover, (141) holds because $$\binom{k+a}{m}$$

is zero for m<0, and (143) follows the pairs of $\mathcal{Z}$-transform in Table 4. Also, it is worth noting that the ROC of $\{u_\mu\}$ is given by $\text{ROC}_v = \{z: |z| > |d-k|\}$, due to the step in (142). Comparing (138) and (143) and their ROCs imply that sequences $\{u_\mu\}$ and $\{v_\mu\}$ are identical. This completes the proof of the lemma.

Proof of proposition~\refprop:node:rep: The proof technique here is similar to that used in (47). The techniques described herein start with the RHS of (9), and plugin the entries of matrices $R^{f,(m)}$, $\Xi^{f,(m)}$ and D, to expand it. Next, the techniques described herein split the terms in the summation into v-symbols ($D_{x,\mathcal{J}}$ with $x \in \mathcal{J}$) and w-symbols ($D_{y,\mathcal{J}}$ with $y \notin \mathcal{J}$), and then the techniques described herein prove the identity for v and w symbols separately. The details of the derivation are given at the top of the next page.

$$\sum_{x \in \mathcal{J}}(-1)^{\text{ind}_\mathcal{J}(x)}[R^{f,(m)}]_{x,\mathcal{J}\setminus\{x\}} = \sum_{x \in \mathcal{J}}(-1)^{\text{ind}_\mathcal{J}(x)}[D \cdot \Xi^{f,(m)}]_{x,\mathcal{J}\setminus\{x\}} = \quad (144)$$

$$\sum_{x \in \mathcal{J}}(-1)^{\text{ind}_\mathcal{J}(x)}\sum_{\substack{\mathcal{L}\subseteq[d]\\|\mathcal{L}|=m}}D_{x,\mathcal{L}}\cdot\Xi^{f,(m)}_{\mathcal{L},\mathcal{J}\setminus\{x\}} =$$

$$\sum_{x \in \mathcal{J}}(-1)^{\text{ind}_\mathcal{J}(x)}\sum_{y\in[d]\setminus(\mathcal{J}\setminus\{x\})}D_{x,\mathcal{J}\setminus\{x\}\cup\{y\}}\cdot\Xi^{f,(m)}_{\mathcal{J}\setminus\{x\}\cup\{y\},\mathcal{J}\setminus\{x\}}$$

$$= \sum_{x\in\mathcal{J}}(-1)^{\text{ind}_\mathcal{J}(x)}\left[D_{x,\mathcal{J}}\Xi^{f,(m)}_{\mathcal{J},\mathcal{J}\setminus\{x\}} + \right. \quad (145)$$

$$\left. \sum_{y\in[d]\setminus\mathcal{J}}D_{x,\mathcal{J}\setminus\{x\}\cup\{y\}}\cdot\Xi^{f,(m)}_{\mathcal{J}\setminus\{x\}\cup\{y\},\mathcal{J}\setminus\{x\}}\right]$$

$$= \sum_{x\in\mathcal{J}}(-1)^{\text{ind}_\mathcal{J}(x)}\left[(-1)^{\text{ind}_\mathcal{J}(x)}\psi_{f,x}D_{x,\mathcal{J}} + \right. \quad (146)$$

$$\left. \sum_{y\in[d]\setminus\mathcal{J}}(-1)^{\text{ind}_{(\mathcal{J}\setminus\{x\})\cup\{y\}}(y)}\psi_{f,y}D_{x,\mathcal{J}\setminus\{x\}\cup\{y\}}\right]$$

-continued $$= \sum_{x\in\mathcal{J}}\psi_{f,y}D_{x,\mathcal{J}} + \quad (147)$$

$$\sum_{y\in[d]\setminus\mathcal{J}}\sum_{x\in\mathcal{J}}(-1)^{\text{ind}_\mathcal{J}(x)}(-1)^{\text{ind}_{(\mathcal{J}\setminus\{x\})\cup\{y\}}(y)}\psi_{f,y}D_{x,\mathcal{J}\setminus\{x\}\cup\{y\}}$$

$$= \sum_{x\in\mathcal{J}}\psi_{f,y}D_{x,\mathcal{J}} + \quad (148)$$

$$\sum_{y\in[d]\setminus\mathcal{J}}\sum_{x\in\mathcal{J}}\psi_{f,y}(-1)^{\text{ind}_{\mathcal{J}\cup\{y\}}(y)+1}(-1)^{\text{ind}_{\mathcal{J}\cup\{y\}}(x)}D_{x,\mathcal{J}\setminus\{x\}\cup\{y\}}$$

$$= \sum_{x\in\mathcal{J}}\psi_{f,y}D_{x,\mathcal{J}} + \quad (149)$$

$$\sum_{y\in[d]\setminus\mathcal{J}}(-1)^{\text{ind}_{\mathcal{J}\cup\{y\}}(y)+1}\psi_{f,y}\sum_{x\in\mathcal{J}}(-1)^{\text{ind}_{\mathcal{J}\cup\{y\}}(x)}w_{x,\mathcal{J}\cup\{y\}}$$

$$= \sum_{x\in\mathcal{J}}\psi_{f,y}D_{x,\mathcal{J}} + \quad (150)$$

$$\sum_{y\in[d]\setminus\mathcal{J}}(-1)^{\text{ind}_{\mathcal{J}\cup\{y\}}(y)+1}\psi_{f,y}\left[(-1)^{\text{ind}_{\mathcal{J}\cup\{y\}}(y)+1}w_{y,\mathcal{J}\cup\{y\}}\right]$$

$$= \quad (151)$$

$$\sum_{x\in\mathcal{J}}\psi_{f,y}D_{x,\mathcal{J}} + \sum_{y\in[d]\setminus\mathcal{J}}(-1)^{\text{ind}_{\mathcal{J}\cup\{y\}}(y)+1}\psi_{f,y}\left[(-1)^{\text{ind}_{\mathcal{J}\cup\{y\}}(y)+1}D_{y,\mathcal{J}}\right]$$

$$= \sum_{x\in\mathcal{J}}\psi_{f,y}D_{x,\mathcal{J}} + \sum_{y\in[d]\setminus\mathcal{J}}\psi_{f,y}D_{y,\mathcal{J}} \quad (152)$$

$$= \sum_{x\in[d]}\psi_{f,y}D_{x,\mathcal{J}} = [\psi_f D]_\mathcal{J} \quad (153)$$

The critical steps of the proof can be justified as follows.

In (144), the definition of $\Xi^{f,(m)}$ from (7) is used, which implies $\Xi^{f,(m)}_{\mathcal{L},\mathcal{J}\setminus\{x\}}$ is non-zero only if $\mathcal{L}$ includes $\mathcal{J}\setminus\{x\}$;

In (145), the summation is split into two cases: y=x and y≠x;

In (146), $\Xi^{f,(m)}_{\mathcal{L},\mathcal{J}\setminus\{x\}}$ is replaced by $(-1)^{\text{ind}_\mathcal{J}(x)}\psi_{f,x}$ from its definition in (7);

In (147), the two summations over x and y are swapped;

In (148), the identity $$(-1)^{\text{ind}_{(\mathcal{J}\setminus\{x\})\cup\{y\}}(y)}(-1)^{\text{ind}_\mathcal{J}(x)} = (-1)^{\text{ind}_{(\mathcal{J}\cup\{y\})}(y)+1}(-1)^{\text{ind}_{\mathcal{J}\cup\{y\}}(x)}$$

is used. In order to prove the identity, consider two cases:

If x<y, then $$\begin{cases} \text{ind}_{(\mathcal{J}\setminus\{x\})\cup\{y\}}(y) = \text{ind}_{\mathcal{J}\cup\{y\}}(y) - 1, \\ \text{ind}_\mathcal{J}(x) = \text{ind}_{\mathcal{J}\cup\{y\}}(x) \end{cases}.$$

If x>y, then $$\begin{cases} \text{ind}_{(\mathcal{J}\setminus\{x\})\cup\{y\}}(y) = \text{ind}_{\mathcal{J}\cup\{y\}}(y), \\ \text{ind}_\mathcal{J}(x) = \text{ind}_{\mathcal{J}\cup\{y\}}(x) - 1 \end{cases}.$$

In (149), since $x \notin (\mathcal{J} \setminus \{x\}) \cup \{y\}$ then $$D_{x,(\mathcal{J}\setminus\{x\})\cup\{y\}} = w_{x,\mathcal{J}\cup\{y\}};$$

In (150), the parity equation (5) is used. In particular, $$\sum_{x \in \mathcal{J} \cup \{y\}} (-1)^{ind_{\mathcal{J} \cup \{y\}}(x)} w_{x,I\cup\{y\}} = 0,$$

which implies $$\sum_{x \in \mathcal{J}} (-1)^{ind_{\mathcal{J} \cup \{y\}}(x)} w_{x,I\cup\{y\}} = -(-1)^{ind_{\mathcal{J} \cup \{y\}}(y)} w_{y,I\cup\{y\}}.$$

This completes the proof.

Proof of Proposition~\reflm:beta: In order to show that the repair bandwidth constraint is fulfilled, the techniques described herein may show that the rank of matrix $\Xi^{f,(m)}$ is at most $$\beta^{(m)} = \binom{d-1}{m-1}.$$

First, note that it is easy to verify the claim for m=1, since the matrix $\Xi^{f,(1)}$ has only one column labeled by ø and hence its rank is at most $$1 = \binom{d-1}{1-1}.$$

For m>1, the techniques described herein partition the columns of the matrix into 2 disjoint groups of size $$\beta^{(m)} = \binom{d-1}{m-1} \text{ and } \binom{d}{m-1} - \beta^{(m)} = \binom{d-1}{m-2},$$

and show that each column in the second group can be written as a linear combination of the columns in the first group. This implies that the rank of the matrix does not exceed the number of columns in the first group, which is exactly $\beta^{(m)}$.

To form the groups, the techniques described herein pick some $x \in [d]$ such that $\psi_{f,x} \neq 0$. Then the first group is the set of all columns whose label is a subset of $[d]\setminus\{x\}$. Recall that columns of $\Xi^{f,(m)}$ are labeled with (m−1)-element subsets of [d]. Hence, the number of columns in the first group is $$\binom{d-1}{m-1}.$$

Then, the second group is formed by those columns for which x appears in their label.

Without loss of generality, x=d, i.e $\psi_{f,d} \neq 0$, and hence the first group consists of columns $\mathcal{J}$ such that $\mathcal{J} \subset [d-1]$, and the second group includes those $\mathcal{J}$'s such that $d \in \mathcal{J}$. For every $\mathcal{J}$ with $d \in \mathcal{J}$, $$\Xi^{f,(m)}_{:,\mathcal{J}} = (-1)^m \psi_{f,d}^{-1} \sum_{y \in [d-1] \setminus \tilde{\mathcal{J}}} (-1)^{ind_{\mathcal{J} \cup \{y\}}(y)} \psi_{f,y} \Xi^{f,(m)}_{:,\tilde{\mathcal{J}} \cup \{y\}}, \qquad (154)$$

where $\tilde{\mathcal{J}} = \mathcal{J} \setminus \{d\}$. Note that all the columns appear in the RHS of (154) belong to the first group. Given the facts that $|\tilde{\mathcal{J}}| = m-1$ and $ind_{\mathcal{J}}(d) = m-1$, the equation in (154) is equivalent to $$\sum_{y \in [d] \setminus \tilde{\mathcal{J}}} (-1)^{ind_{\mathcal{J} \cup \{y\}}(y)} \psi_{f,y} \Xi^{f,(m)}_{:,\tilde{\mathcal{J}} \cup \{y\}} = 0. \qquad (155)$$

Let us focus on an arbitrarily chosen row of the matrix, labeled by $\mathcal{L}$, where $\mathcal{L} \subseteq [d]$ with $|\mathcal{L}| = m$. The $\mathcal{L}$-th entry of the column in the LHS of (155) is given by $$\left[ \sum_{y \in [d] \setminus \tilde{\mathcal{J}}} (-1)^{ind_{\mathcal{J} \cup \{y\}}(y)} \psi_{f,y} \Xi^{f,(m)}_{:,\tilde{\mathcal{J}} \cup \{y\}} \right]_{\mathcal{L}} = \sum_{y \in [d] \setminus \tilde{\mathcal{J}}} (-1)^{ind_{\mathcal{J} \cup \{y\}}(y)} \psi_{f,y} \Xi^{f,(m)}_{\mathcal{L}, \tilde{\mathcal{J}} \cup \{y\}}.$$

First assume $\tilde{\mathcal{J}} \not\subset \mathcal{L}$. This together with the definition of $\Xi^{f,(m)}$ imply that $\Xi^{f,(m)}_{\mathcal{L}, \tilde{\mathcal{J}} \cup \{y\}} = 0$ for any y, and hence all the terms in the LHS of (155) are zero.

Next, consider an $\mathcal{L}$ such that $\tilde{\mathcal{J}} \subseteq \mathcal{L}$. Since $|\tilde{\mathcal{J}}| = |\mathcal{J} \setminus \{d\}| = m-2$ and $|\mathcal{L}| = m$, the techniques described herein have $\mathcal{L} = \tilde{\mathcal{J}} \cup \{y_1, y_2\}$, where $y_1 < y_2$ are elements of [d]. Note that for $y \notin \{y_1, y_2\}$ the techniques described herein have $\Xi^{f,(m)}_{\mathcal{L}, \tilde{\mathcal{J}} \cup \{y\}} = 0$, since $\tilde{\mathcal{J}} \cup \{y\} \not\subset \mathcal{L}$. Therefore, (155) can be simplified as $$\left[ \sum_{y \in [d] \setminus \tilde{\mathcal{J}}} (-1)^{ind_{\mathcal{J} \cup \{y\}}(y)} \psi_{f,y} \Xi^{f,(m)}_{:,\tilde{\mathcal{J}} \cup \{y\}} \right]_{\mathcal{L}} = \qquad (156)$$

$$\sum_{y \in \{y_1, y_2\}} (-1)^{ind_{\mathcal{J} \cup \{y\}}(y)} \psi_{f,y} \Xi^{f,(m)}_{\mathcal{L}, \tilde{\mathcal{J}} \cup \{y\}}$$

$$= (-1)^{ind_{\mathcal{J} \cup \{y_1\}}(y_1)} \psi_{f,y_1} \Xi^{f,(m)}_{\mathcal{L}, \tilde{\mathcal{J}} \cup \{y_1\}} + \qquad (157)$$
$$(-1)^{ind_{\mathcal{J} \cup \{y_2\}}(y_2)} \psi_{f,y_2} \Xi^{f,(m)}_{\mathcal{L}, \tilde{\mathcal{J}} \cup \{y_2\}} =$$
$$(-1)^{ind_{\mathcal{J} \cup \{y_1\}}(y_1)} \psi_{f,y_1} \cdot (-1)^{ind_{\mathcal{L}}(y_2)} \psi_{f,y_2} +$$
$$(-1)^{ind_{\mathcal{J} \cup \{y_2\}}(y_2)} \psi_{f,y_2} \cdot (-1)^{ind_{\mathcal{L}}(y_1)} \psi_{f,y_1}$$

$$= \qquad (158)$$
$$\psi_{f,y_1} \psi_{f,y_2} \left[ (-1)^{ind_{\mathcal{L}\setminus\{y_2\}}(y_1) + ind_{\mathcal{L}}(y_2)} + (-1)^{ind_{\mathcal{L}\setminus\{y_1\}}(y_2) + ind_{\mathcal{L}}(y_1)} \right] = 0,$$

where (156) and (157) is due to the definition of $\Xi^{f,(m)}$, and in (158) the techniques described herein used the facts that $ind_{\mathcal{L}\setminus\{y_2\}}(y_1) = ind_{\mathcal{L}}(y_1)$ and $ind_{\mathcal{L}\setminus\{y_1\}}(y_2) = ind_{\mathcal{L}}(y_2) - 1$ which holds for $y_1, y_2 \in \mathcal{L}$ with $y_1 < y_2$. This completes the proof.

Proof of Proposition~\refprop:multi-beta: The claim of this proposition for e>d is equivalent to bounding the number of repair symbols from the helper node by $$\alpha = \binom{d}{m} \left( \text{because } \binom{d-e}{m} = 0 \right),$$

which is clearly true since each storage node does not store more than α symbols. Thus, the techniques described herein can limit the attention to e≤d. In order to prove the claim, the techniques described herein show that the row rank of $\Xi^{\mathcal{E},(m)}$ does not exceed $$\binom{d}{m} - \binom{d-e}{m}.$$

Recall that $\Xi^{\mathcal{E},(m)}$ is a $$\binom{d}{m} \times e \binom{d}{m-1}$$

matrix, an it suffices to identify $$\binom{d-e}{m}$$

linearly independent vectors in the left null-space of $\Xi^{\mathcal{E},(m)}$. To this end, the techniques described herein introduce a full-rank matrix $Y^{\mathcal{E},(m)}$ of sized $$\binom{d-e}{m} \times \binom{d}{m}$$

and show that $Y^{\mathcal{E},(m)} \cdot \Xi^{\mathcal{E},(m)} = 0$.

Step 1 (Construction of $Y^{\mathcal{E},(m)}$): Let $\Psi[\mathcal{E}, :]$ be the e×d matrix obtained from the rows $f_1, f_2, \ldots, f_e$ of the encoder matrix $\Psi$. Recall that $\Psi[\mathcal{E}, :]$ is full-rank (since any d rows of $\Psi$ are linearly independent, and e≤d). Hence, there exists a subset Q with $|\mathcal{Q}|=e$ of the columns of $\Psi[\mathcal{E}, :]$, denoted by $\Psi[\mathcal{E}, \mathcal{Q}]$ such that $\det(\Psi[\mathcal{E}, \mathcal{Q}]) \neq 0$.

The desired matrix $Y^{\mathcal{E},(m)}$ is of size $$\binom{d-e}{m} \times \binom{d}{m}.$$

The techniques described herein label its rows by m-element subsets of $[d]\backslash\mathcal{Q}$, and its columns by m-element subsets of $[d]$. Then the entry at row $\mathcal{J}$ and column $\mathcal{L}$ is defined as $$Y_{\mathcal{J},\mathcal{L}}^{\mathcal{E},(m)} = \begin{cases} (-1)^{\sigma}\det(\Psi[\mathcal{E}, (\mathcal{J} \cup \mathcal{Q})\backslash\mathcal{L}]) & \text{if } \mathcal{L} \subseteq \mathcal{J} \cup \mathcal{Q}, \\ 0 & \text{if } \mathcal{L} \not\subseteq \mathcal{J} \cup \mathcal{Q} \end{cases} \quad (159)$$

where $\sigma = \sum_{j \in \mathcal{L}} \text{ind}_{\mathcal{J} \cup \mathcal{Q}}(j)$. Note that $\mathcal{J} \subseteq [d]\backslash\mathcal{Q}$, and hence $|\mathcal{J} \cup \mathcal{Q}| = m+e$.

Step 2 (Orthogonality of $Y^{\mathcal{E},(m)}$ to $\Xi^{\mathcal{E},(m)}$): The techniques described herein prove this claim for each segment of $\Xi^{\mathcal{E},(m)}$. More precisely, for each $f \in \mathcal{E}$, the techniques described herein prove $Y^{\mathcal{E},(m)} \cdot \Xi^{f,(m)} = 0$. Consider some f $\mathcal{L}$, and arbitrary indices $\mathcal{J}$ and $\mathcal{J}$ for rows and columns, respectively.

$$[Y^{\mathcal{E},(m)} \cdot \Xi^{f,(m)}]_{\mathcal{J},\mathcal{J}} = \sum_{\substack{\mathcal{L} \subseteq [d] \\ |\mathcal{L}|=m}} Y_{\mathcal{J},\mathcal{L}}^{\mathcal{E},(m)} \cdot \Xi_{\mathcal{L},\mathcal{J}}^{f,(m)} \quad (160)$$

$$= \sum_{x \in [d]\backslash\mathcal{J}} Y_{\mathcal{J},\mathcal{J} \cup \{x\}}^{\mathcal{E},(m)} \cdot \Xi_{\mathcal{J} \cup \{x\},\mathcal{J}}^{f,(m)} \quad (161)$$

$$= \sum_{x \in (\mathcal{J} \cup \mathcal{Q})\backslash\mathcal{J}} Y_{\mathcal{J},\mathcal{J} \cup \{x\}}^{\mathcal{E},(m)} \cdot \Xi_{\mathcal{J} \cup \{x\},\mathcal{J}}^{f,(m)} \quad (162)$$

$$= \sum_{x \in (\mathcal{J} \cup \mathcal{Q})\backslash\mathcal{J}} [(-1)^{\sum_{j \in \mathcal{J} \cup \{x\}} \text{ind}_{\mathcal{J} \cup \mathcal{Q}}(j)} \times \quad (163)$$

$$\det(\Psi[\mathcal{E}, (\mathcal{J} \cup \mathcal{Q})\backslash(\mathcal{J} \cup \{x\})])][(-1)^{\text{ind}_{\mathcal{J} \cup \{x\}}(x)} \psi_{f,x}] = \quad (164)$$

$$(-1)^{\sum_{j \in \mathcal{J}} \text{ind}_{\mathcal{J} \cup \mathcal{Q}}(j)-1} \sum_{x \in \ldots} [(-1)^{\text{ind}_{(\mathcal{J} \cup \mathcal{Q})\backslash\mathcal{J}}(x)} \times$$

$$\det(\Psi[\mathcal{E}, (\mathcal{J} \cup \mathcal{Q})\backslash(\mathcal{J} \cup \{x\})])\psi_{f,x}]$$

$$= (-1)^{\sum_{j \in \mathcal{J}} \text{ind}_{\mathcal{J} \cup \mathcal{Q}}(j)-1} \det\left(\begin{bmatrix} \Psi[f, (\mathcal{J} \cup \mathcal{Q})\backslash\mathcal{J}] \\ \Psi[\mathcal{E}, (\mathcal{J} \cup \mathcal{Q})\backslash\mathcal{J}] \end{bmatrix}\right) \quad (165)$$

$$= 0. \quad (166)$$

Note that

In (161) the techniques described herein have used the fact that $\mu^{f,(m)}$ is non-zero only if $\mathcal{L} = \mathcal{J} \cup \{x\}$ for some $x \in [d]\backslash\mathcal{J}$.

The range of x is further limited in (162) due to the fact that $Y_{\mathcal{J},\mathcal{J} \cup \{x\}}^{\mathcal{E},(m)}$ is non-zero only if $\mathcal{J} \cup \{x\} \subseteq \mathcal{J} \cup \mathcal{Q}$, which implies $x \in (\mathcal{J} \cup \mathcal{Q})\backslash\mathcal{J}$.

In (163), the entries of the matrix product are replaced by their definitions.

The equality in (164) is obtained by factoring $(-1)^{\sum_{j \in \mathcal{J}} \text{ind}_{\mathcal{J} \cup \mathcal{Q}}(j)}$, and using the facts that $\mathcal{J} \subset \mathcal{J} \cup \mathcal{Q}$ and $$\text{ind}_{\mathcal{J} \cup \mathcal{Q}}(x) + \text{ind}_{\mathcal{J} \cup \{x\}}(x) \equiv \text{ind}_{\mathcal{J} \cup \mathcal{Q}}(x) - \text{ind}_{\mathcal{J} \cup \{x\}}(x) \pmod{2} =$$

$$|\{y \in \mathcal{J} \cup \mathcal{Q}: y \leq x\}| - |\{y \in \mathcal{J} \cup \{x\}: y \leq x\}| =$$

$$|\{y \in \mathcal{J} \cup \mathcal{Q}: y \leq x\}| - |\{y \in \mathcal{J}: y \leq x\}| - 1 =$$

$$|\{y \in (\mathcal{J} \cup \mathcal{Q})\backslash\mathcal{J}: y \leq x\}| - 1 = \text{ind}_{(\mathcal{J} \cup \mathcal{Q})\backslash\mathcal{J}}(x) - 1.$$

The equality in (73) follows the determinant expansion of the matrix with respect to its first row. Note that $|(\mathcal{J} \cup \mathcal{Q})\backslash\mathcal{J}| = e+1$, and hence it is a square matrix.

Finally, the determinant in (73) is zero, because $f \in \mathcal{E}$, and hence the matrix has two identical rows.

Step 3 (Full-rankness of $Y^{\mathcal{E},(m)}$): Recall that rows and columns of $Y^{\mathcal{E},(m)}$ are labeled by m-element subsets of $[d]\backslash\mathcal{Q}$ and m-element subsets of $[d]$, respectively. Consider the sub-matrix of $Y^{\mathcal{E},(m)}$, whose column labels are subsets of $[d]\backslash\mathcal{Q}$. This is $$\binom{d-e}{m} \times \binom{d-e}{m}$$

square sub-matrix. Note that for entry at position $(\mathcal{J}, \tilde{\mathcal{J}})$ with $\mathcal{J} \neq \tilde{\mathcal{J}}$, since $\mathcal{J} \cap \mathcal{Q} = \emptyset$, the techniques described herein have $\tilde{\mathcal{J}} \subseteq \mathcal{J} \cup \mathcal{Q}$, and hence $[Y^{\mathcal{E},(m)}]_{\mathcal{J},\tilde{\mathcal{J}}} = 0$ (see (67)). Otherwise, if $\tilde{\mathcal{J}} = \mathcal{J}$ the techniques described herein have $$[Y^{\mathcal{E},(m)}]_{\mathcal{J},\mathcal{J}} = (-1) \sum_{i \in \mathcal{J}} \mathit{ind}_{\mathcal{J} \cup \mathcal{Q}}(i) \det(\Psi[\mathcal{E}, \mathcal{Q}]).$$

That is $$[Y^{\mathcal{E},(m)}]_{\tilde{\mathcal{J}},\mathcal{J}} = \begin{cases} (-1)^{\sum_{i \in \mathcal{J}} \mathit{ind}_{\mathcal{J} \cup \mathcal{Q}}(i)} \det(\Psi[\mathcal{E}, \mathcal{Q}]) & \text{if } \tilde{\mathcal{J}} = \mathcal{J}, \\ 0 & \text{if } \tilde{\mathcal{J}} \neq \mathcal{J}. \end{cases}$$

This implies that $Y^{\mathcal{E},(m)}$ has a diagonal sub-matrix, with diagonal entries $\pm\det(\Psi[\mathcal{E}, \mathcal{Q}])$ which are non-zero (see Step 1), and hence $Y^{\mathcal{E},(m)}$ is a full-rank matrix. Therefore, the rows of $Y^{\mathcal{E},(m)}$ provide $$\binom{d-e}{m}$$

linearly independent vectors in the left null-space of $\Xi^{\mathcal{E},(m)}$, and thus the rank of $\Xi^{\mathcal{E},(m)}$ does not exceed $$\beta^{(m)} = \binom{d}{m} - \binom{d-e}{m}.$$

This completes the proof.

In this section, the techniques described herein prove Theorem 3. As mentioned before, this result is essentially obtained from Theorem 2, by exploiting the fact that in the centralized repair setting once one failed node is repaired, it can also participate in the repair process of the remaining failed nodes.

Proof of Theorem~\refthm:MulRep-improved. Consider a set of e failed nodes $\varepsilon = \{f_1, f_2, \ldots, f_e\}$, which are going to be repaired by a set of helper nodes $\mathcal{H}$ with $|\mathcal{H}| = d$. Recall from Theorem 2 that the repair data of node h intended for a failed node f (i.e., $\Psi_h \cdot D \cdot \Xi^{f,(m)}$) can be retrieved from the repair data that h sends for the repair of a set of failed nodes $\mathcal{E}$ (i.e., $\Psi_h \cdot D \cdot \Xi^{\mathcal{E},(m)}$) where $f \in \mathcal{E}$. The techniques described herein use the following procedure in order to repair the failed nodes in $\mathcal{E}$.

1. First node $f_1$ is repaired using helper nodes $\mathcal{H} = \{h_1, h_2, \ldots, h_d\}$.

2. Having failed $\{f_1, \ldots, f_i\}$ repaired, the repair process of failed node $f_{i+1}$ is performed using helper nodes $\mathcal{H}_i = \{f_1, \ldots, f_i\} \cup \{h_{i+1}, h_{i+2}, \ldots, h_d\}$. This step may be repeated for $i = 2, 3, \ldots, e$.

Note that the proposed repair process introduced in this disclosure is helper-independent, and hence the repair data sent to a failed node $f_i$ by a helper node h does not depend on the identity of the other helper nodes.

Using the procedure described above, helper node $h_i$ only participates in the repair of failed nodes $\{f_1, f_2, \ldots, f_i\}$, for $i = 1, 2, \ldots, e$, while the other helper nodes (i.e., $h_i$ for $i = e+1, \ldots, d$) contribute in the repair of all the e failed nodes.

Hence, the total repair data downloaded from the helper nodes in $\mathcal{H}$ to the central repair unit is given by $$\sum_{j=1}^{e} \beta_j^{(m)} + (d-e)\beta_e^{(m)} \tag{167}$$

$$= \sum_{j=1}^{e} \left[ \binom{d}{m} - \binom{d-j}{m} \right] + (d-e) \left[ \binom{d}{m} - \binom{d-e}{m} \right] = \tag{168}$$

$$d\binom{d}{m} - \sum_{j=1}^{e} \binom{d-j}{m} - (d-e)\binom{d-e}{m}$$

$$= d\binom{d}{m} - \left[ \binom{d}{m+1} - \binom{d-e}{m+1} \right] - (d-e)\binom{d-e}{m} \tag{169}$$

$$= (d+1)\binom{d}{m} - \left[ \binom{d}{m} + \binom{d}{m+1} \right] - \tag{170}$$

$$(d-e+1)\binom{d-e}{m} + \left[ \binom{d-e}{m} + \binom{d-e}{m+1} \right]$$

$$= (m+1)\binom{d+1}{m+1} - \binom{d+1}{m+1} - (m+1)\binom{d-e+1}{m+1} + \binom{d-e+1}{m+1} \tag{171}$$

$$= m\left[ \binom{d+1}{m+1} - \binom{d-e+1}{m+1} \right], \tag{172}$$

where
in (77) use the identity $$\sum_{j=a}^{b} \binom{j}{m} = \sum_{j=m}^{b} \binom{j}{m} - \sum_{j=m}^{a-1} \binom{j}{i} = \binom{b+1}{m+1} - \binom{a}{m+1},$$

and the equality in (171) holds due to the Pascal identity $$\binom{a}{m} + \binom{a}{m+1} = \binom{a+1}{m+1},$$

and the fact that $$(a+1)\binom{a}{m} = (m+1)\binom{a+1}{m+1}.$$

Hence the average (per helper node) repair bandwidth is given by $$\overline{\beta}_e^{(m)} = \frac{1}{d}\left[ m\binom{d+1}{m+1} - m\binom{d-e+1}{m+1} \right]. \tag{173}$$

Note that the repair strategy described here is asymmetric, i.e., the repair bandwidth of helper nodes are different. However, it can be simply symmetrized by concatenating d copies of the code to form a super code $$\mathcal{C} = \Psi \cdot [D^{[1]}, D^{[2]}, \ldots, D^{[d]}].$$

The participation of the helper nodes in the multiple failure repair of the super-code. Each cell labeled by $h_i$ and $D^{[l]}$ shows the set of failed nodes receive repair data from helper node $h_i$ to repair their codeword segment corresponding to code segment $D^{[l]}$.

In the super code, each node stores a total of $d \cdot \alpha^{(m)}$ symbols, including $\alpha$ symbols for each code segment $D^{[l]}$, and the total storage capacity of the code is $d \cdot F^{(m)}$. In a multiple failure scenario with failed nodes $\mathcal{E} = \{f_1, \ldots, f_e\}$ and helper nodes $\mathcal{H} = \{h_1, \ldots, h_d\}$, codeword segments may be repaired separately. The role of helper nodes in the repair process changes in a circular manner. Then, the per-node repair bandwidth of the super code is exactly $d \cdot \overline{\beta}_e^{(m)}$ defined above. Note that the symmetry in the super code is obtained at the expense of the sub-packetization, which is scaled by a factor of d. This completes the proof.

Figure 8:
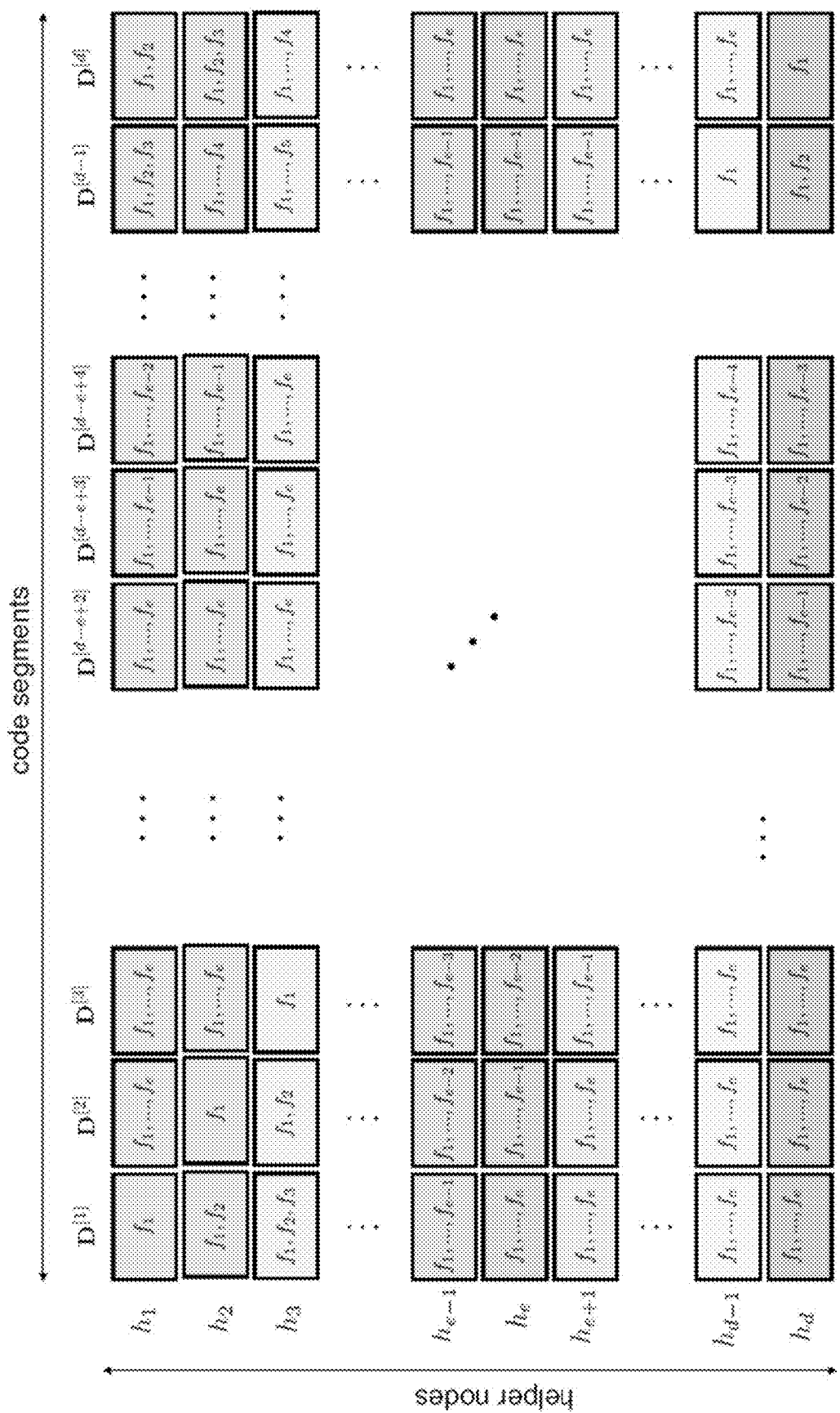
FIG. 8 is a conceptual diagram illustrating an example participation of the helper nodes in the multiple failure repair of the super-code, in accordance with the techniques described herein.

FIG. 8 is a conceptual diagram illustrating the participation of the helper nodes in the multiple failure repair of the super-code, in accordance with the techniques described herein. Each cell labeled by $h_i$ and $D[^l]$ shows the set of failed nodes receive repair data from helper node $h_i$ to repair their codeword segment corresponding to code segment $D[^l]$.

Figure 9:
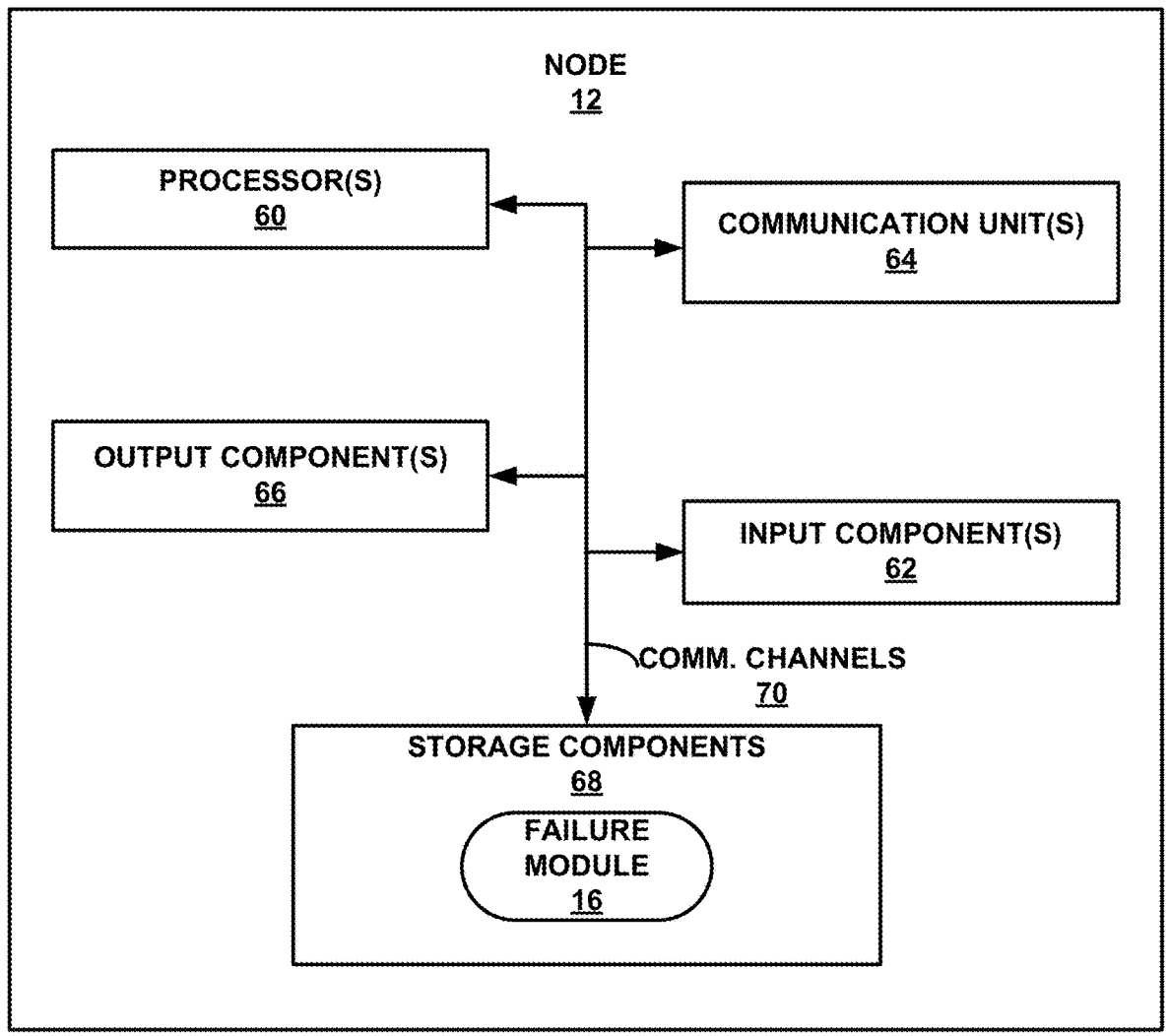
FIG. 9 is a block diagram of one example of a more detailed view of a node device that may be configured to perform one or more techniques in accordance with the current disclosure.

FIG. 9 is a block diagram of a detailed view of a node device that may be configured to perform one or more techniques in accordance with the current disclosure. FIG. 9 illustrates only one particular example of node device 12, and many other examples of node device 12 may be used in other instances and may include a subset of the components included in example node device 12 or may include additional components not shown in FIG. 9. For instance, node device 12 may include a battery or other power component or may not include a direct input component.

As shown in the example of FIG. 9, node device 12 includes one or more processors 60, one or more input components 62, one or more communication units 64, one or more output components 66, and one or more storage components 68. Storage components 68 of node device 12 include failure module 16. Communication channels 70 may interconnect each of the components 60, 64, 62, 66, and 68 for inter-component communications (physically, communicatively, and/or operatively). In some examples, communication channels 70 may include a system bus, a network connection, an inter-process communication data structure, or any other method for communicating data.

One or more communication units 64 of node device 12 may communicate with external devices via one or more wired and/or wireless networks by transmitting and/or receiving network signals on the one or more networks. Examples of communication units 64 include a network interface card (e.g. such as an Ethernet card), an optical transceiver, a radio frequency transceiver, a GPS receiver, or any other type of device that can send and/or receive information. Other examples of communication units 64 may include short wave radios, cellular data radios, wireless network radios, as well as universal serial bus (USB) controllers. Communication units 64 may be configured to operate in accordance with a wireless protocol, such as WiFi®, Bluetooth®, LTE, or ZigBee®.

One or more input components 62 of node device 12 may receive input. Examples of input are tactile, audio, and video input. Input components 62 of node device 12, in one example, includes a presence-sensitive input device (e.g., a touch sensitive screen, a PSD), mouse, keyboard, voice responsive system, video camera, microphone or any other type of device for detecting input from a human or machine. In some examples, input components 62 may include one or more sensor components one or more location sensors (GPS components, Wi-Fi components, cellular components), one or more temperature sensors, one or more movement sensors (e.g., accelerometers, gyros), one or more pressure sensors (e.g., barometer), one or more ambient light sensors, and one or more other sensors (e.g., microphone, camera, infrared proximity sensor, hygrometer, and the like). Other sensors may include a heart rate sensor, magnetometer, glucose sensor, hygrometer sensor, olfactory sensor, compass sensor, step counter sensor, to name a few other non-limiting examples.

One or more output components 66 of node device 12 may generate output. Examples of output are tactile, audio, and video output. Output components 66 of node device 12, in one example, includes a PSD, sound card, video graphics adapter card, speaker, cathode ray tube (CRT) monitor, liquid crystal display (LCD), or any other type of device for generating output to a human or machine.

One or more processors 60 may implement functionality and/or execute instructions associated with node device 12. Examples of processors 60 include application processors, display controllers, auxiliary processors, one or more sensor hubs, and any other hardware configure to function as a processor, a processing unit, or a processing device. Module 16 may be operable by processors 60 to perform various actions, operations, or functions of node device 12. For example, processors 60 of node device 12 may retrieve and execute instructions stored by storage components 68 that cause processors 60 to perform the operations of module 16. The instructions, when executed by processors 60, may cause node device 12 to store information within storage components 68.

One or more storage components 68 within node device 12 may store information for processing during operation of node device 12 (e.g., node device 12 may store data accessed by module 16 during execution at node device 12). In some examples, storage component 68 is a temporary memory, meaning that a primary purpose of storage component 68 is not long-term storage. Storage components 68 on node device 12 may be configured for short-term storage of information as volatile memory and therefore not retain stored contents if powered off. Examples of volatile memories include random-access memories (RAM), dynamic random-access memories (DRAM), static random-access memories (SRAM), and other forms of volatile memories known in the art.

Storage components 68, in some examples, also include one or more computer-readable storage media. Storage components 68 in some examples include one or more non-transitory computer-readable storage mediums. Storage components 68 may be configured to store larger amounts of information than typically stored by volatile memory. Storage components 68 may further be configured for long-term storage of information as non-volatile memory space and retain information after power on/off cycles. Examples of non-volatile memories include magnetic hard discs, optical discs, floppy discs, flash memories, or forms of electrically programmable memories (EPROM) or electrically erasable and programmable (EEPROM) memories. Storage components 68 may store program instructions and/or information (e.g., data) associated with modules 4 and 6. Storage components 68 may include a memory configured to store data or other information associated with module 16.

In accordance with the techniques described herein, node device 12 may be a helper node within a distributed storage system that includes a plurality of nodes as described throughout this disclosure. A total number of nodes in the distributed storage system is represented by n, a file stored in the distributed storage system is recovered from a subset of a number of nodes represented by k upon a file failure on a node in the distributed storage system, and a failed node in the plurality of nodes is recovered from a number of helper nodes of the plurality of nodes represented by d.

Some entity in the distributed storage system may detect a failure in a first node of the distributed storage system. Upon this detection, failure module 16, for a particular mode of a determinant code, the particular mode represented by m, determines a repair-encoder matrix having a number of rows based on a number of m-element subsets of d and having a number of columns based on a number of m−1-element subsets of d.

Failure module 16 multiplies a content matrix for the respective helper node by the repair-encoder matrix to obtain a repair matrix. A maximum number represented by b columns of the repair matrix are linearly independent, where b is based on a number of m−1-element subsets of d−1. Failure module 16 extracts each linearly independent column of the repair matrix and sends, using communication unit 64, the linearly independent columns of the repair matrix to the first node.

In some examples, the content matrix is a product of an encoder matrix and a message matrix. The encoder matrix is common to each of the helper nodes, and the message matrix is unique for every helper node. The encoder matrix may be a fixed matrix having n rows and d columns, and the encoder matrix may be maximum-distance-separable. The message matrix may have d rows, and one or more entries of the message matrix may be one or more of a source symbol or a parity symbol.

In some examples, the number of rows in the repair-encoder matrix may be equal to the number of m-element subsets of d and the number of columns in the repair-encoder matrix may be equal to the number of m−1-element subsets of d.

In some examples, b is equal to a number of m−1-element subsets of d−1.

In some examples, in sending the linearly independent columns of the repair matrix to the first node, failure module 16 may send only the linearly independent columns of the repair matrix to the first node, where the linearly independent columns of the repair matrix may form a repair space of the first node.

In some examples, each linearly independent column may be a repair-data vector.

In some examples, in detecting the failure in the first node, failure module 16 may detect a failure in each of a group of two or more nodes in the plurality of nodes, where the group of two or more nodes includes the first node. In such examples, in sending the linearly independent columns of the repair matrix to the first node, failure module 16 may send the linearly independent columns of the repair matrix to each of the group of two or more nodes concurrently.

In some examples, an achievable trade-off of the distributed storage system is independent of n. By increasing the number of nodes n in the system, the number of problem constraints grows quickly. The determinant codes introduced in techniques described herein do not have such limitations. By adding more nodes in the system, the system will be robust against a higher number of node failures.

In some examples, in multiplying the content matrix for the respective helper node by the repair-encoder matrix to obtain the repair matrix, failure module 16 may perform a linear multiplication. This is a desirable property from the practical perspective, in order to provide a computationally feasible encoding/decoding as well as system maintenance.

In some examples, the determinant code may be optimum for d=k, in the sense that the achievable trade-off is matching with a known lower bound for linear exact-regenerating codes. As a consequence, the optimum linear trade-off for regenerating codes with d=k is fully characterized.

In some examples, a required mathematical field size for the determinant code may be linear. As a larger field size, there is a higher demand for a larger amount of files to be grouped and encoded. This will reduce the flexibility of the system design.

In some examples, the linearly independent columns of the repair matrix for each helper node may be independent of every other helper node. That is, the data sent from each helper node only depends on the identity of the helper node and failed nodes, but is independent from the identity of other helper nodes participating in the repair process.

In some examples, failure module 16 may further concatenate a plurality of determinant codes to construct a merged determinant code, where each of the plurality of determinant codes is a d=k determinant code, and where the merged determinant code is a d>=k determinant code.

In some examples, a number of code parameters for the determinant code may be less than or equal to $(d-k+1)^k$, which is independent of the number of the parity nodes.

While described as occurring in helper node 12, the techniques described above would be performed by each of the d helper nodes upon detecting the failure of the node.

Figure 10:
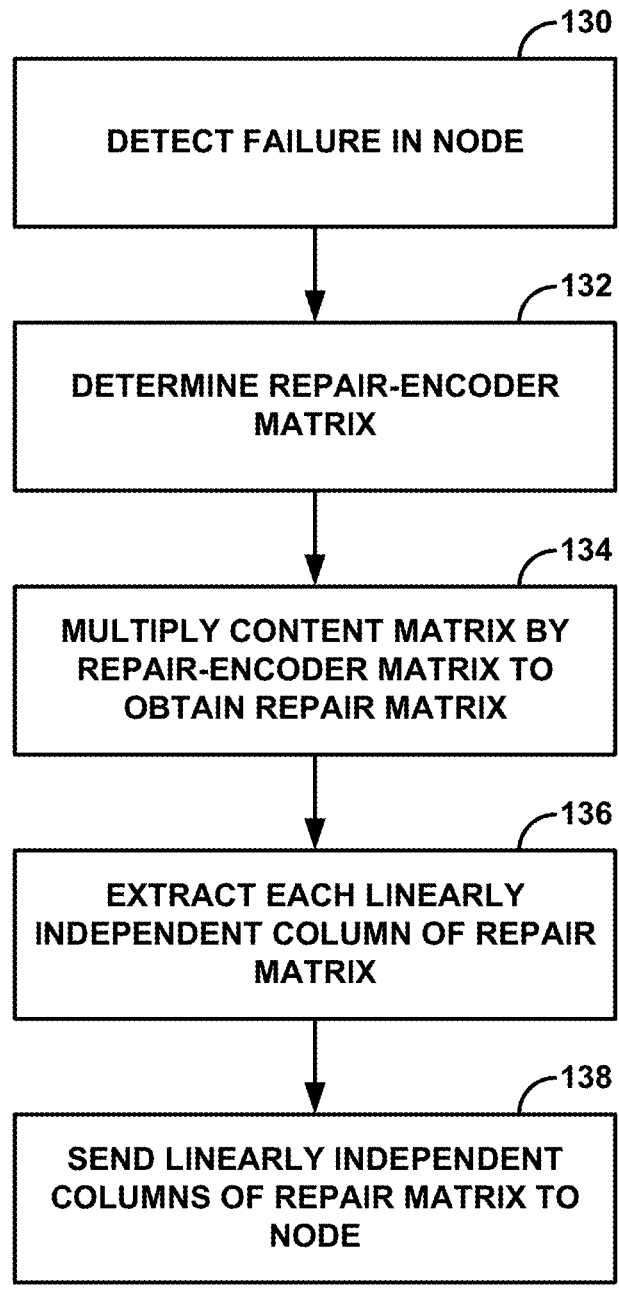
FIG. 10 is a flow diagram of one or more techniques of the current disclosure.

FIG. 10 is a flow diagram of one or more techniques of the current disclosure. The operations of FIG. 10 may be performed by one or more processors of a computing device, such as node device 12 of FIG. 9. For purposes of illustration only, FIG. 10 is described below within the context of node device 12 of FIG. 9.

In accordance with the techniques described herein, detecting (130) a failure in a first node of a distributed storage system comprising a plurality of nodes. A total number of nodes in the distributed storage system is represented by n, a file stored in the distributed storage system is recovered from a subset of a number of nodes represented by k upon a file failure on a node in the distributed storage system, and a failed node in the plurality of nodes is recovered from a number of helper nodes of the plurality of nodes represented by d. Node device 12 in the distributed storage system, for a particular mode of a determinant code, the particular mode represented by m, determines (132) a repair-encoder matrix having a number of rows based on a number of m-element subsets of d and having a number of columns based on a number of m−1-element subsets of d. Node device 12 multiplies (134) a content matrix for the respective helper node by the repair-encoder matrix to obtain a repair matrix, wherein a maximum number represented by b columns of the repair matrix are linearly independent, wherein b is based on a number of m−1-element subsets of d−1. Node device 12 extracts (136) each linearly independent column of the repair matrix. Node device 12 sends (138) the linearly independent columns of the repair matrix to the first node.

The following numbered examples demonstrate one or more aspects of the disclosure.

Example 1. A distributed storage system comprising: a plurality of nodes comprising a first node and a number of helper nodes, wherein a total number of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from the number of helper nodes of the plurality of nodes represented by d, wherein upon detecting a failure in the first node, each helper node of the number of helper nodes is configured to: for a particular mode of a determinant code, the particular mode represented by m, determine, by the respective helper node, a repair-encoder matrix having a number of rows based on a number of m-element subsets of d and having a number of columns based on a number of m−1-element subsets of d; multiply, by the respective helper node, a content matrix for the respective helper node by the repair-encoder matrix to obtain a repair matrix, wherein a maximum number represented by b columns of the repair matrix are linearly independent, wherein b is based on a number of m−1-element subsets of d−1; extract, by the respective helper node, each linearly independent column of the repair matrix; and send, by the respective helper node, the linearly independent columns of the repair matrix to the first node.

Example 2. The distributed storage system of example 1, wherein the content matrix comprises a product of an encoder matrix and a message matrix.

Example 3. The distributed storage system of example 2, wherein the encoder matrix is common to each of the helper nodes, and wherein the message matrix is unique for every helper node.

Example 4. The distributed storage system of any of examples 2-3, wherein the encoder matrix comprises a fixed matrix having n rows and d columns, and wherein the encoder matrix is maximum-distance-separable.

Example 5. The distributed storage system of any of examples 2-4, wherein the message matrix has d rows, and wherein one or more entries of the message matrix comprise one or more of a source symbol or a parity symbol.

Example 6. The distributed storage system of any of examples 1-5, wherein the number of rows in the repair-encoder matrix is equal to the number of m-element subsets of d and the number of columns in the repair-encoder matrix is equal to the number of m−1-element subsets of d.

Example 7. The distributed storage system of any of examples 1-6, wherein b is equal to a number of m−1-element subsets of d−1.

Example 8. The distributed storage system of any of examples 1-7, wherein to send the linearly independent columns of the repair matrix to the first node, the respective helper node is configured to send only the linearly independent columns of the repair matrix to the first node, wherein the linearly independent columns of the repair matrix form a repair space of the first node.

Example 9. The distributed storage system of any of examples 1-8, wherein each linearly independent column comprises a repair-data vector.

Example 10. The distributed storage system of any of examples 1-9, wherein to detect the failure in the first node, the distributed storage system is configured to detect a failure in each of a group of two or more nodes in the plurality of nodes, wherein the group of two or more nodes includes the first node, and wherein to send the linearly independent columns of the repair matrix to the first node, the respective helper node sends the linearly independent columns of the repair matrix to each of the group of two or more nodes concurrently.

Example 10. The distributed storage system of any of examples 1-9, wherein to detect the failure in the first node, the distributed storage system is configured to detect a failure in each of a group of two or more nodes in the plurality of nodes, wherein the group of two or more nodes includes the first node, and wherein to send the linearly independent columns of the repair matrix to the first node, the respective helper node sends the linearly independent columns of the repair matrix to each of the group of two or more nodes concurrently.

Example 11. The distributed storage system of any of examples 1-10, wherein an achievable trade-off of the distributed storage system is independent of n.

Example 12. The distributed storage system of any of examples 1-11, wherein to multiply the content matrix for the respective helper node by the repair-encoder matrix to obtain the repair matrix, the respective helper node is configured to perform a linear multiplication.

Example 13. The distributed storage system of any of examples 1-12, wherein the determinant code is optimum for d=k.

Example 14. The distributed storage system of any of examples 1-13, wherein a required mathematical field size for the determinant code is linear.

Example 15. The distributed storage system of any of examples 1-14, wherein the linearly independent columns of the repair matrix for each helper node is independent of every other helper node.

Example 16. The distributed storage system of any of examples 1-15, wherein the distributed storage system is further configured to concatenate a plurality of determinant codes to construct a merged determinant code, wherein each of the plurality of determinant codes comprises a d=k determinant code, and wherein the merged determinant code comprises a d>=k determinant code.

Example 17. The distributed storage system of any of examples 1-16, wherein a number of code parameters for the determinant code is less than or equal to $(d-k+1)^k$.

Example 18. A method comprising: upon detecting a failure in a first node of a distributed storage system comprising a plurality of nodes and a number of helper nodes, wherein a total number of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from the number of helper nodes of the plurality of nodes represented by d, and for each helper node in the distributed storage system: for a particular mode of a determinant code, the particular mode represented by m, determining, by the respective helper node, a repair-encoder matrix having a number of rows based on a number of m-element subsets of d and having a number of columns based on a number of m−1-element subsets of d; multiplying, by the respective helper node, a content matrix for the respective helper node by the repair-encoder matrix to obtain a repair matrix, wherein a maximum number represented by b columns of the repair matrix are linearly independent, wherein b is based on a number of m−1-element subsets of d−1; extracting, by the respective helper node, each linearly independent column of the repair matrix; and sending, by the respective helper node, the linearly independent columns of the repair matrix to the first node.

Example 19. The method of example 18, wherein the content matrix comprises a product of an encoder matrix and a message matrix.

Example 20. A system comprising: at least one processor; and a computer-readable storage medium storing instructions that are executable by the at least one processor to: detect a failure in a first node of a plurality of nodes in a distributed storage system, wherein a total number of the plurality of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from a number of helper nodes of the plurality of nodes represented by d; for a particular mode of a determinant code, the particular mode represented by m, determine, by a helper node, a repair-encoder matrix having a number of rows based on a number of m-element subsets of d and having a number of columns based on a number of m−1-element subsets of d; multiply, by the helper node, a content matrix for the helper node by the repair-encoder matrix to obtain a repair matrix, wherein a maximum number represented by b columns of the repair matrix are linearly independent, wherein b is based on a number of m−1-element subsets of d−1; extract, by the helper node, each linearly independent column of the repair matrix; and send, by the helper node, the linearly independent columns of the repair matrix to the first node.

In one or more examples, the functions described may be implemented in hardware, software, firmware, or any combination thereof. If implemented in software, the functions may be stored on or transmitted over as one or more instructions or code on a computer-readable medium and executed by a hardware-based processing unit. Computer-readable media may include computer-readable storage media, which corresponds to a tangible medium such as data storage media, or communication media including any medium that facilitates transfer of a computer program from one place to another, e.g., according to a communication protocol. In this manner, computer-readable media generally may correspond to (1) tangible computer-readable storage media which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable medium.

By way of example, and not limitation, such computer-readable storage media can comprise RAM, ROM, EEPROM, CD-ROM or other optical disk storage, magnetic disk storage, or other magnetic storage devices, flash memory, or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It may be understood, however, that computer-readable storage media and data storage media do not include connections, carrier waves, signals, or other transitory media, but are instead directed to non-transitory, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a codec hardware unit or provided by a collection of interoperative hardware units, including one or more processors as described above, in conjunction with suitable software and/or firmware.

Various examples of the disclosure have been described. Any combination of the described systems, operations, or functions is contemplated. These and other examples are within the scope of the following claims.

What is claimed is:

1. A distributed storage system comprising:
a plurality of nodes comprising a first node and a number of helper nodes, wherein a total number of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from the number of helper nodes of the plurality of nodes represented by d, wherein upon detecting a failure in the first node, each helper node of the number of helper nodes is configured to:
for a particular mode of a determinant code, the particular mode represented by m, determine, by the respective helper node, a repair-encoder matrix having a number of rows based on a number of m-element subsets of d and having a number of columns based on a number of m−1-element subsets of d;
multiply, by the respective helper node, a content matrix for the respective helper node by the repair-encoder matrix to obtain a repair matrix, wherein a maximum number represented by b columns of the repair matrix are linearly independent, wherein b is based on a number of m−1-element subsets of d−1;
extract, by the respective helper node, each linearly independent column of the repair matrix; and
send, by the respective helper node, the linearly independent columns of the repair matrix to the first node.

2. The distributed storage system of claim 1, wherein the content matrix comprises a product of an encoder matrix and a message matrix.

3. The distributed storage system of claim 2, wherein the encoder matrix is common to each of the helper nodes, and wherein the message matrix is unique for every helper node.

4. The distributed storage system of claim 2, wherein the encoder matrix comprises a fixed matrix having n rows and d columns, and wherein the encoder matrix is maximum-distance-separable.

5. The distributed storage system of claim 2, wherein the message matrix has d rows, and wherein one or more entries of the message matrix comprise one or more of a source symbol or a parity symbol.

6. The distributed storage system of claim 1, wherein the number of rows in the repair-encoder matrix is equal to the number of m-element subsets of d and the number of columns in the repair-encoder matrix is equal to the number of m−1-element subsets of d.

7. The distributed storage system of claim 1, wherein b is equal to a number of m−1-element subsets of d−1.

8. The distributed storage system of claim 1, wherein to send the linearly independent columns of the repair matrix to the first node, the respective helper node is configured to send only the linearly independent columns of the repair matrix to the first node, wherein the linearly independent columns of the repair matrix form a repair space of the first node.

9. The distributed storage system of claim 1, wherein each linearly independent column comprises a repair-data vector.

10. The distributed storage system of claim 1,
wherein to detect the failure in the first node, the distributed storage system is configured to detect a failure in each of a group of two or more nodes in the plurality of nodes, wherein the group of two or more nodes includes the first node, and
wherein to send the linearly independent columns of the repair matrix to the first node, the respective helper node sends the linearly independent columns of the repair matrix to each of the group of two or more nodes concurrently.

11. The distributed storage system of claim 1, wherein an achievable trade-off of the distributed storage system is independent of n.

12. The distributed storage system of claim 1, wherein to multiply the content matrix for the respective helper node by the repair-encoder matrix to obtain the repair matrix, the respective helper node is configured to perform a linear multiplication.

13. The distributed storage system of claim 1, wherein the determinant code is optimum for d=k.

14. The distributed storage system of claim 1, wherein a required mathematical field size for the determinant code is linear.

15. The distributed storage system of claim 1, wherein the linearly independent columns of the repair matrix for each helper node is independent of every other helper node.

16. The distributed storage system of claim 1, wherein the distributed storage system is further configured to:
concatenate a plurality of determinant codes to construct a merged determinant code, wherein each of the plurality of determinant codes comprises a d=k determinant code, and wherein the merged determinant code comprises a d>=k determinant code.

17. The distributed storage system of claim 1, wherein a number of code parameters for the determinant code is less than or equal to $(d-k+1)^k$.

18. A method comprising:
upon detecting a failure in a first node of a distributed storage system comprising a plurality of nodes and a number of helper nodes, wherein a total number of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from the number of helper nodes of the plurality of nodes represented by d, and for each helper node in the distributed storage system:
for a particular mode of a determinant code, the particular mode represented by m, determining, by the respective helper node, a repair-encoder matrix having a number of rows based on a number of m-element subsets of d and having a number of columns based on a number of m−1-element subsets of d;
multiplying, by the respective helper node, a content matrix for the respective helper node by the repair-encoder matrix to obtain a repair matrix, wherein a maximum number represented by b columns of the repair matrix are linearly independent, wherein b is based on a number of m−1-element subsets of d−1;
extracting, by the respective helper node, each linearly independent column of the repair matrix; and
sending, by the respective helper node, the linearly independent columns of the repair matrix to the first node.

19. The method of claim 18, wherein the content matrix comprises a product of an encoder matrix and a message matrix.

20. A system comprising:
at least one processor; and
a computer-readable storage medium storing instructions that are executable by the at least one processor to:
detect a failure in a first node of a plurality of nodes in a distributed storage system, wherein a total number of the plurality of nodes in the distributed storage system is represented by n, wherein a file stored in the distributed storage system is recovered from a subset of a number of nodes represented by k upon a file failure on a node in the distributed storage system, and wherein a failed node in the plurality of nodes is recovered from a number of helper nodes of the plurality of nodes represented by d;
for a particular mode of a determinant code, the particular mode represented by m, determine, by a helper node, a repair-encoder matrix having a number of rows based on a number of m-element subsets of d and having a number of columns based on a number of m−1-element subsets of d;
multiply, by the helper node, a content matrix for the helper node by the repair-encoder matrix to obtain a repair matrix, wherein a maximum number represented by b columns of the repair matrix are linearly independent, wherein b is based on a number of m−1-element subsets of d−1;
extract, by the helper node, each linearly independent column of the repair matrix; and
send, by the helper node, the linearly independent columns of the repair matrix to the first node.

* * * * *